United States Patent
Quddus et al.

(10) Patent No.: US 10,566,466 B2
(45) Date of Patent: Feb. 18, 2020

(54) TERMINATION STRUCTURE FOR INSULATED GATE SEMICONDUCTOR DEVICE AND METHOD

(71) Applicant: SEMICONDUCTOR COMPONENTS INDUSTRIES, LLC, Phoenix, AZ (US)

(72) Inventors: Mohammed Tanvir Quddus, Chandler, AZ (US); Mihir Mudholkar, Phoenix, AZ (US); Zia Hossain, Tempe, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/396,446

(22) Filed: Apr. 26, 2019

(65) Prior Publication Data

US 2020/0006579 A1   Jan. 2, 2020

Related U.S. Application Data

(63) Continuation-in-part of application No. 16/020,719, filed on Jun. 27, 2018.

(51) Int. Cl.
*H01L 29/78* (2006.01)
*H01L 29/872* (2006.01)
(Continued)

(52) U.S. Cl.
CPC ...... *H01L 29/8725* (2013.01); *H01L 29/0623* (2013.01); *H01L 29/407* (2013.01); *H01L 29/7811* (2013.01)

(58) Field of Classification Search
CPC ............ H01L 29/8725; H01L 29/7806; H01L 29/7811; H01L 27/0255; H01L 27/0727;
(Continued)

(56) References Cited

U.S. PATENT DOCUMENTS

| 5,111,253 A | 5/1992 | Korman et al. |
| 5,262,669 A | 11/1993 | Wakatabe et al. |

(Continued)

FOREIGN PATENT DOCUMENTS

WO   2013103491 A1   1/2012

*Primary Examiner* — Eric A. Ward
(74) *Attorney, Agent, or Firm* — Kevin B. Jackson

(57) ABSTRACT

A semiconductor device structure includes a region of semiconductor material having an active region and a termination region. An active structure is disposed in the active region and a termination structure is disposed in the termination region. In one embodiment, the termination structure includes a termination trench and a conductive structure within the termination trench and electrically isolated from the region of semiconductor material by a dielectric structure. A dielectric layer is disposed to overlap the termination trench to provide the termination structure as a floating structure. A Schottky contact region is disposed within the active region. A conductive layer is electrically connected to the Schottky contact region and the first conductive layer extends onto a surface of the dielectric layer and laterally overlaps at least a portion of the termination trench.

20 Claims, 31 Drawing Sheets

(51) Int. Cl.
*H01L 29/40* (2006.01)
*H01L 29/06* (2006.01)

(58) Field of Classification Search
CPC ........... H01L 29/7813; H01L 29/66734; H01L 29/4236
See application file for complete search history.

(56) References Cited

U.S. PATENT DOCUMENTS

| | | |
|---|---|---|
| 5,365,102 A | 11/1994 | Mehrotra et al. |
| 5,612,567 A | 3/1997 | Baliga |
| 5,679,966 A | 10/1997 | Baliga et al. |
| 5,859,465 A | 1/1999 | Spring et al. |
| 5,949,124 A | 9/1999 | Hadizad et al. |
| 5,998,833 A | 12/1999 | Baliga |
| 6,078,090 A | 6/2000 | Williams et al. |
| 6,309,929 B1 | 10/2001 | Hsu et al. |
| 6,396,090 B1 | 5/2002 | Hsu et al. |
| 6,441,454 B2 | 8/2002 | Hijzen et al. |
| 6,498,367 B1 | 12/2002 | Chang et al. |
| 6,515,330 B1 | 2/2003 | Hurtz et al. |
| 6,537,921 B2 | 3/2003 | Metzler |
| 6,656,843 B2 | 12/2003 | Bol |
| 6,855,593 B2 | 2/2005 | Andoh et al. |
| 6,977,208 B2 | 12/2005 | Chiola |
| 6,979,874 B2 | 12/2005 | Harada |
| 7,034,376 B2 | 4/2006 | Okada et al. |
| 7,045,397 B1 | 5/2006 | Yu et al. |
| 7,504,306 B2 * | 3/2009 | Sapp ................ H01L 29/66666 438/270 |
| 8,492,254 B2 | 7/2013 | Mizushima |
| 8,723,317 B2 * | 5/2014 | Hsieh ................ H01L 21/26586 257/737 |
| 8,766,279 B1 | 7/2014 | Yen et al. |
| 9,059,284 B2 * | 6/2015 | Saito .................... H01L 29/7839 |
| 2003/0057482 A1 | 3/2003 | Harada |
| 2005/0062124 A1 | 3/2005 | Chiola |
| 2005/0161758 A1 | 7/2005 | Chiola |
| 2007/0145429 A1 | 6/2007 | Francis et al. |
| 2009/0057756 A1 | 3/2009 | Hshieh |
| 2011/0227151 A1 | 9/2011 | Hsu et al. |
| 2011/0227152 A1 | 9/2011 | Hsu et al. |
| 2012/0122307 A1 | 5/2012 | Mizushima |
| 2013/0168765 A1 | 7/2013 | Lin et al. |
| 2016/0260844 A1 | 9/2016 | Quddus et al. |
| 2016/0260845 A1 | 9/2016 | Quddus et al. |

* cited by examiner

TERMINATION STRUCTURE FOR INSULATED GATE SEMICONDUCTOR DEVICE AND METHOD

CROSS-REFERENCE TO RELATED APPLICATIONS

This application is a continuation-in-part application of co-pending U.S. patent application Ser. No. 16/020,719 filed on Jun. 27, 2018, which is hereby incorporated by reference and priority thereto for common subject matter is hereby claimed.

BACKGROUND

The present invention relates, in general, to electronics and, more particularly, to semiconductor device structures and methods of forming semiconductor devices.

A Schottky device is a type of semiconductor device that exhibits a low forward voltage drop and a very fast switching action. The lower forward voltage drop translates into less energy wasted as heat, which provides improved system efficiency and higher switching speed compared to conventional PN junction diodes. This makes Schottky devices more suitable for applications requiring higher efficiency power management. Such applications include wireless and automotive devices, boost converters for LCD/keypad backlighting, engine control, automotive lighting, charge circuits as well as other small and large signal applications.

With demands to further improve battery life in these applications and others, the market is requiring even higher efficiency devices, such as Schottky devices having lower power dissipation, higher power density, and smaller die size. Some Schottky devices are formed using insulated trench gated structures, which have improved performance in some areas. Current insulated trench gated Schottky devices typically use a single wide termination trench with polysilicon spacers (where at least one of the polysilicon spacers is electrically connected to the anode electrode) as a termination structure, which can be easy to implement for most devices. For example, the wide termination trench for the termination structure can be formed at the same time as the active trenches in a single masking step. However, as device geometries continue to shrink for power devices including insulated trench gate Schottky devices, certain challenges exist to provide optimal breakdown voltage and to avoid photolithographic alignment issues associated with electrical connections to the polysilicon spacers.

Accordingly, it is desired to have termination structures and methods for forming termination structures for semiconductor devices, such as insulated trench gated Schottky devices that support smaller geometries and overcome the issues associated with prior structures. Additionally, it is also beneficial for the structures and methods to be cost effective and easy to integrate into preexisting process flows. Further, it is also beneficial for the structures and methods to provide design flexibility and equal or better electrical performance compared to prior structures.

Figure 1:
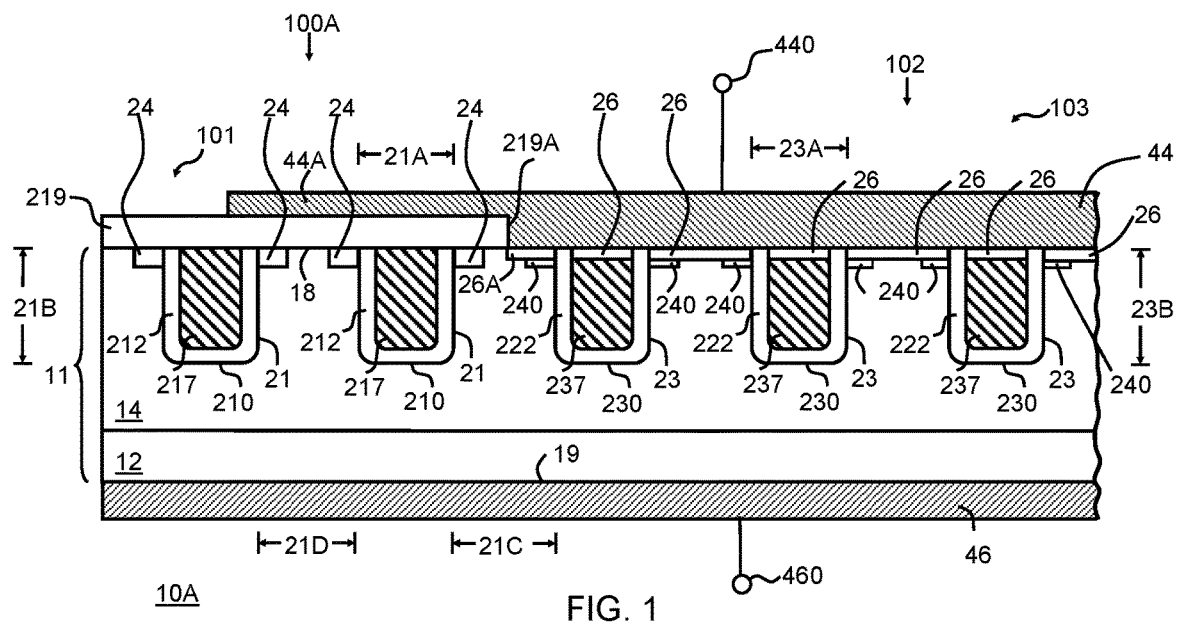
FIGS. 1-16 illustrate partial cross-sectional views of a semiconductor device with a termination structure in accordance with the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular examples only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the examples illustrated and described hereinafter suitably may have examples and/or may be practiced in the absence of any element that is not specifically disclosed herein.

DETAILED DESCRIPTION OF THE DRAWINGS

In general, the present examples relate to a semiconductor device having a having an active device region and a termination region as part of a region of semiconductor material. A termination structure is provided within the termination region and includes a termination trench and a conductive structure disposed within the region of semiconductor material. The conductive structure is electrically isolated from the region of semiconductor material by a dielectric structure. A dielectric layer is disposed to overlie at least a portion of the termination trench, and a conductive layer laterally extends to overlie the dielectric layer to provide a field plate configuration. In some examples, the termination structure is electrically floating. In other examples, the conductive structure includes a pair of conductive spacer structures disposed on opposing side surfaces of the termination trench. In some examples, the outermost one of the conductive spacer structures can be electrically connected to the conductive layer. In some examples, both conductive spacers are electrically floating. In some examples, the termination structure includes a plurality (i.e., more than one) termination trenches each having a conductive structure disposed within it that is electrically isolated from the region of semiconductor material by a dielectric structure. In some examples, the termination trenches have different widths and/or different depths. In other examples, the conductive layer can be electrically connected to the region of semiconductor material through an opening proximate to a lower surface of one or more of the termination trenches. In additional examples, the plurality of termination structures can include a merged structure where the termination trenches abut each other. In still further examples, doped regions that have a conductivity type opposite to that of the region of semiconductor material can be disposed at various locations proximate to the termination trench(es) and/or the active trenches.

The termination structure examples described herein are configured, among other things, to improve the electrical performance of semiconductor devices, such as Schottky rectifier devices including trench-gated Schottky rectifier devices. More particularly, the termination structures are configured to manage, control, or reduce the effects of electrical field build-up in semiconductor devices under, for example, reverse bias conditions. The structures described herein were found in practice to provide at least equal electrical performance compared to related devices; were found not to materially affect the performance of the active devices; are configurable or scalable for lower voltage devices (e.g., 20 volt devices) to higher voltage devices (e.g., 300 volts or higher); are compatible with existing process flows or integration schemes, which saves on manufacturing costs; and provide more robust semiconductor devices.

More particularly, in one example, a semiconductor device structure comprises a region of semiconductor material comprising a first conductivity type, a first major surface, a second major surface opposite to the first major surface, an active region; and a termination region. An active structure is disposed in the active region comprises a first active trench extending from the first major surface into the region of semiconductor material to a first depth, and a first conductive structure within the first active trench and electrically isolated from the region of semiconductor material by a first dielectric structure, wherein the first active trench has a first width proximate to the first major surface. A termination structure is disposed in the termination region and comprises a first termination trench extending from the first major surface into the region of semiconductor material to a second depth, a second conductive structure within the first termination trench and electrically isolated from the region of semiconductor material by a second dielectric structure, wherein the first termination trench comprises a second width proximate to the first major surface, a first side surface; a second side surface opposite to the first side surface, and a first lower surface extending between the first side surface and the second side surface; the first side surface is interposed between the second side surface and the first active trench; and the second conductive structure comprises a first conductive spacer disposed proximate to the first side surface of the first termination trench; and a second conductive spacer disposed proximate to the second side surface of the first termination trench; and a dielectric layer disposed overlying a portion of the first major surface and overlapping the first conductive spacer and overlapping the second conductive spacer. A first doped region comprising a second conductivity type opposite the first conductive type is disposed in the region of semiconductor material adjacent to the first major surface and adjacent to the second side surface of the first termination trench. A second doped region comprising the second conductivity type is disposed in the region of semiconductor material adjacent to the second side surface of the first termination trench. A third doped region comprising the second conductivity type in the region of semiconductor material adjacent to the first lower surface of the first termination trench, wherein the first doped region and the second doped region overlap; and the second doped region and the third doped region overlap. A Schottky contact structure having a first portion is disposed adjacent to the first major surface on opposing sides of the first active trench and a second portion disposed within the first doped region. A first conductive layer is disposed overlying the first major surface and electrically coupled to the first portion and the second portion of Schottky contact structure.

In another example, a semiconductor device structure includes a region of semiconductor material comprising a first conductivity type, a first major surface, a second major surface opposite to the first major surface; an active region, and a termination region. An active structure is disposed in the active region and comprises a first active trench extending from the first major surface into the region of semiconductor material, and a first conductive structure within the first active trench and electrically isolated from the region of semiconductor material by a first dielectric structure. A termination structure is disposed in the termination region and comprises a first termination trench extending from the first major surface into the region of semiconductor material; a second conductive structure within the first termination trench and electrically isolated from the region of semiconductor material by a second dielectric structure, wherein the first termination trench comprises a first side surface, a second side surface opposite to the first side surface, and a first lower surface extending between the first side surface and the second side surface; the first side surface is interposed between the second side surface and the first active trench; and the second conductive structure comprises a first conductive spacer disposed proximate to the first side surface of the first termination trench; and a dielectric layer is disposed overlying a portion of the first major surface and overlapping the first conductive spacer. A first doped region comprising a second conductivity type opposite the first conductive type is disposed in the region of semiconductor material adjacent to the first lower surface of the first termination trench. A Schottky contact structure having a first portion is disposed adjacent to the first major surface on opposing sides of the first active trench. A first conductive layer is disposed overlying the first major surface and is electrically coupled to the first portion and the second portion of Schottky contact structure and is electrically coupled to the first doped region.

In a further example, a semiconductor device structure comprises a region of semiconductor material comprising a first conductivity type, a first major surface, a second major surface opposite to the first major surface, an active region, and a termination region. An active structure is disposed in the active region and comprises a first active trench extending from the first major surface into the region of semiconductor material, and a first conductive structure within the first active trench and electrically isolated from the region of semiconductor material by a first dielectric structure. A termination structure is disposed in the termination region and comprises a first termination trench extending from the first major surface into the region of semiconductor material; a second conductive structure within the first termination trench and electrically isolated from the region of semiconductor material by a second dielectric structure, wherein the first termination trench comprises a first side surface, a second side surface opposite to the first side surface, and a first lower surface extending between the first side surface and the second side surface; the first side surface is interposed between the second side surface and the first active trench; and the second conductive structure comprises a first conductive spacer disposed proximate to the first side surface of the first termination trench, and a second conductive spacer disposed proximate to the second side surface of the first termination trench; and a dielectric layer disposed overlying a portion of the first major surface and overlapping the first conductive spacer and overlapping the second conductive spacer. A first doped region comprising a second conductivity type opposite the first conductive type is disposed in the region of semiconductor material adjacent to a first lower corner of the first termination trench. A second doped region comprising the second conductivity type is disposed in the region of semiconductor material adjacent to a second lower corner of the first termination trench. A Schottky contact structure having a first portion that is disposed adjacent to the first major surface on opposing sides of the first active trench and a second portion that is disposed in a portion of the region of semiconductor material proximate to the lower surface of the first termination trench. A first conductive layer is disposed overlying the first major surface and electrically coupled to the first portion and the second portion of Schottky contact structure.

FIG. 1 illustrates an enlarged partial cross-sectional view of an electronic device 10A, semiconductor device 10A, Schottky diode device 10A, or trench Schottky rectifier 10A having a termination structure 100A or termination trench structures 100A in an edge portion 101 or a termination portion 101 of a region of semiconductor material 11, and an active structure 102 or active trench structures 102 in an active portion 103 of region of semiconductor material 11 in accordance with the present description. In the present example, region of semiconductor material 11 includes a major surface 18 and an opposing major surface 19. Region of semiconductor material 11 can include a bulk semiconductor substrate 12, such as an N-type silicon substrate having a resistivity ranging from about 0.001 ohm-cm to about 0.005 ohm-cm. By way of example, substrate 12 can be doped with phosphorous, arsenic, or antimony. In other examples, substrate 12 can be a P-type silicon substrate having a similar resistivity range.

In some examples, region of semiconductor material 11 further includes a semiconductor layer 14, doped region 14, or doped layer 14, which can be formed in, on, or overlying substrate 12. In one example, semiconductor layer 14 can be an N-type conductivity region or layer when substrate 12 is N-type conductivity, and can be formed using epitaxial growth techniques, ion implantation and diffusion techniques, or other techniques known to those skilled in the art. In other examples, semiconductor layer 14 can be P-type conductivity. In one example, semiconductor layer 14 includes major surface 18 of region of semiconductor material 11. It is understood that region of semiconductor material 11, semiconductor substrate 12, and/or semiconductor layer 14 can include other types of materials including, but not limited to, heterojunction semiconductor materials, and semiconductor substrate 12 and semiconductor layer 14 can each include different materials. Such materials can include SiGe, SiGeC, SiC, GaN, AlGaN, and other similar materials as known to those skilled in the art.

In some examples, semiconductor layer 14 has a dopant concentration less than the dopant concentration of substrate 12. The dopant concentration and/or dopant profile of semiconductor layer 14 can be selected to provide a desired breakdown voltage and a forward voltage drop. More particularly, in an example for a 20 volt device, semiconductor layer 14 has a thickness from approximately 1.5 microns to approximately 2.5 microns and a dopant concentration in a range from approximately $1.0 \times 10^{16}$ atoms/cm$^3$ and approximately $1.0 \times 10^{17}$ atoms/cm$^3$. In an example for a 30 volt device, semiconductor layer 14 has a thickness from approximately 2.25 microns to approximately 3.25 microns and a dopant concentration in a range from approximately $1.5 \times 10^{16}$ atoms/cm$^3$ and approximately $8.0 \times 10^{16}$ atoms/cm$^3$. In an example for a 40 volt device, semiconductor layer 14 has a thickness from approximately 2.7 microns to approximately 4.5 microns and a dopant concentration in a range from approximately $1.0\times10^{16}$ atoms/cm$^3$ and approximately $6.0\times10^{16}$ atoms/cm$^3$.

In the present example, termination structure 100A includes one or more first trenches 21 or termination trenches 21 extending from major surface 18 into region of semiconductor material 11, and active structure 102 comprising second trenches 23 or active trenches 23 extending from major surface 18 into other portions of region of semiconductor material 11. In some examples, termination trenches 21 are laterally spaced apart from each other with a portion of region of semiconductor material 11 interposed between adjacent termination trenches 21. Active trenches 23 can be laterally spaced apart from each with other portions of region of semiconductor material 11 interposed between adjacent active trenches 23. In some examples, termination trenches 21 are disposed within edge portion 101 of region of semiconductor material 11 so as to laterally surround active trenches 23. In some examples, at least one of the termination trenches 21 completely surrounds and encloses active structure 102.

In one example, termination trenches 21 and active trenches 23 can extend from major surface 18 into semiconductor layer 14 towards semiconductor substrate 12. In some examples, termination trenches 21 and active trenches 23 can extend into semiconductor substrate 12. In other examples, termination trenches 21 and active trenches 23 can terminate within semiconductor layer 14 thereby leaving a portion of semiconductor layer 14 interposed between lower surfaces of termination trenches 21 and active trenches 23 and semiconductor substrate 12. In the present example, termination trenches 21 have a width 21A proximate to major surface 18 that is substantially equal to a width 23A of active trenches 23 proximate to major surface 18. In some examples, widths 21A and 23A can be in a range from approximately 0.1 microns to approximately 2.0 microns. In the present example, each of termination trenches 21 has a depth 21B that is substantially equal to depth 23B of active trenches 23. As will be explained in other examples that follow, termination trenches 21 can have different depths with respect to each other and/or with respect to active trenches 23. In addition, active trenches 23 can have different depths with respect to each other.

Termination trenches 21 and active trenches 23 can be formed at the same time or at different steps fabrication. In some examples, one or more photolithographic masking steps can be used. In addition, termination trenches 21 and active trenches 23 can be etched using plasma etching techniques with a fluorocarbon chemistry or a fluorinated chemistry (for example, $SF_6/O_2$) or other chemistries or removal techniques as known to those skilled in the art. Wet etchants can also be used to form termination trenches 21 and active trenches 23 alone or in combination with other removal techniques.

In the present example, an innermost one of termination trenches 21 is spaced from an outermost one of active trenches 23 by a distance 21C or spacing 21C, and the innermost one of termination trenches 21 is spaced from a next adjacent termination trench 21 by a distance 21D or spacing 21D. In the present example, distance 21C is substantially equal to distance 21D. As will be explained in other examples that follow, distances 21C and 21D as well as spaces or gaps between other termination trenches can be different.

Termination trench structures 100A further include a dielectric layer 212, a dielectric region 212, or a dielectric structure 212 disposed adjoining sidewall surfaces and lower surfaces of termination trenches 21 as generally illustrated in FIG. 1. Dielectric layers 212 each define surfaces of termination trenches 21 including a lower surface 210 disposed at a distance inward from major surface 18 into region of semiconductor material 11. It is understood that lower surfaces 210 may not be flat, and can instead have other shapes including, but not limited to curved, rounded, partially-curved, or partially-rounded shapes. In one example, dielectric layers 212 can be a thermal oxide having a thickness in a range from approximately 0.05 microns to approximately 0.5 microns. In other examples, dielectric layers 212 can be other types of oxides, nitrides, high K dielectrics, combinations thereof, or other dielectric materials known to those skilled in the art.

Termination trench structures 100A further include a conductive structure 217, a conductive layer 217, a conductive region 217, conductive structure 217, or a conductive material 217 provided along surfaces adjoining or at least adjacent to dielectric layers 212. In one example, conductive material 217 can be a conductive polycrystalline material, such as doped polysilicon (e.g., N-type or P-Type).

In one example, a dielectric layer 219, a dielectric region 219, or a dielectric structure 219 is disposed overlying major surface 18 within edge portion 101 of device 10A. In the present example, dielectric layer 219 can be a continuous layer that laterally overlaps termination trench structures 100A such that termination trench structures 100A are configured to electrically floating structures. This is different than related devices where contact is intentionally made to the conductive material within the termination trench structure such that the prior termination trench structures are electrically connected to the anode electrode.

In some preferred examples, dielectric layer 219 completely overlaps termination structures 100A and laterally extends up to or slightly within active region 103 of device 10A. In some examples, an edge 219A of dielectric layer 219 is configured to establish a perimeter of active region 103 such that no other portion of dielectric layer 219 is disposed within active region 103. Stated differently, in some examples active region 103 is provided devoid or absent dielectric layer 219 except where active region 103 transitions to termination region 101.

In one example, dielectric layer 219 can be a deposited dielectric material, such as a deposited oxide, a deposited nitride, combinations thereof, or other dielectric materials as known to those skilled in the art. In one example, dielectric layer 219 can be an oxide deposited using a tetra-ethyl-ortho-silicate ("TEOS") source using plasma-enhanced chemical vapor deposition ("PECVD") or low pressure chemical vapor deposition ("LPCVD"), and can have a thickness in a range from approximately 0.2 microns to approximately 1.0 micron. In other examples, dielectric layer 219 can be a thermal oxide layer or combination of a thermal oxide and one or more deposited dielectrics, such as one or more deposited oxide layer (doped or undoped) and/or one or more of a deposited nitride layer.

In one example, active trench structures 102 further include a gate dielectric region 222, a gate dielectric layer 222, a dielectric layer 222, a dielectric region 222, or a dielectric structure 222 disposed adjoining sidewall surfaces and lower surfaces of active trenches 23. Dielectric layer 222 defines surfaces of active trenches 23 including a lower surface 230 of active trenches 23. It is understood that lower surfaces 230 may not be flat, and instead, can have other shapes including, but not limited to curved, rounded, partially-curved, or partially-rounded shapes. In one example, dielectric layer 222 comprises a dry and wet oxide having a thickness in a range from approximately 0.01 microns to approximately 1.5 microns. In other examples, dielectric layer 222 can comprise a nitride, tantalum pentoxide, titanium dioxide, barium strontium titanate, high k dielectric materials, combinations thereof, or other related or equivalent materials known by one of ordinary skill in the art. In some examples, dielectric layer 212 and dielectric layers 222 can be the same material. In some examples, dielectric layer 212 and dielectric layer 222 can be formed during the same process step(s).

In the present example, dielectric layer 212 can have a substantially uniform thickness along the sidewall surfaces and lower surfaces of termination trenches 21, and dielectric layer 222 can have a substantially uniform thickness along the sidewall surfaces and lower surfaces of active trenches 23. As will be explained later, the thicknesses of one or more of dielectric layer 212 and/or dielectric layer 222 can be non-uniform. That is, these layers may comprise combinations of thicker portions and thinner portions.

Active trench structures 102 further include a conductive structure 237, a conductive layer 237, a conductive region 237, a gate electrode 237, or a conductive material 237 provided along surfaces adjoining or at least adjacent to dielectric layer 222. In one example, conductive material 237 can be a conductive polycrystalline material, such as a doped polysilicon (e.g., N-type or P-type). In accordance with the present description, the conductivity type of conductive material 217 within termination trench structures 100A can be different or can be the same as the conductivity type of conductive material 237 within active trench structures. For example, conductive material 217 in one or more of termination trench structures 100A can be P-type and conductive material 237 in active trench structures 102 can be N-type. In addition, the dopant concentration of conductive material 217 can be different than the dopant concentration of conductive material 237. For example, conductive material 237 can be more heavily doped N-type, and conductive material 217 can be more lightly doped P-type. In addition, the dopant concentration of conductive material 217 can be different in different ones of termination trenches 21. By way of example, conductive material 217 in an innermost one of termination trenches 21 can be more heavily doped than conductive material 217 in an outermost one of termination trenches 21. It is understood that the foregoing description regarding the conductivity type and the dopant concentration of conductive material 217 and conductive material 237 applies to any of the examples described herein.

Conductive materials 217 and 237 can be formed using, for example, LPCVD or PECVD processing techniques and can be doped in-situ or doped subsequent to their formation. In some examples, conductive materials 217 and 237 can have a thickness in a range from approximately 0.3 microns to about 2.0 microns, and conductive material 237 can be doped with phosphorous and can have a dopant concentration of $1.0 \times 10^{20}$ atoms/cm$^3$ or more. In some examples, termination trench 21 and active trenches 23 can have sloped sidewalls.

In accordance with the present example, termination trench structures 100A are configured to improve the electrical performance of device 10A. For example, termination trench structures 100A are configured to spread the electrical field when device 10A is operating under reverse bias conditions thereby improving breakdown voltage performance.

In some examples, termination trench structures 100A further include doped regions 24 disposed extending from major surface 18 into region of semiconductor material 11 adjoining, or at least proximate to upper side surfaces of termination trenches 21 as generally illustrated in FIG. 1. In the present example, doped regions 24 disposed adjacent termination trenches 21 are laterally spaced apart from each other so that a portion of region of semiconductor material 11 is interposed between at least some of the doped regions 24 as generally illustrated in FIG. 1. In the present example, dielectric layer 219 completely overlaps doped regions 24 disposed next to termination trenches 21 so that these doped regions 24 are electrically floating similar to termination trench structures 100A.

Doped regions 24 comprise a dopant having a conductivity type that is opposite to the conductivity type of semiconductor layer 14. In the present example, doped regions 24 are P-type when semiconductor layer 14 is N-type. In some examples, doped regions 24 can be formed using ion implantation and anneal techniques. By way of example, doped regions 24 can be formed using an angled boron ion implant with an implant dose in a range from about $2.0 \times 10^{14}$ atoms/cm$^2$ to about $7.0 \times 10^{14}$ atoms/cm$^2$ at an energy of approximately 10 keV. In one example, an implant dose of about $5.0 \times 10^{14}$ atoms/cm$^2$ is used. In other examples, doped regions 24 can be formed by chemical vapor deposition and diffusion techniques, or doped regions 24 can be formed using diffusion techniques with conductive structures 217 as a dopant source. Masking techniques can be used to define the locations of doped regions 24. Other doping techniques as known to those skilled in the art can also be used. In accordance with the present example, doped regions 24 are configured in combination with termination trench structures 100A to enhance the electrical performance of device 10A.

Device 10A further includes Schottky contact regions 26, contact regions 26, conductive layers 26, conductive region or regions 26, or conductive material 26 disposed adjoining portions of major surface 18. In some examples, conductive material 26 also can be disposed adjoining upper surface portions of conductive material 237 within active trench structures 102. In the present example, conductive material 26 is not disposed to adjoin upper surface portions of conductive material 217 in termination trench structures 100A. Stated differently, conductive material 217 is provided devoid or absent conductive material 26 in device 10A.

Conductive material 26 comprises a material configured to provide a Schottky barrier structure with region of semiconductor material 11 or semiconductor layer 14. Such materials can include platinum, nickel-platinum (with various platinum atomic weight percentages, for example, from approximately 1% to approximately 80%, with 5% being selected in some examples), titanium, titanium-tungsten, chromium, and/or other materials capable of forming a Schottky barrier as known to those skilled in the art.

In some examples, device 10A further includes doped regions 240 disposed extending from major surface 18 into region of semiconductor material 11 adjoining or at least proximate to upper side surfaces of active trenches 23 as generally illustrated in FIG. 1. Doped regions 240 are configured to reduce leakage current in device 10A. In the present example, a pair of doped regions 240 are disposed on both sides of the outermost one of active trenches 23 in device 10A, and a single doped region 240 is disposed only one side of the next outermost one of active trenches 23 as generally illustrated in FIG. 1. Stated differently, in some examples doped regions 240 are only provided on the outermost two active trenches 23. In accordance with the present example, a portion 26A of conductive material 26 is provided interposed between edge 219A of dielectric layer 219 and an outermost one of doped regions 240 so that a Schottky barrier region is formed at portion 26A in device 10A. Among other things, this provides additional Schottky barrier area for device 10A. It also provides protection of the mesa region adjoining the termination trench from photo-lithographical misalignment. Doped regions 240 can be provided in a similar manner to doped region 24 as described as previously. In other examples, more or less (including none) doped regions 24 and 240 are used.

A conductive layer 44 is formed overlying major surface 18 and a conductive layer 46 is formed overlying major surface 19. Conductive layers 44 and 46 can be configured to provide electrical connection between device 10A and a next level of assembly, such as a semiconductor package structure or printed circuit board. In accordance with the present example, conductive layer 44 is electrically connected to Schottky contact regions 26. In addition, a portion 44A or field plate portion 44A of conductive layer 44 is part of termination structure 100A. In the present example, field plate portion 44A laterally extends overlying dielectric layer 219 to completely overlap the innermost one of termination trenches 21 as generally illustrated in FIG. 1. In other examples, field plate portion 44A is provided to laterally extend to at least partially overlie the outermost one of termination trenches 21 as generally illustrated in FIG. 1. In other examples, field plate portion 44A latterly extends to overlap all termination trenches 21 and all doped regions 24.

In one example, conductive layer 44 can be titanium/titanium-nitride/aluminum-copper or other related or equivalent materials known those skilled in the art and is configured as first current carrying electrode or terminal 440 or an anode electrode 440 for device 10A. In one example, conductive layer 46 can be a solderable metal structure such as titanium-nickel-silver, chromium-nickel-gold, or other related or equivalent materials known by those skilled in the art. In the example illustrated, conductive layer 46 provides a second current carrying electrode or terminal 460 or a cathode electrode 460 for device 10A.

In accordance with the present example, termination structure 100A is provided with multiple design parameters for optimizing the electrical performance of device 10A including, for example, the number (e.g., one or more) of termination trench structures, the number of termination trenches that are electrically floating (e.g., electrically decoupled from the anode and cathode electrodes of the device), termination trench widths and depths (e.g. substantially equal or different), spacing between the outermost active trench and the innermost termination trench, spacing between adjacent termination trenches, dopant conductivity type (e.g., P-type or N-type) of the conductive material within the termination trenches, dopant concentration variations of the conductive material within the termination trenches, the use and location of doped regions 24 and 240, the width, depth and dopant concentration of doped region 24 and 240, and the amount a conductive field plate 44A overlaps the termination trenches. Experimental results show that device 10A with termination structure 100A has similar or better electrical performance than related devices.

One advantage of device 10A compared to related devices is that width 21A of termination trenches 21 is similar to width 23A, which simplifies processing in some examples, and reduces stress on regions of semiconductor material 11 thereby improving, among other things, reliability. Other advantages of device 10A include, but are not limited to, ease of fabrication, ease of matching depths of the termination and active trenches, and the narrower width of the termination trenches compared to previous devices increases manufacturing yields.

Figure 2:
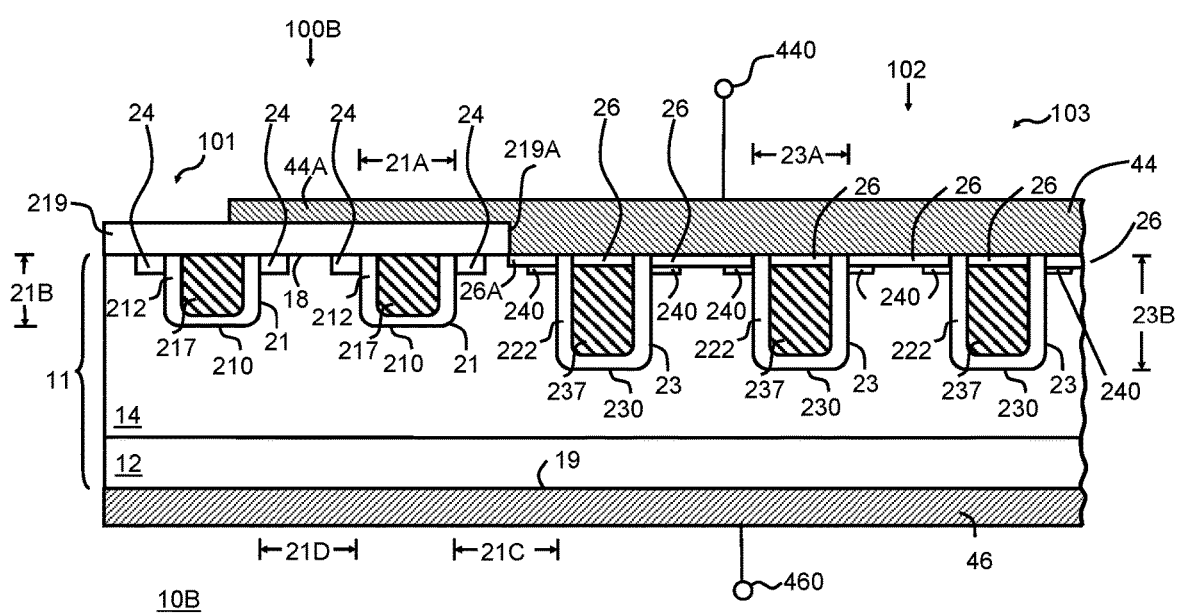

FIG. 2 illustrates a partial cross-sectional view an electronic device 10B, semiconductor device 10B, Schottky diode device 10B, or trench Schottky rectifier 10B having a termination structure 100B or termination trench structures 100B in edge portion 101 of region of semiconductor material 11, and active structure 102 or active trench structures 102 in active portion 103 of region of semiconductor material 11 in accordance with the present description. Device 10B is similar to device 10A and only the differences will be described hereinafter. In the present example, termination structure 100B includes one or more of termination trenches 21 having a depth 21B that is less than depth 23B of active trenches 23. In one example, each of termination trenches 21 has a depth 21B less than depth 23B of one or more of active trenches 23. In some examples, each of the termination trenches 21 has substantially the same depth 21B. In other examples, termination trenches 21 can have different depths, but depths 21B are less than depth 23B. In some examples, depth 21B increases from an innermost termination trench 21 to an outermost termination trench 21. In other examples depth 21B decreases from an innermost termination trench 21 to an outmost termination trench 21. The electrical performance of device 10B can be further optimized similarly to other devices described herein including, for example, 10A.

Figure 3:
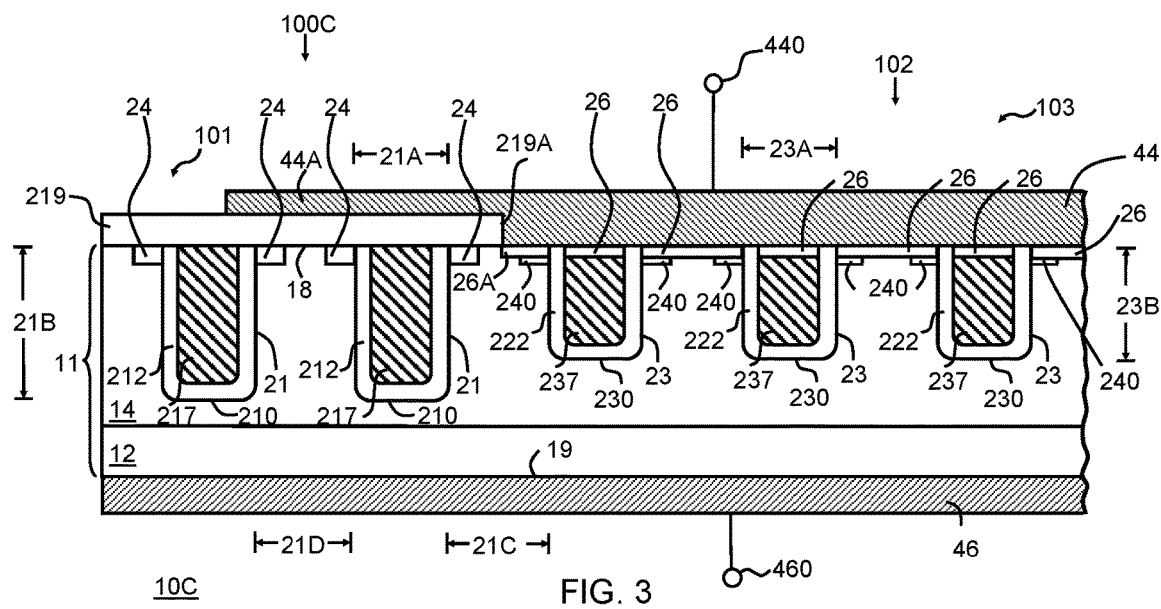

FIG. 3 illustrates a partial cross-sectional view of an electronic device 10C, semiconductor device 10C, Schottky diode device 10C, or trench Schottky rectifier 10C having a termination structure 100C or termination trench structures 100C in edge portion 101 of region of semiconductor material 11, and active structure 102 or active trench structures 102 in active portion 103 of region of semiconductor material 11 in accordance with the present description. Device 10C is similar to device 10A and only the differences will be described hereinafter. In the present example, termination structure 100C includes one or more of termination trenches 21 having a depth 21B that is greater than depth 23B of active trenches 23. In one example, each of termination trenches 21 has a depth 21B greater than depth 23B. In some examples, each of the termination trenches 21 has substantially the same depth 21B. In other examples, termination trenches 21 have different depths, but depths 21B that are greater than depth 23B. In some examples, depth 21B increases from an innermost termination trench 21 to an outermost termination trench 21. In other examples depth 21B decreases from an innermost termination trench 21 to an outmost termination trench 21. The electrical performance of device 10C can be further optimized similarly to other devices described herein including, for example, 10A.

Figure 4:
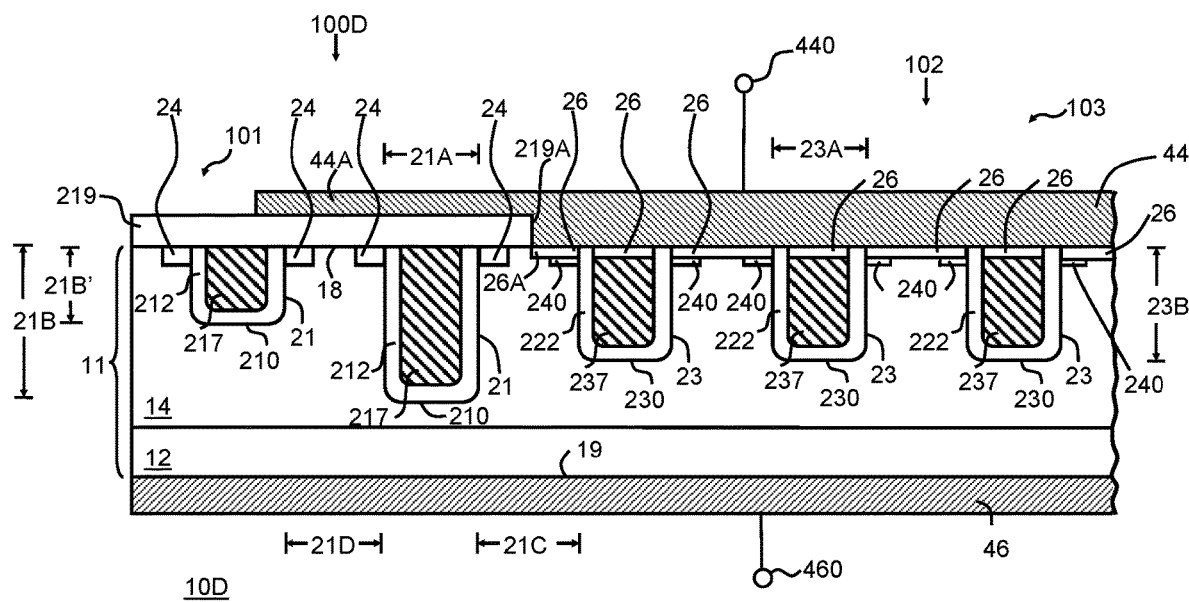

FIG. 4 illustrates a partial cross-sectional view of an electronic device 10D, semiconductor device 10D, Schottky diode device 10D, or trench Schottky rectifier 10D having a termination structure 100D or termination trench structures 100D in edge portion 101 of region of semiconductor material 11, and active structure 102 or active trench structures 102 in active portion 103 of region of semiconductor material 11 in accordance with the present description. Device 10D is similar to device 10A and only the differences will be described hereinafter. In the present example, termination structure 100D includes a first termination trench 21 having a depth 21B that is greater than depth 23B of active trenches 23, and a second termination trench 21 having a depth 21B' that is less than depth 21B of first termination trench 21 and less than depth 23B of active trenches 23. In some examples, termination structure 100D has at least one termination trench 21 with a shallower depth than the active trenches 23, and has at least one termination trench 21 with a greater depth than active trenches 23. In the present example, the outermost one of termination trenches 21 has a shallower depth than an innermost one of termination trenches 21. In other examples, depth 21B can be less than depth 23B and depth 21B' can be less than 23B. The electrical performance of device 10D can be further optimized similarly to other devices described herein including, for example, 10A.

Figure 5:
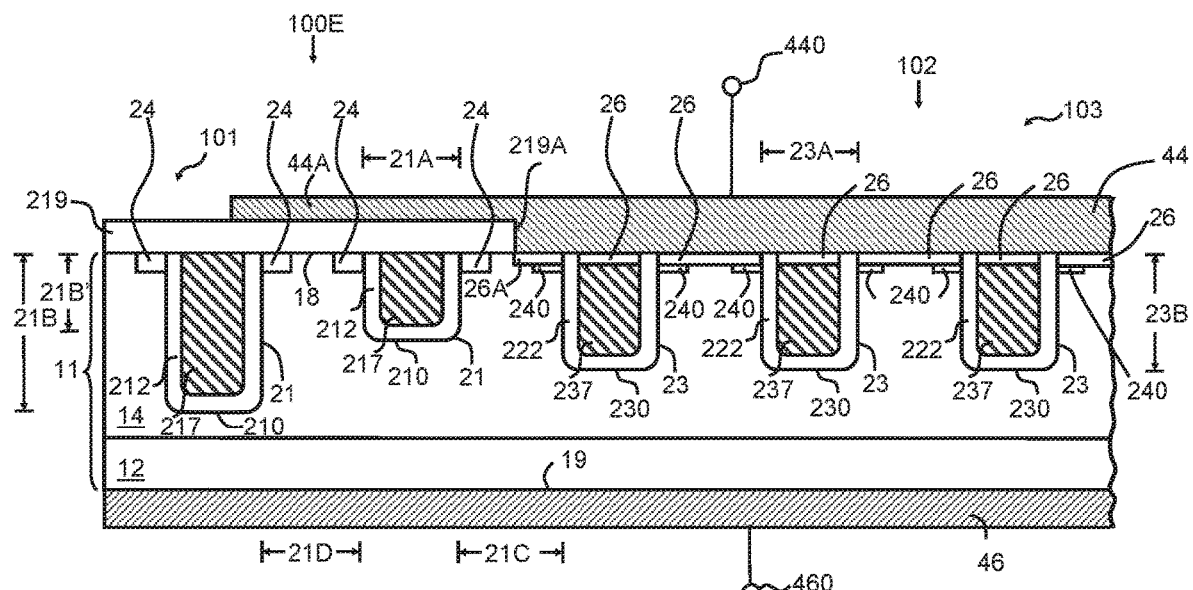

FIG. 5 illustrates a partial cross-sectional view of an electronic device 10E, semiconductor device 10E, Schottky diode device 10E, or trench Schottky rectifier 10E having a termination structure 100E or termination trench structures 100E in edge portion 101 of region of semiconductor material 11, and active structure 102 or active trench structures 102 in active portion 103 of region of semiconductor material 11 in accordance with the present description. Device 10E is similar to devices 10A and 10D, and only the differences will be described hereinafter. In the present example, termination structure 100E includes a first termination trench 21 having a depth 21B' that is less than depth 23B of active trenches 23, and a second termination trench 21 having a depth 21B that is greater than depth 23B of active trenches 23. In some examples, termination structure 100E has at least one termination trench 21 with a shallower depth than the active trenches 23 and has at least one termination trench 21 with a greater depth than active trenches 23. In the present example, the outermost one of termination trenches 21 has a deeper or greater depth than the innermost termination trench 21. In other examples, depth 21B' can be less than depth 23B and depth 21B can be less than depth 21B'. In one example, the outer termination trench of device 10E can extend to substrate 12 to provide additional isolation, for example, if device 10E is used a multiple-die configuration. The electrical performance of device 10E can be further optimized similarly to other devices described herein including, for example, 10A.

Figure 6:
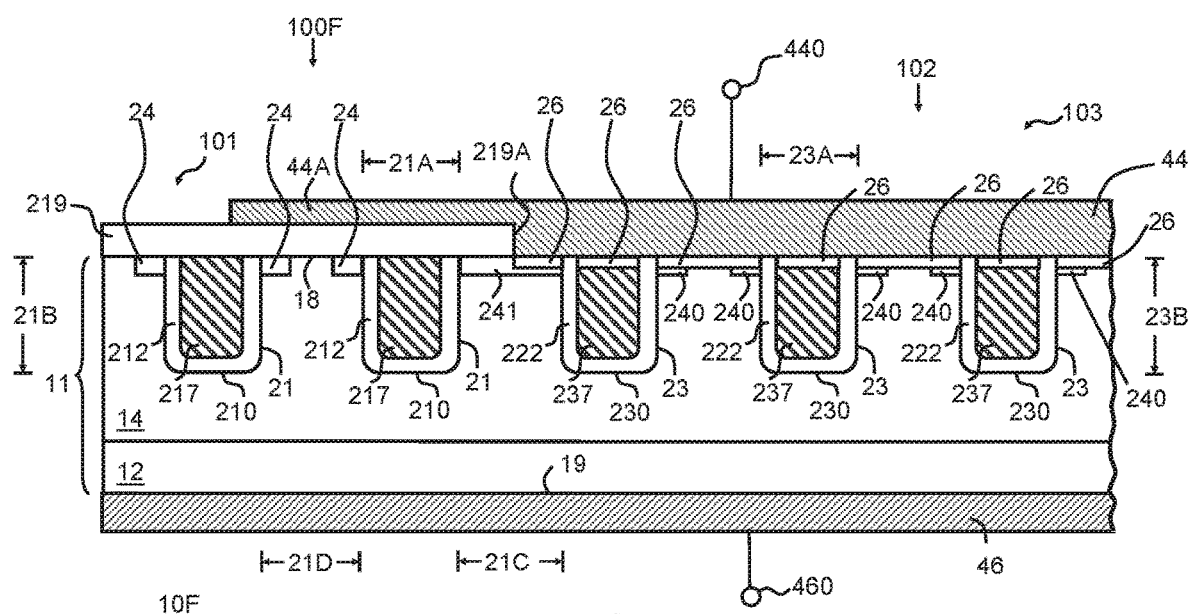

FIG. 6 illustrates a partial cross-sectional view of an electronic device 10F, semiconductor device 10F, Schottky diode device 10F, or trench Schottky rectifier 10F having a termination structure 100F or termination trench structures 100F in edge portion 101 of region of semiconductor material 11, and active structure 102 or active trench structures 102 in active portion 103 of region of semiconductor material 11 in accordance with the present description. Device 10F is similar to device 10A, and only the differences will be described hereinafter. In device 10F, termination structure 100F also comprises a continuous doped region 241 interposed between the innermost one of termination trenches 21 and the outermost one of active trenches 23 as generally illustrated in FIG. 6. In this example, continuous doped region 241 can have P-type conductivity (i.e., has an opposite conductivity type to at least semiconductor layer 14) and can be formed similarly to doped regions 24 and 240. In the present example, continuous doped region 241 is configured to act as a guard ring structure to further enhance the electrical performance of device 10F. In addition, device 10F is illustrated with additional doped regions 240 in active region 103. In some examples, continuous doped region 241 is provided in combination with more or less of doped regions 24 and/or 240. In some examples, only continuous doped region 241 is used with doped regions 24 and 240 not used. The electrical performance of device 10F can be further optimized similarly to other devices described herein including, for example, 10A.

Figure 7:
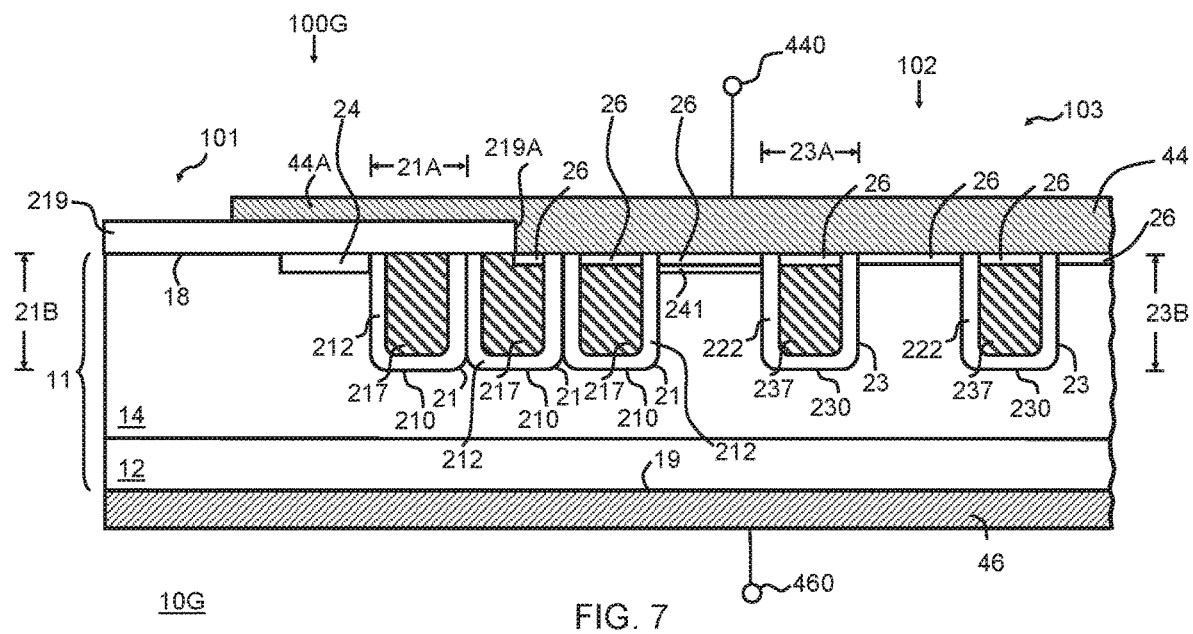

FIG. 7 illustrates a partial cross-sectional view of an electronic device 10G, semiconductor device 10G, Schottky diode device 10G, or trench Schottky rectifier 10G having a termination structure 100G or termination trench structures 100G in edge portion 101 of region of semiconductor material 11, and active structure 102 or active trench structures 102 in active portion 103 of region of semiconductor material 11 in accordance with the present description. Device 10G is similar to device 10A and only the differences will be described hereinafter. In device 10G, termination structure 100G includes a plurality of termination trenches 21 that abut or that adjoin each other so as to form a merged structure or merged termination structure as generally illustrated in FIG. 7. Stated differently, in device 10G termination trenches 21 are disposed within region of semiconductor material 11 such that no portion or substantially no portion of region of semiconductor material 11 (e.g., no portion of or substantially no portion of semiconductor layer 14) remains interposed between termination trenches 21. In some examples, dielectric structures 212 in adjoining termination trenches merge together during the process used to form dielectric structures 212. In some examples, thermal oxidation can be used to form dielectric structures 212 to provide the merged structure.

In the present example, dielectric layer 219 completely overlaps at least one of termination trenches 21 such that conductive material 217 in the at least one of termination trenches 21 is electrically floating. In the present example, the outermost one of the termination trenches 21 is electrically floating. In the present example, edge 219A of dielectric layer 219 terminates on conductive material 217 of the second outermost one of termination trenches 21 so that this termination trench 21 and the innermost one of the termination trenches 21 are electrically connected to conductive electrode 44 as generally illustrated in FIG. 7. In the present example, conductive material 26 is provided in those portions of conductive material 217 not covered by dielectric layer 217. In addition, depth 21B of termination trenches 21 and depth 23B of active trenches 23 are substantially equal. In other examples, some of which will be described in more detail hereinafter, in device 10G the depths of termination trenches 21 and active trenches 23 can be different. One advantage of device 10G is that can achieve a pseudo wide termination configuration, while using the active trench mask to control the depth of the termination structure.

Similar to device 10A, termination structure 100G further includes dielectric layer 219 and field plate portion 44A of conductive layer 44. In one example, field plate portion 44A completely laterally overlaps each of termination trenches 21 and optional doped region(s) 24 as generally illustrated in FIG. 7. In other examples, device 10G can include additional doped regions 24. In the present example, a doped region 241 is disposed between the innermost one of the termination trenches 21 and the outermost one of the active trenches 23. In an alternative example, device 10G can further include one or more of doped regions 240 and/or additional doped regions 241 disposed adjacent to active trenches 23. It is understood that in some examples, doped regions 24, 240, and 241 can be excluded. The electrical performance of device 10G can be further optimized similarly to other devices described herein including, for example, device 10A. In addition, the number of termination trenches with conductive material 217 electrically connected to conductive layer 44 can be varied.

Figure 8:
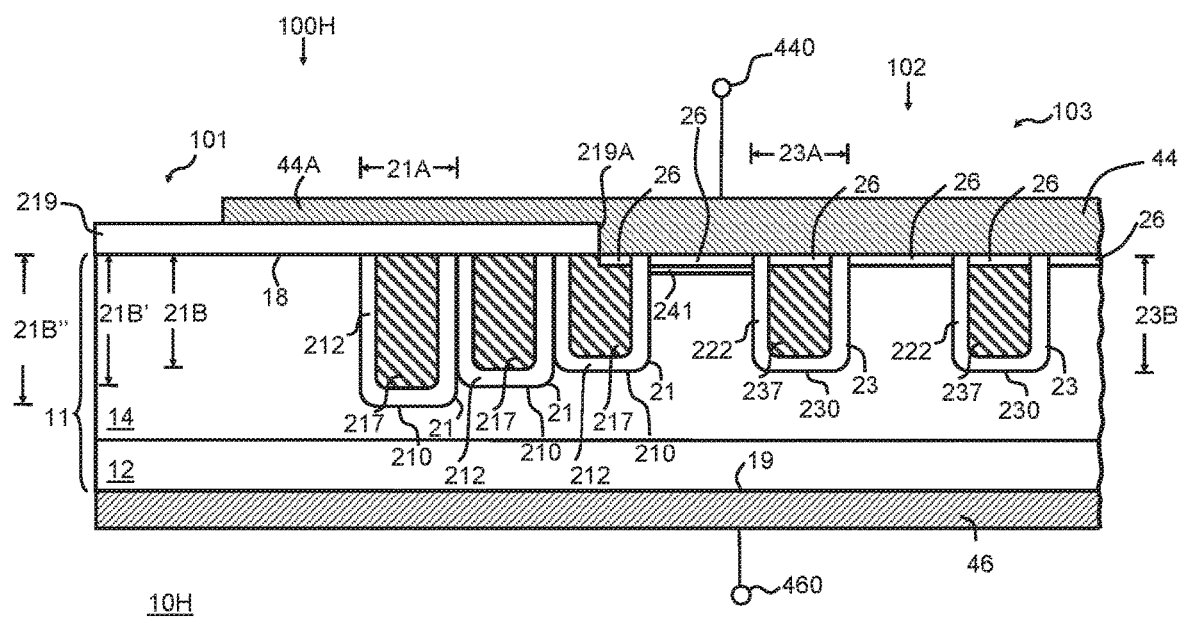

FIG. 8 illustrates a partial cross-sectional view of an electronic device 10H, semiconductor device 10H, Schottky diode device 10H, or trench Schottky rectifier 10H having a termination structure 100H or termination trench structures 100H in edge portion 101 of region of semiconductor material 11, and active structure 102 or active trench structures 102 in active portion 103 of region of semiconductor material 11 in accordance with the present description. Device 10H is similar to devices 10A and 10G, and only the differences will be described hereinafter. In device 10H, dielectric layer 219 extends laterally inward from an edge of device 10H to partially overlap the innermost one of termination trenches 21. In this example, a plurality of the termination trenches 21 are electrically floating, and the innermost one of the termination trenches 21 is electrically connected to conductive layer 44. More particularly, edge 219A of dielectric layer 219 is disposed to partially overlap conductive material 217 in the innermost one of termination trenches 21. In addition, in device 10H one or more of the termination trenches 21 are provided with a depth that is different than that of at least one of the other of the termination trenches 21, and that is different than depth 23B of active trenches 23. In the present example, the innermost one of the termination trenches 21 has a depth 21B that is similar to depth 23B of active trenches 23, the outermost one of the termination trenches 21 has a depth 21B" that is greater than depths 21B and 23B, and the second outermost one of the termination trenches 21 has a depth 21B' that is greater than depths 21B and 23B, but less than depth 21B".

In the present example, the depth of the termination trenches 21 gradually increases from the innermost one of the termination trenches 21 to the outermost one of the termination trenches 21. In other examples, dielectric layer 219 can laterally extend to overlap just one of the termination trenches 21. In addition, doped regions 24 and 240 can be included and/or doped region 241 (as illustrated in FIG. 8) can be excluded. In other examples, termination trenches 21 can have other combinations or variations of depths 21B. For example, depth 21B can be less than or greater than depth 23B. In addition, the outermost one of termination trenches 21 can extend to substrate 12 in some examples. Termination structure 100H provides improved electric field spreading laterally in the termination region. The electrical performance of device 10H can be further optimized similarly to other devices described herein including, for example, device 10G.

Figure 9:
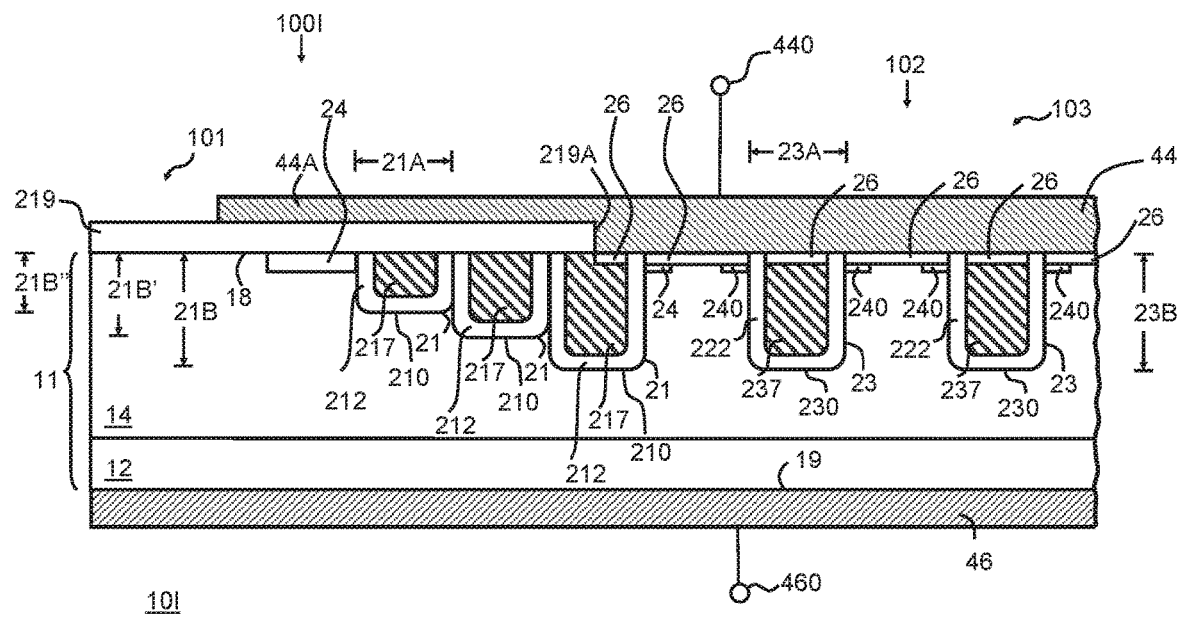

FIG. 9 illustrates a partial cross-sectional view of an electronic device 10I, semiconductor device 10I, Schottky diode device 10I, or trench Schottky rectifier 10I having a termination structure 100I or termination trench structures 100I in edge portion 101 of region of semiconductor material 11, and active structure 102 or active trench structures 102 in active portion 103 of region of semiconductor material 11 in accordance with the present description. Device 10I is similar to devices 10G and 10H, and only the differences will be described hereinafter. In device 10I, the innermost one of the termination trenches 21 has a depth 21B that is similar to depth 23B of active trenches 23, the outermost one of the termination trenches 21 has a depth 21B" that is less than depths 21B and 23B, and the second outermost one of the termination trenches 21 has a depth 21B' that is less than depths 21B and 23B, but greater than depth 21B".

In the present example, the depth of the termination trenches 21 gradually decreases from the innermost one of the termination trenches 21 to the outermost one of the termination trenches 21. In the present example, device 10I includes doped regions 24 and 240. In other examples, dielectric layer 219 can laterally extend to overlap just one of the termination trenches 21. In addition, in other examples additional doped regions 24, 240, and 241 can be excluded. In other examples, termination trenches 21 can have other combinations of depths 21B. For example, depth 21B can be greater than or less than depth 23. In the examples of FIGS. 7-9, at least one termination trench includes a least a portion of conductive material 26 disposed within conductive material 217, which is further electrically connected to conductive layer 44.

In the foregoing examples of FIGS. 1-9, the widths of termination trenches 21 and active trenches 23 are illustrated as being substantially the same. It is understood that in other examples, one or more of termination trenches 21 can have a width that is less than or greater than the widths of other termination trenches 21 and/or active trenches 23. The electrical performance of device 10I can be further optimized similarly to other devices described herein including, for example, device 10G.

Figure 10:
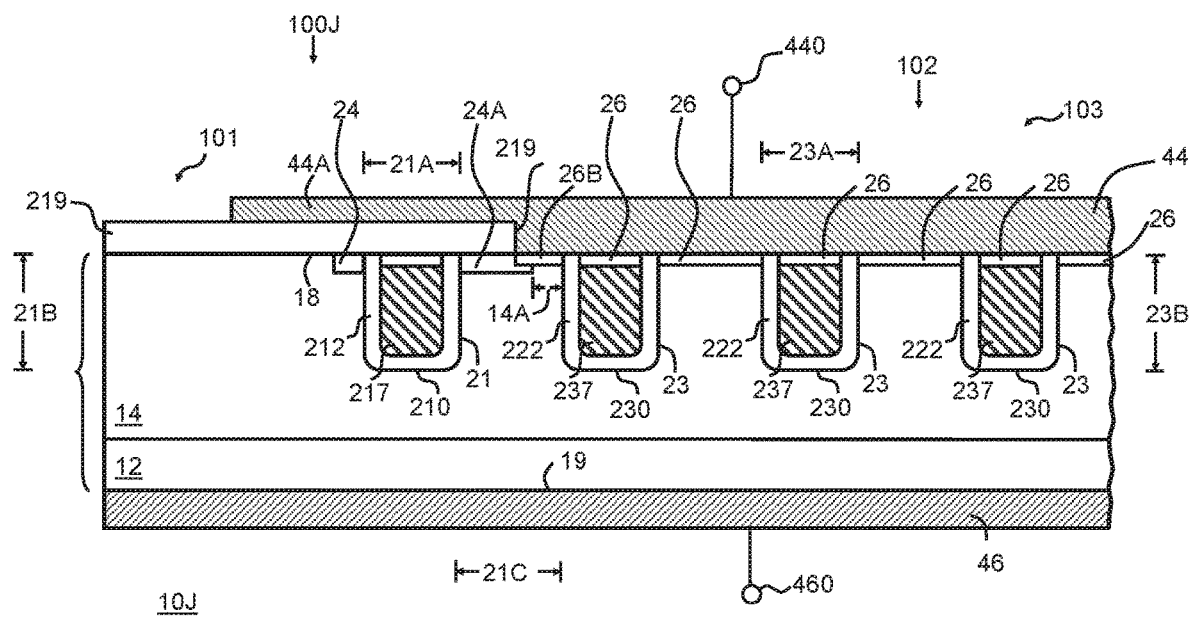

FIG. 10 illustrates a partial cross-sectional view of an electronic device 10J, semiconductor device 10J, Schottky diode device 10J, or trench Schottky rectifier 10J having a termination structure 100J or termination trench structures 100J in edge portion 101 of region of semiconductor material 11, and active structure 102 or active trench structures 102 in active portion 103 of region of semiconductor material 11 in accordance with the present description. Device 10J is similar to device 10A and only the differences will be described hereinafter. In device 10J, a single termination trench 21 is used with dielectric structure 212 and conductive material 217. In the present example, width 21A of termination trench 21 is substantially the same as width 23A of active trenches 23. In addition, depth 21B of termination trench 21 is substantially the same as depth 23B of active trenches 23.

Device 10J includes a doped region 24 disposed proximate to an outward facing or outer side of termination trench 21, and a doped region 24A disposed proximate to an inward facing side or inner side of termination trench 21 as generally illustrated in FIG. 10. In the present example, doped region 24A laterally extends across major surface 18 towards the outermost one of active trenches 23, but terminates within semiconductor layer 14 to leave a portion 14A of semiconductor layer 14 interposed between an edge of doped region 24A distal to termination trench 21. In the present example, doped region 24A laterally overlaps edge of 219A of dielectric layer 219. A portion 26B of conductive material 26 is disposed in a portion of doped region 24A and disposed in portion 14A of semiconductor layer 14 so that a Schottky barrier is formed at least within portion 14A. In the present example, termination structure 100J comprises termination trench 21 with dielectric structure 212 and conductive material 217, doped region 24, doped region 24A, and field plate portion 44A. In the present example, doped region 24A is configured as a guard ring structure for device 10J. In some examples, field plate portion 44A laterally extends to overlap doped region 24A, termination trench 21, and doped region 24. In device 10J, doped region 24 and conductive material 217 in termination trench 21 are electrically floating and doped region 24A is electrically connected to conductive layer 44.

In alternative examples, depth 21B of termination trench 21 can be greater than or less than depth 23B of active trenches 23. The electrical performance of device 10H can be further optimized similarly to other devices described herein including, for example, device 10A. In addition, spacing 21C between termination trench 21 and the outermost one of active trenches 23 can be varied, the thickness and width of dielectric layer 219 (i.e., the placement of edge 219A proximate to major surface 18), the lateral overlap distance of field plate portion 44A, and/or the widths and/or depths of doped regions 24 and 24A can be varied to optimize the electrical performance of device 10J.

Figure 11:
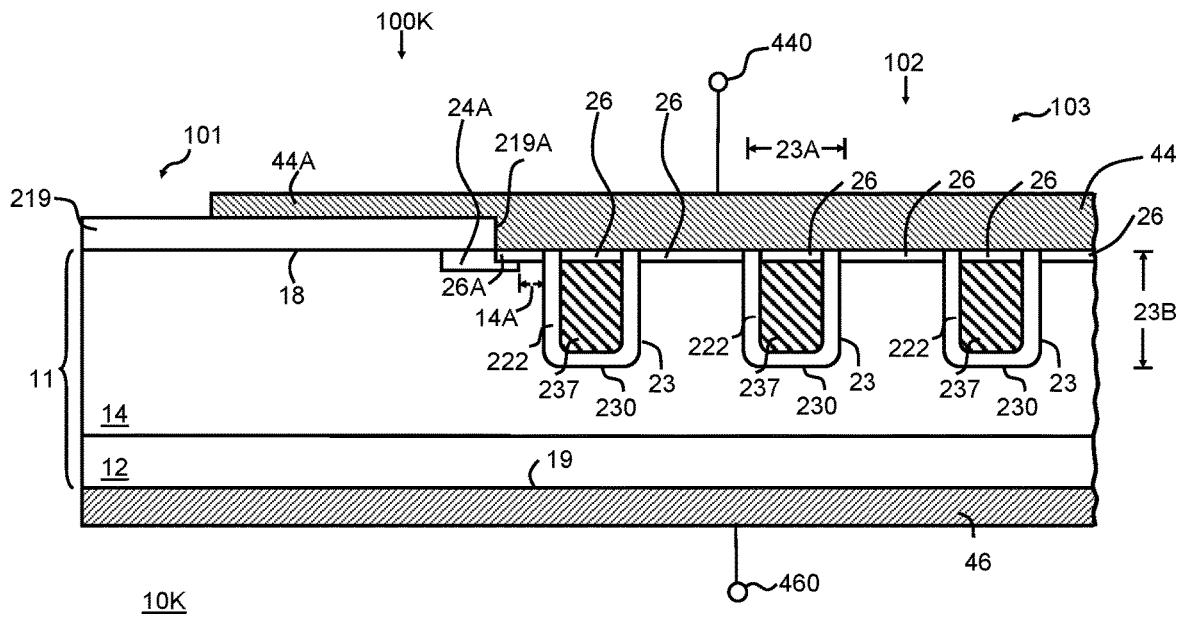

FIG. 11 illustrates a partial cross-sectional view of an electronic device 10K, semiconductor device 10K, Schottky diode device 10K, or trench Schottky rectifier 10K having a termination structure 100K or termination trench structures 100K in edge portion 101 of region of semiconductor material 11, and active structure 102 or active trench structures 102 in active portion 103 of region of semiconductor material 11 in accordance with the present description. Device 10K is similar to device 10J and only the differences will be described hereinafter. In device 10K, the single termination trench 21 is excluded such that the termination structure 100K comprises doped region 24A, dielectric layer 219, and field plate portion 44A. In device 10K, the thickness and width of dielectric layer 219 (i.e., the placement of edge 219A), the width and/or depth of doped region 24A, the dopant concentration of doped region 24A, the spacing between an inner edge of doped region 24A and the outermost one of active trenches 23, and/or the laterally overlap distance of field plate portion 44A can be varied to optimize the electrical characteristics of device 10K. In some examples, termination structure 100K is suitable for lower voltage devices.

Figure 12:
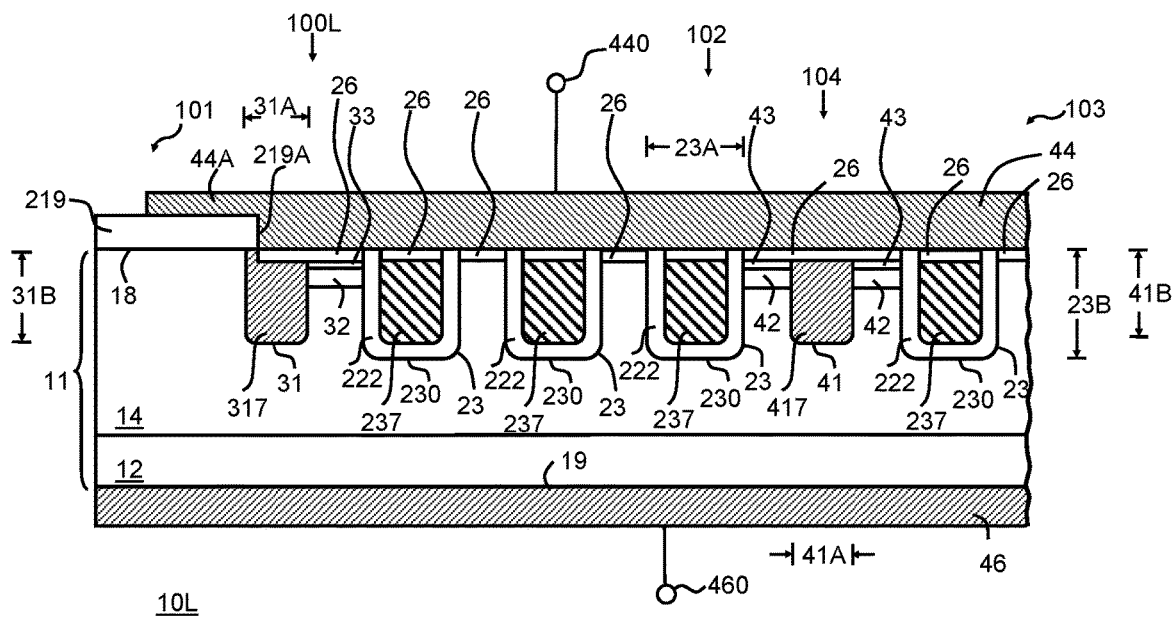

FIG. 12 illustrates a partial cross-sectional view of an electronic device 10L, semiconductor device 10L, Schottky diode device 10L, or trench Schottky rectifier 10L having a termination structure 100L or termination trench structures 100L in edge portion 101 of region of semiconductor material 11, and active structure 102 or active trench structures 102 in active portion 103 of region of semiconductor material 11 in accordance with the present description. Device 10L is similar to device 10A and only the differences will be described hereinafter. In device 10L, termination structure 100L comprises a termination trench 31 that extends inward from major surface 18 into region of semiconductor material 11 to a depth 31B. A conductive material 317 is disposed within trench 31 and can comprise materials similar to conductive material 217 described previously. In the present example, conductive material 317 comprises a P-type semiconductor material, such as P-type polysilicon. In some examples, conductive material 317 has a dopant concentration that is the same or less than the dopant concentration of conductive material 237. One difference in device 10L is that termination structure 100L does not include a dielectric structure within termination trench 31. In this configuration, conductive material 317 directly physically contacts region of semiconductor material 11 (e.g., semiconductor layer 14) along surfaces of termination trench 31. That is, dielectric structure 212 is excluded. In this configuration, conductive material 317 forms a PN junction with region of semiconductor material 11 (e.g., semiconductor layer 14), and provides a trench guard ring structure. In some examples, termination trench 31 completely laterally surrounds active portion 103.

In some examples, termination trench 31 has a width 31A that is less than or equal to width 23A of active trenches 23. In other examples, width 31A can be greater than width 23A. In some examples, termination trench 31 has a depth 31B that is less than or equal to depth 23B of active trenches 23. In other examples, depth 31B can be greater than depth 23B.

In the present example, termination structure 100L can further comprise a doped region 32 that is the same conductivity type as conductive material 317 (e.g., P-type) and a doped region 33 that has the opposite conductivity type to doped region 32 (e.g., N-type). In the present example, doped region 32 extends from major surface 18 into region of semiconductor material 11 (e.g., semiconductor layer 14) and doped region 33 extends from major surface 18 into a portion of doped region 32. Stated a different way, doped region 32 extends to greater depth into region of semiconductor material 11 (e.g., semiconductor layer 14) than doped region 33 does. In the present example, both doped region 32 and doped region 33 laterally extend completely from an inward facing side surface of termination trench 31 to an outward facing side surface of an outermost one of active trenches 23 as generally illustrated in FIG. 12.

In the present example, conductive material 26 is disposed in at least a portion of conductive material 317, and conductive material 317 is electrically connected to conductive layer 44. That is, in the present example termination trench 31 is not electrically floating. In this example, dielectric layer 219 then extends to only partially overlap conductive material 317 proximate to major surface 18. That is, edge 219A of dielectric layer 219 terminates adjoining conductive material 317. Termination structure 100L further comprises field plate portion 44A, which laterally extends to overlap termination trench 31 as generally illustrated in FIG. 12. The spacing between termination trench 31 and the outermost one of active trenches 23 can be varied to further optimize the electrical performance of device 10L.

Device 10L further comprises an electro-static discharge (ESD) protection structure 104 disposed in active portion 103. In the present example, ESD protection structure 104 comprises a trench 41 extending from major surface 18 into region of semiconductor material 11 (e.g., semiconductor layer 14) and laterally disposed between a pair of active trenches 23. Similarly to termination structure 100L, ESD structure 104 includes a conductive material 417 disposed within trench 41. In the present example, conductive material 417 comprises a P-type semiconductor material, such as P-type polysilicon. In some examples, conductive material 417 has a dopant concentration that is the same or less than the dopant concentration of conductive material 237. In the present example, conductive material 417 directly physically contacts region of semiconductor material 11 (e.g., semiconductor layer 14) along surfaces of trench 41. In this configuration, conductive material 417 forms a PN junction with region of semiconductor material 11 (e.g., semiconductor layer 14). In addition, termination trench 31 with conductive material 317 can provide EDS protection for device 10L.

In some examples, trench 41 has a width 41A that is less than or equal to width 23A of active trenches 23. In other examples, width 41A can be greater than width 23A. In some examples, trench 41 has a depth 41B that is less than or equal to depth 23B of active trenches 23. In other examples, depth 41B can be greater than depth 23B. In some examples, depth 41B is similar to depth 31B.

ESD structure 104 further comprises doped regions 42 that are the same conductivity type as conductive material 417 (e.g., P-type), and doped regions 43 that have the opposite conductivity type to doped regions 42 (e.g., N-type). Doped regions 42 extend from major surface 18 into region of semiconductor material 11 (e.g., semiconductor layer 14), and doped region 43 extend from major surface 18 into doped region 42. Stated a different way, doped regions 42 extends to greater depth into region of semiconductor material 11 (e.g., semiconductor layer 14) than doped regions 43 does. In the present example, a first one of doped regions 42 and a first one of doped regions 43 extend completely from an inward facing side surface of a first active trench 23 to an outward facing side surface of trench 41, and a second one of doped regions 42 and a second one of doped region 43 extend completely from an outward facing side surface of a second active trench 23 to an inward facing side surface of trench 41 as generally illustrated in FIG. 12. In the present example, a portion of conductive material 26 is provide in surfaces of doped regions 43 and conductive material 417.

In the present example, termination structure 100L is configured to improve the electrical performance of device 10L and ESD structure 104 is configured to improve the robustness of device 10L under an ESD event. In the present example, the electrical performance of device 10L can be further optimized using, for example, the depth and width of termination trench 31, the dopant concentration of conductive material 317, the dopant concentrations of doped regions 32 and 33, the spacing between termination trench 31 and the outermost one of active trenches 23, thickness of dielectric layer 219, and/or the lateral overlap distance of field plate portion 44A.

Figure 13:
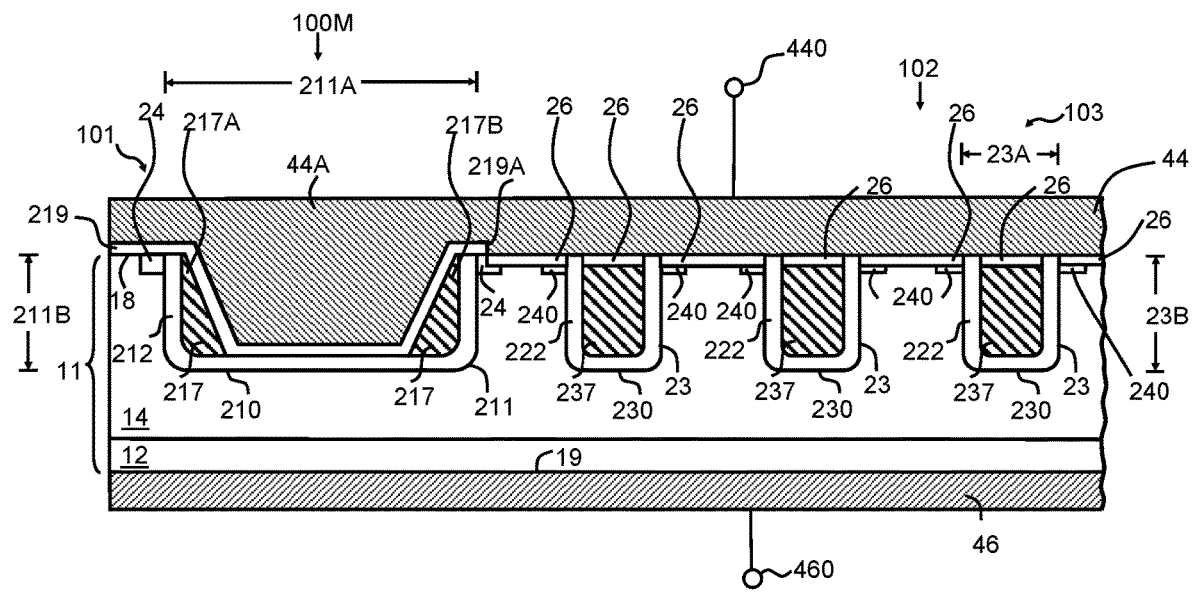

FIG. 13 illustrates a partial cross-sectional view of an electronic device 10M, semiconductor device 10M, Schottky diode device 10M, or trench Schottky rectifier 10M having a termination structure 100M or termination trench structure 100M in edge portion 101 of region of semiconductor material 11, and active structure 102 or active trench structures 102 in active portion 103 of region of semiconductor material 11 in accordance with the present description. Device 10M is similar to device 10A and only the differences will be described hereinafter. In device 10M, termination structure 100M comprises at least one termination trench 211 having width 211A that is wider than width 23A of active trenches 23. In the present example, termination trench 211 can have depth 211B that is substantially equal to depth 23B of active trenches 23. As will be described later, the number of termination trenches 211 can be increased, and the widths, depths, and spacing of termination trench 211 can be varied to optimize the electrical performance of device 10M. In the present example, termination trench 211 does not extend all the way to the outer periphery or edge of device 10M such that a portion of region of semiconductor material 11 is interposed between the edge of device 10M and the outermost side surface or outward facing side surface of termination trench 211 after device 10M is singulated from, for example, a semiconductor wafer.

In the present example, conductive material 217 does not fill termination trench 211 as in previous examples using termination trenches 21. Instead, conductive material 217 is provided as conductive spacer structures 217A and 217B disposed on opposite sidewall surfaces of termination trench 211. In some examples, conductive material 217 can be P-type conductivity and conductive material 237 can be N-type conductivity. In addition, conductive material 217 can have a lower dopant concentration than the dopant concentration of conductive material 237. In other examples, conductive material 217 and conductive material 237 can have the same conductivity type and/or can have similar dopant concentrations.

In device 10M, dielectric layer 219 laterally extends along a portion of major surface 18 at an outer edge of device 10M and extends into termination trench 211 to overlie conductive material 217 within termination trench 21 and dielectric structure 212. That is, in the present example, dielectric layer 219 completely electrically isolates conductive material 217 (i.e., the conductive spacer structures 217A and 217B) from conductive layer 44. In addition, in the present example dielectric layer 219 and dielectric structure 212 electrically isolate conductive layer 44 disposed within termination trench 211 from region of semiconductor material 11 (e.g., semiconductor layer 14). Device 10M is different than related devices in that both conductive spacer structures 217A and 217B are electrically floating.

Conductive layer 44 can be disposed within termination trench 211 so as to line dielectric layer 219 (i.e., conductive layer 44 can follow the contour or profile of dielectric layer 219 in cross-sectional view), or conductive layer 44 can be disposed to completely fill termination trench 211 as generally illustrated in FIG. 13. Termination structure 100M can further comprise field plate structure 44A and one or more doped regions 24 disposed proximate to upper side surfaces of termination trench 211 and proximate to major surface 18. In addition, device 10M can further comprise one or more doped regions 240 disposed proximate to upper side surfaces of one or more active trenches and proximate to major surface 18. In some examples, field plate portion 44A laterally extends beyond the outermost side surface of termination trench 211 and overlaps (at least in part) the doped region 24 disposed proximate to the outer edge of device 10M. In the present example, edge 219A of dielectric layer 219 terminates so as to only partially overlap doped region 24 disposed on the inward facing side surface of termination trench 211. In this example, conductive material 26 is disposed within doped region 24 proximate to edge 219A as generally illustrated in FIG. 13. In some examples, doped regions 24 and/or doped regions 240 are excluded.

In the present example, the electrical performance of device 10M can be further optimized using, for example, the depth and width of termination trench 211, the widths and depths of doped regions 24 and 240, the dopant concentration of doped regions 24 and 240, the spacing between termination trench 211 and the outermost one of active trenches 23, the thickness of dielectric structure 212, the thickness of dielectric layer 219, and/or the lateral overlap distance of field plate portion 44A.

Figure 14:
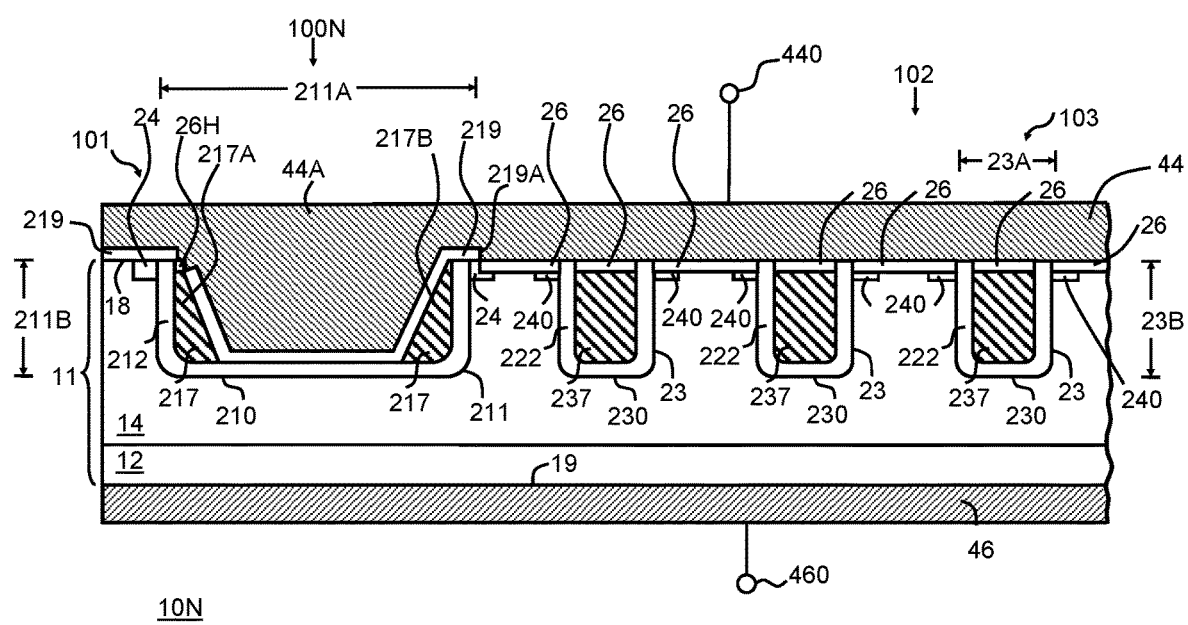

FIG. 14 illustrates a partial cross-sectional view of an electronic device 10N, semiconductor device 10N, Schottky diode device 10N, or trench Schottky rectifier 10N having a termination structure 100N or termination trench structure 100N in edge portion 101 of region of semiconductor material 11, and active structure 102 or active trench structures 102 in active portion 103 of region of semiconductor material 11 in accordance with the present description. Device 10N is similar to device 10M and only the differences will be described hereinafter. In device 10N, an opening is provided within dielectric layer 219 proximate to the outermost conductive spacer structure 217A, and a portion 26H of conductive material 26 is disposed within the opening thereby contacting conductive material 217 in the outermost conductive spacer structure 217A. In this configuration, conductive spacer structure 217A is electrically connected to conductive layer 44. In device 10N, the innermost conductive spacer structure 217B is electrically floating. The electrical performance of device 10N can be further optimized similarly to other devices described herein including, for example, device 10M. In addition, the dopant concentration and conductivity type of conductive spacer structure 217A can be varied. Device 10N is different than related devices in that conductive spacer 217B (i.e., the spacer adjoining the innermost side surface of termination trench 211) is electrically floating.

Figure 15:
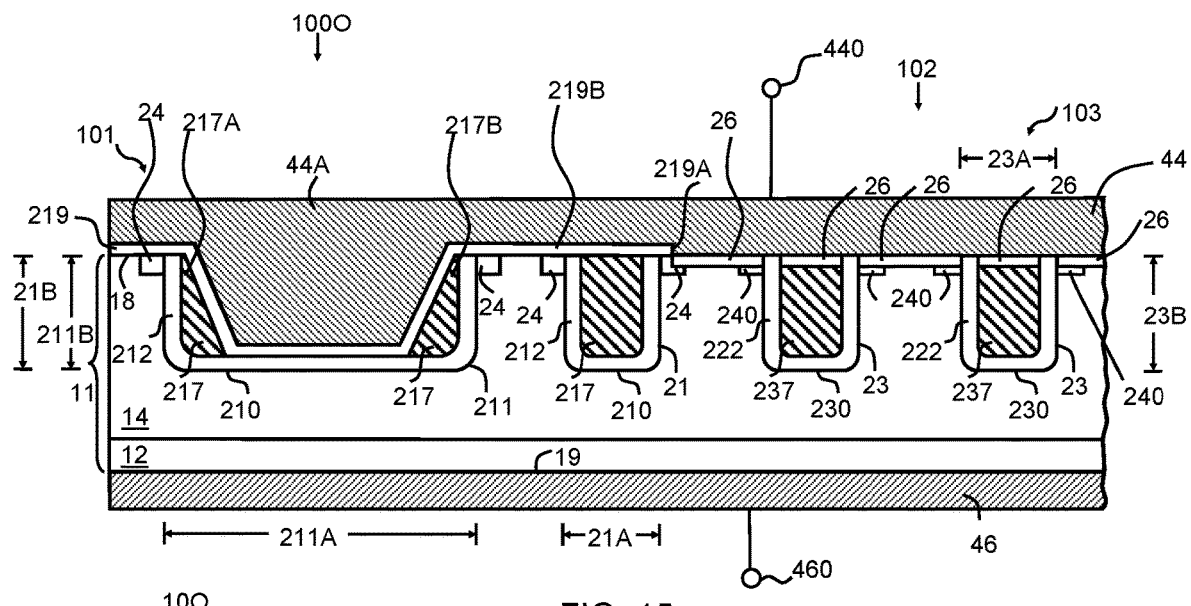

FIG. 15 illustrates a partial cross-sectional view of an electronic device 10O, semiconductor device 10O, Schottky diode device 10O, or trench Schottky rectifier 10O having a termination structure 100O or termination trench structures 100O in edge portion 101 of region of semiconductor material 11, and active structure 102 or active trench structures 102 in active portion 103 of region of semiconductor material 11 in accordance with the present description. Device 10O is similar to device 10M and only the differences will be described hereinafter. In device 10O, termination trench structure 100O comprises termination trench 211 and at least one termination trench 21, which is disposed laterally inward and spaced apart from termination trench 211 towards active region 103. In the present example, termination trench 21 has width 21A that is similar to or equal to width 23A of active trenches 23, and that is less than width 211A of termination trench 211. In some examples, termination trench 21 has a depth 21B and termination trench 211 has a depth 211B that are similar to or equal to depth 23B of active trenches 23. In other examples, one or more of depths 21B, 23B, and 211B can be different.

In the present example, termination structure 100O further comprises dielectric layer 219, which is provided with a portion 219B that is continuous and laterally extends to completely overlap termination trench 21. In this configuration, conductive material 217 in termination trench 21 is electrically floating. In the present example, edge 219A of dielectric layer 219 terminates so as to only partially overlap the doped region 24 disposed on the inward facing side surface of termination trench 21. In this example, conductive material 26 is disposed within doped region 24 proximate to edge 219A as generally illustrated in FIG. 14. Device 10O can further comprise additional doped regions 24 and/or doped regions 240. The electrical performance of device 10O can be further optimized in a similar manner as other devices described herein including, for example, to device 10M. In addition, the spacing between termination trench 211 and termination trench 21 can be varied as well as the depths of termination trenches 21 and 211. In other examples, the wide termination trench portion of termination structures 100V, 100W, or 100X described in FIGS. 27, 28, and 29 can be used as the wide trench termination structure portion of termination structure 100O in device 10O. That is, opening 234, doped region 242, and conductive material 26 can be used with termination trench 211 in termination structure 100O.

Figure 16:
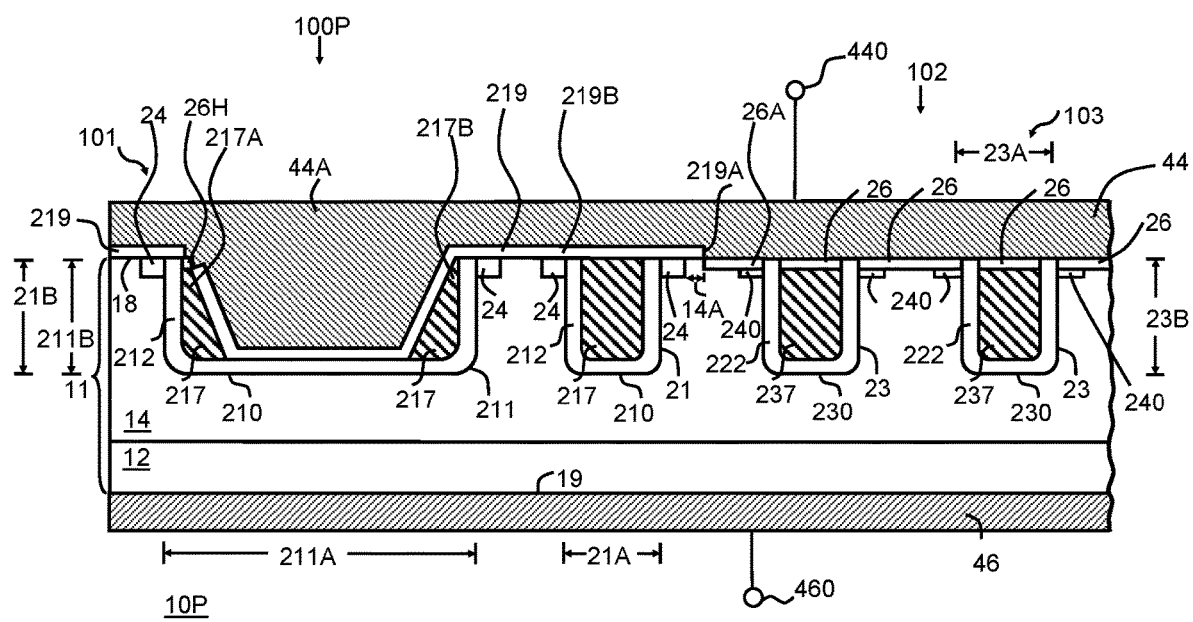

FIG. 16 illustrates a partial cross-sectional view of an electronic device 10P, semiconductor device 10P, Schottky diode device 10P, or trench Schottky rectifier 10P having a termination structure 100P or termination trench structures 100P in edge portion 101 of region of semiconductor material 11, and active structure 102 or active trench structures 102 in active portion 103 of region of semiconductor material 11 in accordance with the present description. Device 10P is similar to devices 10N and 10O and only the differences will be described herein. More particularly, termination structure 100P comprises termination trenches 211 and 21 similarly to device 10O, and a portion 26H of conductive material is provided within an opening in dielectric layer 219 proximate to conductive spacer structure 217A such that conductive spacer structure 217A is electrically connected to conductive layer 44 similarly to device 10N. In the present example, portion 219B extends further inward towards active portion 103 and completely overlaps termination trench 21 and the innermost one of doped regions 24.

In this configuration, portion 14A of semiconductor layer 14 is laterally interposed between portion 26A of conductive material 26 and the innermost one of doped regions 24 as illustrated in FIG. 16. The electrical performance of device 10P can be further optimized similarly to other devices described herein including, for example, devices 10O and 10N. In other examples, the wide termination trench portion of termination structures 100V, 100W, or 100X described in FIGS. 27, 28, and 29 can be used as the wide trench termination structure portion of termination structure 100P in device 10P. That is, opening 234, doped region 242, and conductive material 26 can be used with termination trench 211 in termination structure 100P.

Figure 17:
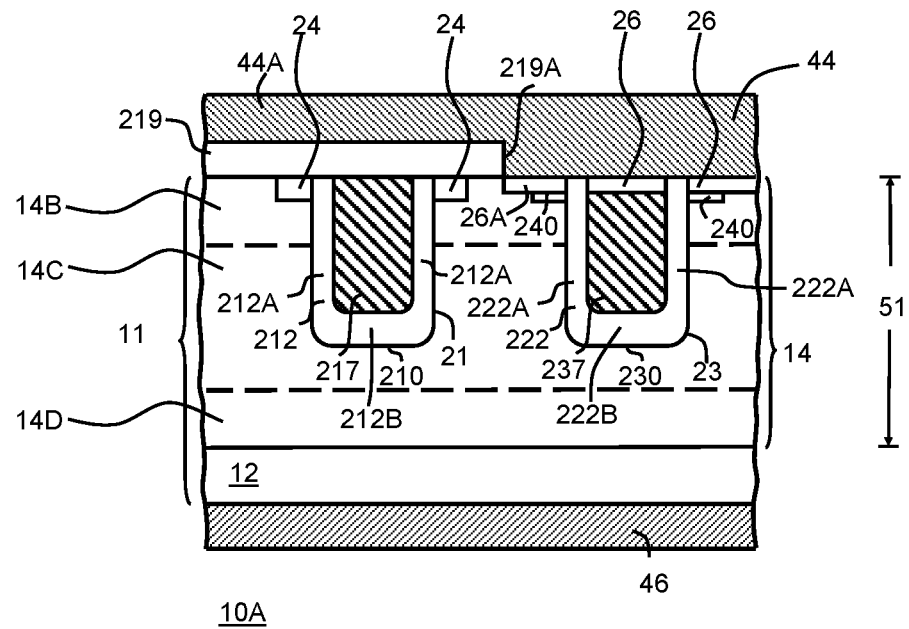
FIGS. 17 and 18 illustrate partial cross-sectional views of a semiconductor device in accordance with the present description.

FIG. 17 illustrates a partial cross-sectional view of device 10A in accordance with other examples. It is understood that the examples of FIG. 17 can be used with any of the examples described herein. In previous examples, semiconductor layer 14 has a substantially uniform dopant profile along or over its thickness. In the present example, semiconductor layer 14 has a non-uniform dopant profile along or over thickness 51. In the present example, semiconductor layer 14 can have a graded dopant profile where the dopant concentration can decrease from major surface 18 over thickness 51 towards substrate 12. In one example, semiconductor layer 14 comprises a first portion 14B having a first dopant concentration, a second portion 14C having a second dopant concentration less than the first dopant concentration, and a third portion 14D having a third dopant concentration less than the second dopant concentration. It is understood that semiconductor layer 14 can comprises additional portions.

The example of FIG. 17 further illustrates alternative examples of dielectric structure 212 and dielectric structure 222. In the present example, dielectric structure 212 is provided with portions 212A disposed along sidewall surfaces of termination trench 21 and a portion 212B disposed along a lower surface of termination trench 21. In addition, dielectric structure 222 is provided with portions 222A disposed along sidewall surfaces of active trench 23 and a portion 222B is disposed along a lower surface of active trench 23. In the present example, portions 212A have a thickness that is less than the thickness of portion 212B, and portions 222A have a thickness that is less than the thickness of portion 222B. In some examples, portions 212A and portions 222A have a thickness in a range from about 100 Angstroms through about 15,000 Angstroms. In some examples, portion 212B and portion 222B have a thickness in a range from about 100 Angstroms through about 15,000 Angstroms.

Figure 18:
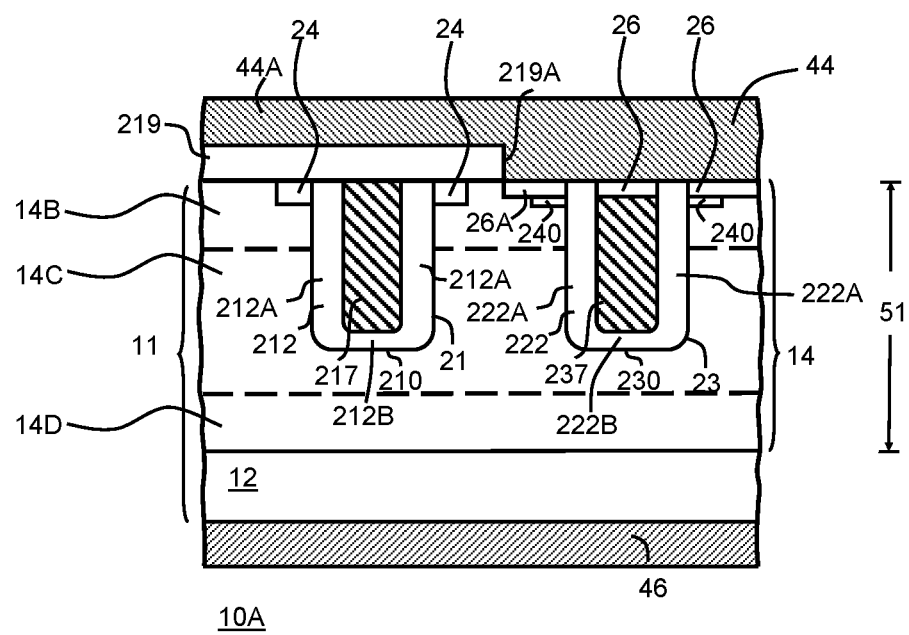

FIG. 18 illustrates a partial cross-sectional view of device 10A in accordance with further examples. It is understood that the examples of FIG. 18 can be used with any of the examples described herein. The example of FIG. 18 is similar to the example of FIG. 17 and only the differences will be described hereinafter. In the present example, the dopant concentration of semiconductor layer 14 is non-uniform and increases over thickness 51 from major surface 18 towards substrate 12. For example, portion 14B has a first dopant concentration, portion 14C has a second dopant concentration greater than the first dopant concentration, and portion 14D has third dopant concentration greater than the second dopant concentration. It is understood that semiconductor layer 14 can have additional portions.

In other examples, the second dopant concentration can be greater than both the first dopant concentration and the third dopant concentration and the first dopant concentration can be the same as, less than, or greater than the third dopant concentration.

In the example of FIG. 18, portions 212A of dielectric structure 212 have a thickness that is greater than the thickness of portion 212B, and portions 222A of dielectric structure 222 have a thickness that is greater than the thickness of portion 222B. In some examples, portions 212A and portions 222A have a thickness in a range from about 100 Angstroms through about 15,000 Angstroms. In some examples, portion 212B and portion 222B have a thickness in a range from about 100 Angstroms through about 15,000 Angstroms. The variable thicknesses of dielectric structures 212 and 222 and/or the dopant profile of semiconductor layer 14 as illustrated in FIGS. 17 and 18 provide additional variables in optimizing the electrical performance of the devices described herein. In other examples, the configuration of dielectric structure 212 of FIG. 17 can be combined with the configuration of dielectric structure 222 of FIG. 18. In further examples, the configuration of dielectric structure 222 of FIG. 17 can be combined with the configuration of dielectric structure 212 of FIG. 18.

Figure 19:
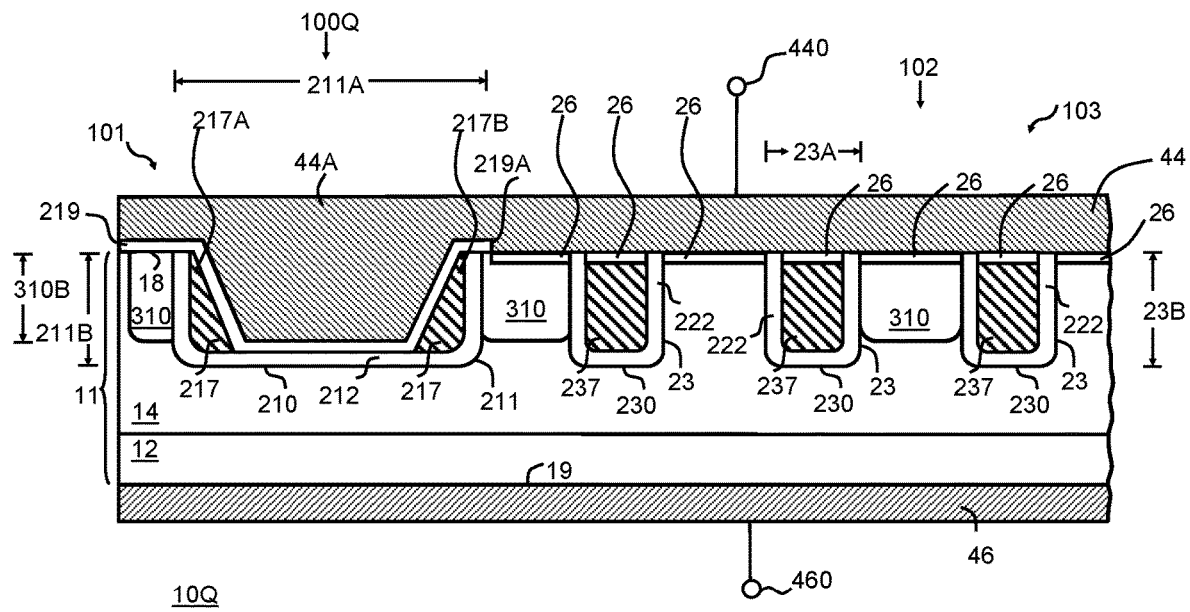
FIGS. 19-22 illustrate partial cross-sectional views of a semiconductor device with a termination structure in accordance with the present description.

FIG. 19 illustrates a partial cross-sectional view of an electronic device 10Q, semiconductor device 10Q, Schottky diode device 10Q, or trench Schottky rectifier 10Q having a termination structure 100Q or termination trench structures 100Q in edge portion 101 of region of semiconductor material 11, and active structure 102 or active trench structures 102 in active portion 103 of region of semiconductor material 11 in accordance with the present description. Device 10Q is similar to device 10M and only the differences will be described hereinafter. In the present example, device 10Q further comprises one or more doped regions 310, which can be either N-type or P-type conductivity provided adjacent major surface 18 within active region 103 and adjacent Schottky contact regions 26. In some examples one of doped regions 310 is disposed within edge portion 101 adjacent to an outward facing side surface of termination trench 211 as generally illustrated in FIG. 19. In one example, doped regions 310 can be configured to provide clamping action in reverse bias to improve the dynamic robustness of any of the devices described herein including device 10Q. In other examples, doped region 310 can extend laterally across semiconductor layer 14 adjacent major surface 18 and can be configured to adjust barrier height for device 10Q. Doped regions 310 extend from major surface 18 into region of semiconductor material 11 (or semiconductor layer 14) to a depth 310B. In the present example, depth 310B is less than both depths 211B and 23B. In other examples, depth 310B can be greater than both depths 211B and 23B. In further examples, depth 310B can be greater than 211B and less than 23B.

Doped regions 310 can be provided using ion implantation and anneal techniques, epitaxial growth techniques, or other doping techniques as known to those skilled in the art. In one example, doped regions 310 can extend into region of semiconductor material 11 to below the bottom surfaces of active trenches 23 when doped regions 310 are used for ESD protection, dynamic clamping, or conduction tuning. In other examples, doped regions 310 can be provided in only some mesa regions and not in others to provide different Schottky barrier heights between active trenches 23. When doped regions 310 are used for barrier height adjustment, doped regions 310 typically have a depth 310B less than approximately 1.0 micron.

In some examples, device 10Q may include a deeper doped region (not illustrated) provided below doped regions 310 to provide for conduction tuning of the device. This may also be done by providing, for example, a graded dopant profile within semiconductor layer 14 by using graded epitaxial growth techniques or by using multiple ion implants. The electrical performance of device 10Q can be further optimized similarly to other devices described herein including, for example, device 10M. In addition, the dopant concentration and depth of doped region(s) 310 can be varied.

Figure 20:
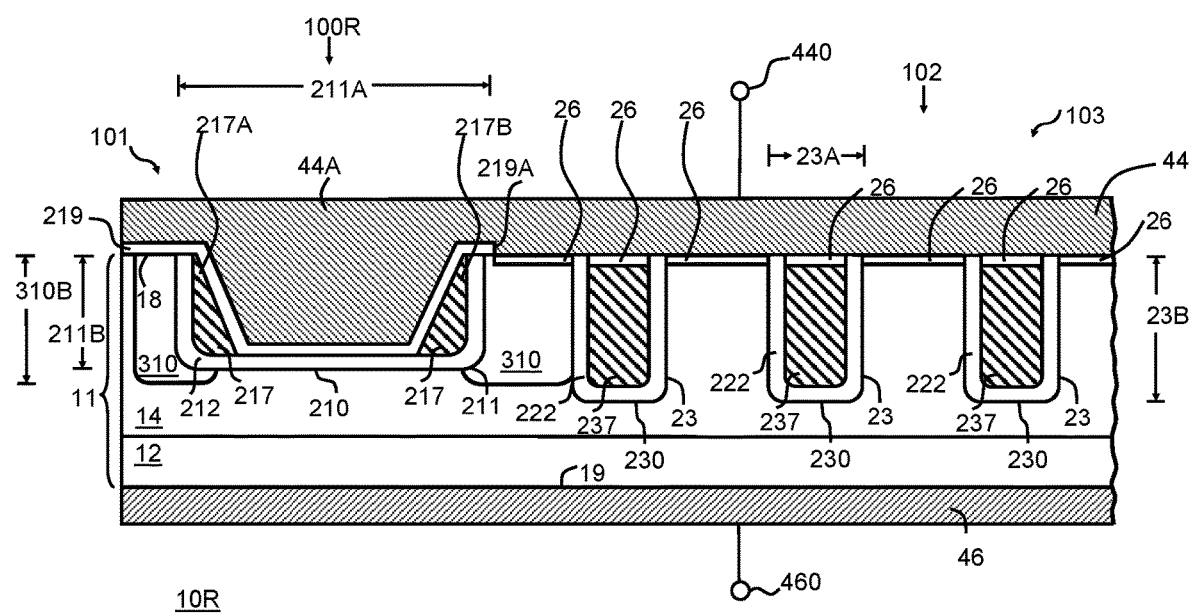

FIG. 20 illustrates a partial cross-sectional view of an electronic device 10R, semiconductor device 10R, Schottky diode device 10R, or trench Schottky rectifier 10R having a termination structure 100R or termination trench structures 100R in edge portion 101 of region of semiconductor material 11, and active structure 102 or active trench structures 102 in active portion 103 of region of semiconductor material 11 in accordance with the present description. Device 10R is similar to device 10Q and only the differences will be described hereinafter. In the present example, depth 23B of one or more active trenches 23 is greater than depth 211B of termination trench 211. In addition, depth 310B of doped regions 310 is greater than depth 211B and less than depth 23B. In this configuration of active trenches 23 and termination trench 211, it is understood that depth 310B of doped regions 310 can be less than or equal to either of depths 211B or 23B or greater than one or more of depths 211B and 23B. The electrical performance of device 10R can be further optimized similarly to other devices described herein, including, for example, devices 10M and 10Q.

Figure 21:
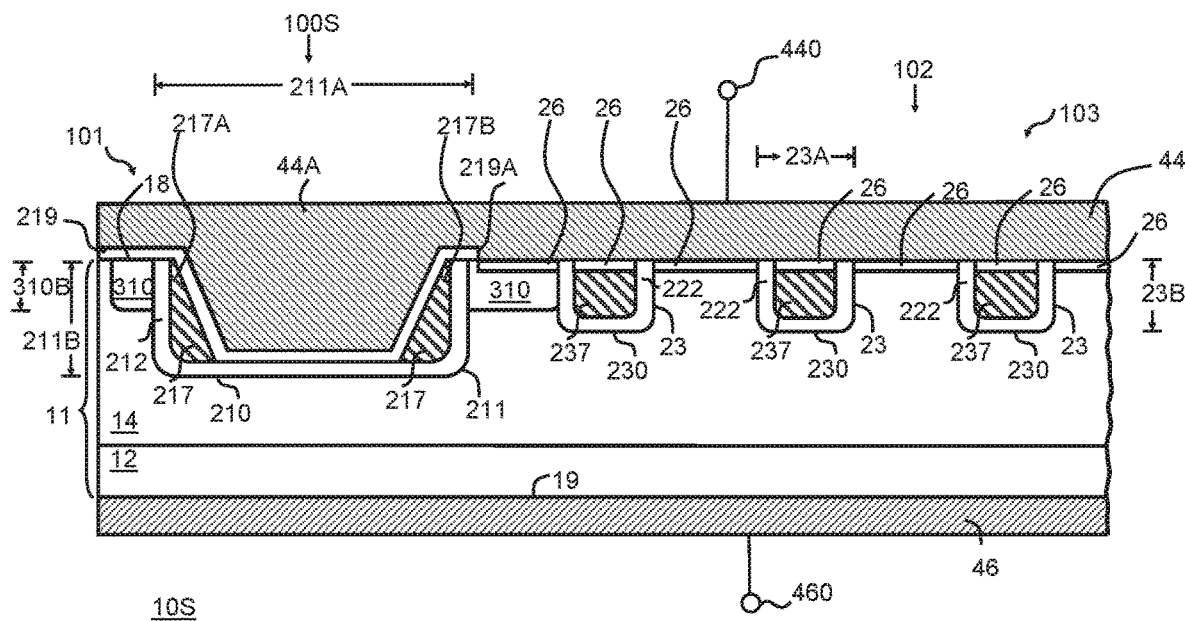

FIG. 21 illustrates a partial cross-sectional view of an electronic device 10S, semiconductor device 10S, Schottky diode device 10S, or trench Schottky rectifier 10S having a termination structure 100S or termination trench structures 100S in edge portion 101 of region of semiconductor material 11, and active structure 102 or active trench structures 102 in active portion 103 of region of semiconductor material 11 in accordance with the present description. Device 10S is similar to devices 10Q and 10R and only the differences will be described hereinafter. In the present example, depth 23B of one or more active trenches 23 is less than depth 211B of termination trench 211. Depth 310B of doped regions 310 is less than depth 211B and less than depth 23B. In this configuration of active trenches 23 and termination trench 211, it is understood that depth 310B of doped regions 310 can be less than or equal to either of depths 211B or 23B or greater than one or more of depths 211B and 23B. The electrical performance of device 10S can be further optimized similarly to other devices described herein, including, for example, devices 10M and 10Q.

Figure 22:
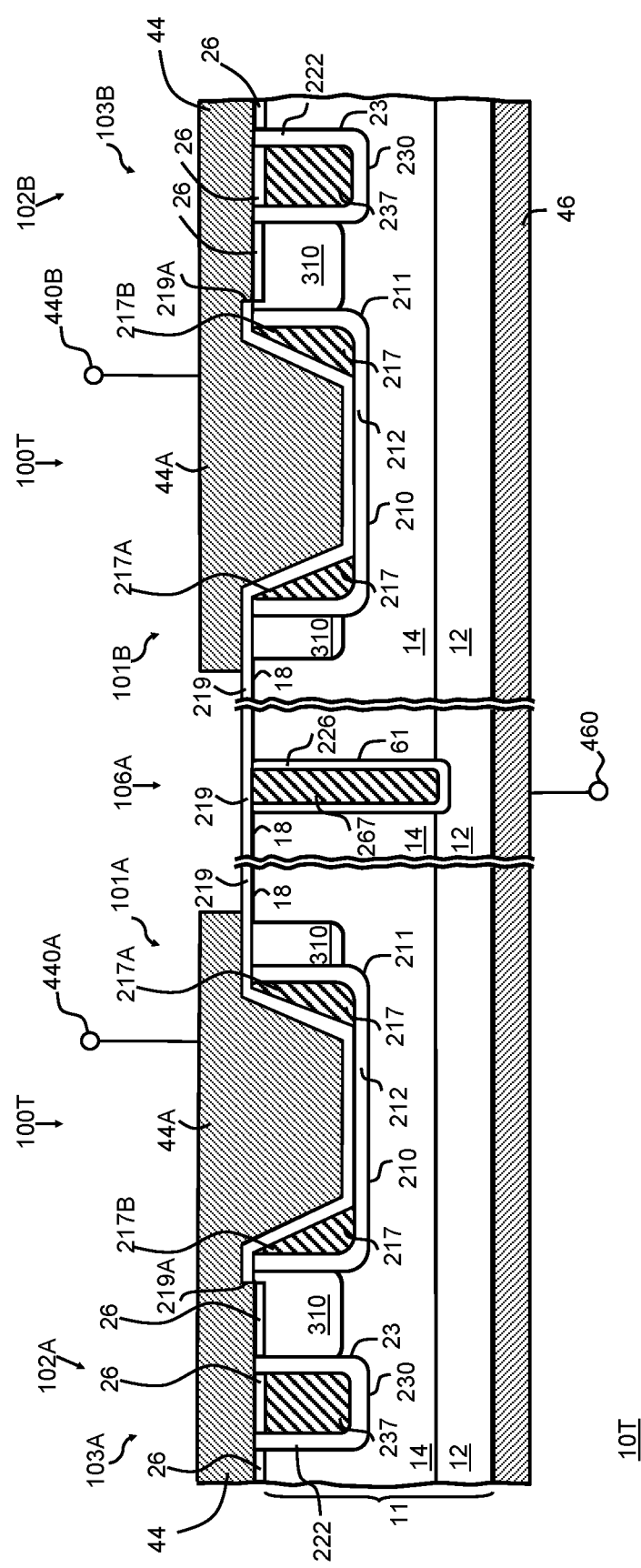

FIG. 22 illustrates a partial cross-sectional view of an electronic device 10T, semiconductor device 10T, Schottky diode device 10T, or trench Schottky rectifier 10T in accordance with the present description. Device 10T is similar to device 10M and only the differences will be described hereinafter. Device 10T is configured as multiple-die device, such as a dual-die device, and has termination structures 100T or termination trench structures 100T in edge portions 101A and 101B, and active structures 102A and 102B in active portions 103A and 103B. In the present example, termination structures 100T and active structures 102A and 102B are similar to those of device 10M. It is understood that any of the examples described herein can be used in the present example as well. In the present example, device 10T is configured having a common cathode electrode 460 and anode electrodes 440A and 440B that are configured for independent electrical biasing.

Device 10T further comprises one or more isolation structures 106A disposed so as to electrically separate edge portions 101A and 101B thereby at least partially electrically isolating active structures 102A and 102B. In some examples, isolation structure 106A is disposed substantially centrally located between edge portions 101A and 101B. In some examples, isolation structure 106A comprises a trench 61 disposed so as to generally vertically extend from major surface 18 of region of semiconductor material 11 into at least a portion of semiconductor layer 14. In some preferred examples, trench 61 extends into substrate 12. Isolation structure 106A further comprises a dielectric structure 226, such as a dielectric liner 226 that is disposed so as to cover surfaces of trench 61. In some examples, dielectric structure 226 comprises one or more dielectric materials, such as an oxide, a nitride, combinations thereof, or other dielectric materials as known to those skilled in the art. In some examples, dielectric structure 226 can be formed at the same time as dielectric structures 212 and 222. In other examples, dielectric structure 226 can fill trench 61. In other examples, a plurality (i.e., more than one) of isolation structure 106A can be used.

In the present example, a semiconductor material 267, such as a polycrystalline semiconductor material 267, is disposed adjacent to dielectric structure 226 within trench 61. In some examples, semiconductor material 267 is doped polysilicon, and can have P-type or N-type conductivity. In such examples, semiconductor material 267 can be formed at the same time as conductive material 217 or 237. In some examples, dielectric layer 219 is disposed so as to extend to overlie and completely overlap isolation structure 106A as generally illustrated in FIG. 22. In this example, semiconductor material 267 is electrically floating or decoupled from conductive layer 44. In the present example, isolation structure 106 is configured to reduce cross-talk or other unwanted electrical interference or interaction between active structures 102A and 102B thereby improving the electrical performance of device 10T.

Figure 23:
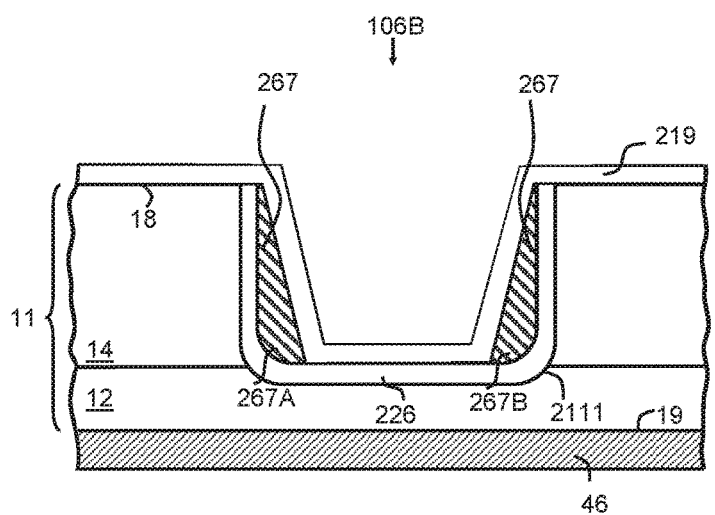
FIG. 23 illustrates a partial cross-sectional view of semiconductor device in accordance with the present description.

FIG. 23 illustrates a partial cross-sectional view of device 10T of FIG. 22 in accordance with the present description. In FIG. 23, a portion of device 10T is illustrated with another example of an isolation structure 106B and as alternative example to isolation structure 106A. Isolation structure 106B comprises a trench 2111 that is wider than trench 61 and is similar to trenches 211 in isolation structures 100T of FIG. 22. In this example, conductive material 267 is provided as a pair of spacers 267A and 267B and dielectric layer 219 is disposed within trench 2111 so as to cover and isolate spacers 267A and 267B. One advantage of isolation structure 106B is that is can be formed in a similar manner to termination structures 100T. In some examples, trench 2111 can be wider or narrower than trenches 211. It is understood that isolation structure 106B can be used with any of the examples described herein.

Figure 24:
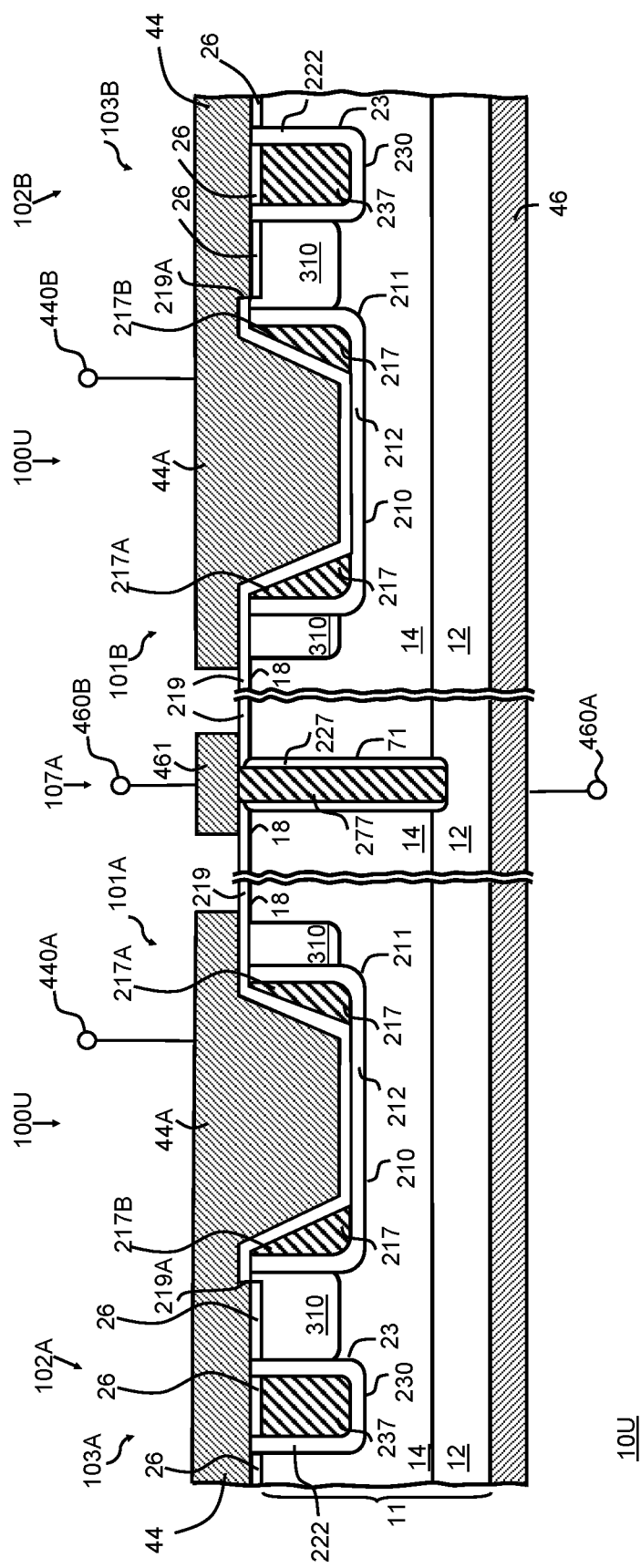
FIG. 24 illustrates a partial cross-sectional view of a semiconductor device with a termination structure in accordance with the present description.

FIG. 24 illustrates a partial cross-sectional view of an electronic device 10U, semiconductor device 10U, Schottky diode device 10U, or trench Schottky rectifier 10U in accordance with the present description. Device 10U is similar to devices 10M and 10T and only the differences will be described hereinafter. Device 10U is configured as multiple-die device, such as a dual-die device, and has termination structures 100U or termination trench structures 100U in edge portions 101A and 101B, and active structures 102A and 102B in active portions 103A and 103B. In the present example, termination structures 100U and active structures 102A and 102B are similar to those of devices 10M and 10T. It is understood that any of the device examples described herein can be used in the present example of FIG. 24 as well as with FIGS. 25 and 26. In the present example, device 10U is configured having a common cathode electrode 460A and having anode electrodes 440A and 440B that can be configured for independent electrical biasing.

Device 10U comprises one or more substrate contact structures 107A disposed extending from major surface 18 into region of semiconductor material 11. In the present example, substrate contact structure 107A is configured so as to provide electrical communication between substrate 12 and major surface 18. In this configuration, device 10U can be attached to a next level of assembly in a flip-chip configuration or in other configurations where electrical interconnects are desired on one surface of device 10U.

In the present example, substrate contact structure 107A comprises a trench 71 disposed so as to generally vertically extend from major surface 18 of region of semiconductor material 11 into at least a portion of substrate 12. In other examples, trench 71 can terminate within semiconductor layer 14. A dielectric structure 227 is disposed so as to adjoin or cover sidewall surfaces of trench 71, but not at least a portion of a lower surface of trench 71 so that a conductive material 277 disposed within trench 71 can make physical and electrical contact to region of semiconductor material 11 (e.g., substrate 12). In other examples, conductive material 26 can be provided with region of semiconductor 11 along the lower surface of trench 71.

In some examples, dielectric structure 227 comprises an oxide, a nitride, combinations thereof, or other dielectric materials known to those skilled in the art. In one example, dielectric structure 227 can comprise the same material as dielectric structures 212 or 222. In some examples, conductive material 277 comprises a material similar to conductive material 237, such as doped polysilicon (including P-type or N-type dopants). In other examples, conductive material 277 can comprise a metal material, such as tungsten or other conductive materials known to those skilled in the art. It is understood that barrier materials, such as titanium and/or titanium nitride can be used in combination with metal materials including tungsten. In some examples, a conductive layer 461 is provided overlying major surface 18 and in electronic communication with conductive material 277. Conductive layer 461 can also be referred to as a top-side cathode contact 461. In other examples, conductive material 277 can extend out of trench 71 and, for example, patterned to provide the top-side cathode contact for device 10U.

Figure 25:
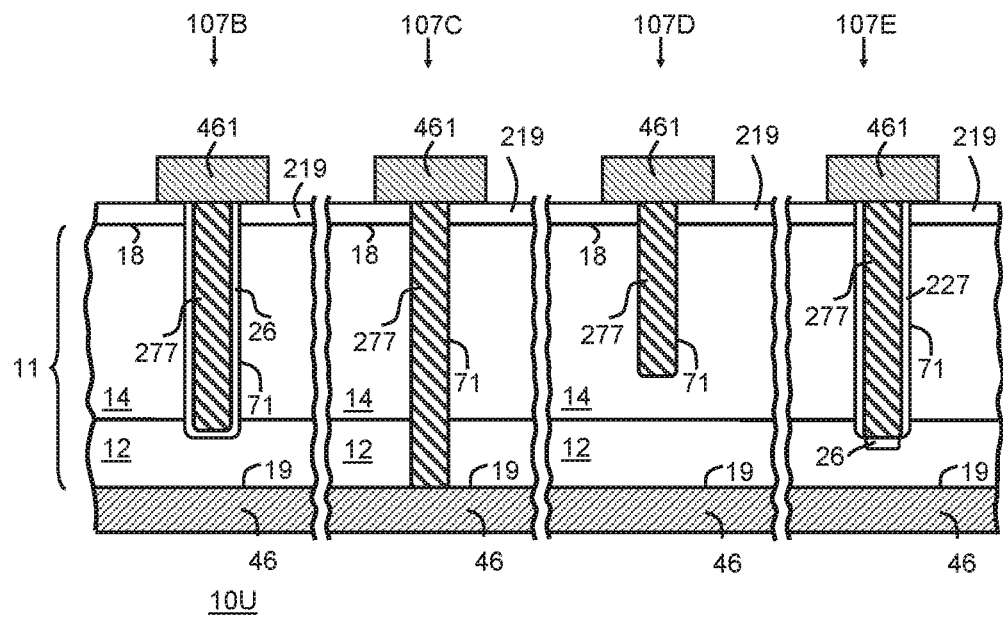
FIGS. 25 and 26 illustrate partial cross-sectional views of a semiconductor device in accordance with the present description.

FIG. 25 illustrates partial cross-sectional views of other examples of substrate contact structures 107B, 107C, 107D, and 107E that can be used as part of device 10U. In substrate contact structure 107B, dielectric structure 227 (as illustrated in FIG. 24 with substrate contact structure 107A) is not used, and conductive material 26 used to form the Schottky barriers in active structures 102A and 102B is provided along at least portions of the surfaces of trench 71. In this example, conductive material 277 makes electrical contact to both semiconductor layer 14 and substrate 12. In substrate contact structure 107C, trench 71 extends all the way through region of semiconductor material 11 in a through-semiconductor via configuration. Substrate contact structure 107C is illustrated without dielectric structure 227, but it is understood that dielectric structure 227 can be included along at least portions of the sidewall surface of trench 71. In substrate contact structure 107D, trench 71 terminates within semiconductor layer 14. Substrate contact structure 107D is illustrated without dielectric structure 227, but it is understood that dielectric structure 227 can be included along at least portions of the sidewall surfaces of trench 71. In other examples, a doped region (not illustrated) can be provided within a portion of semiconductor layer 14 proximate to trench 71 where conductive material 277 makes contact with semiconductor layer 14. In other examples, conductive material 26 (similarly to substrate contact structure 107B) can be used with or instead of the doped region. In substrate contract structure 107E, dielectric structure 227 is used along side surfaces of trench 71, but the lower surface of trench 71 is provided without dielectric structure 227 so that conductive material 277 makes contact with substrate 12. In this example, conductive material 26 can be provided adjoining the lower surface 71 to provide a Schottky barrier with substrate 12.

Figure 26:
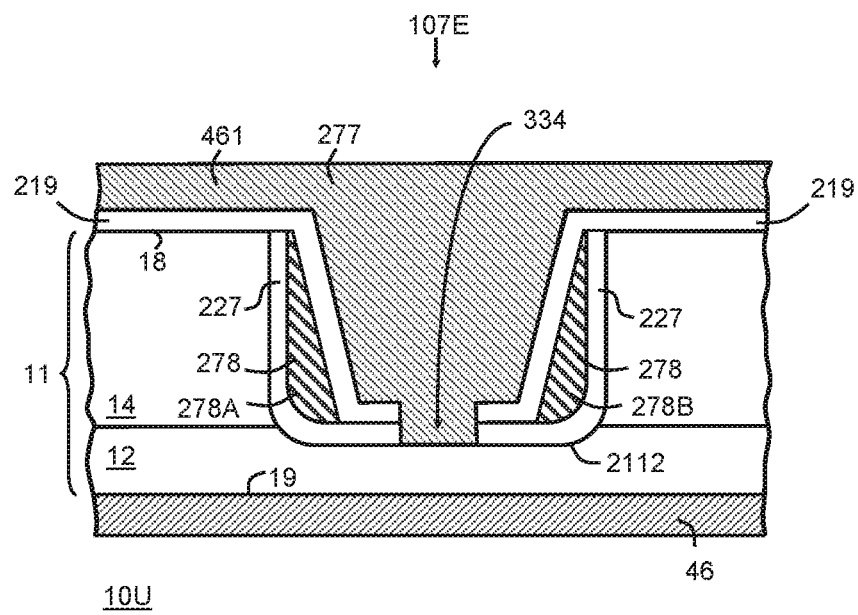

FIG. 26 illustrates a partial cross-sectional view of another example of a substrate contact structure 107E as part of device 10U. Substrate contact structure 107E comprises a trench 2112 that is wider than trench 71 and is similar to trenches 211 in termination structures 100U of FIG. 24. In this example, a conductive material 278 is provided within trench 2112 as conductive spacers 278A and 278B, and an opening 334 is provided within dielectric layer 219 and dielectric structure 227 proximate to a lower surface of trench 2112. In this way, conductive material 277 makes electrical contact with substrate 12 through opening 334. Conductive material 278 can be the same material as conductive material 217 described previously. In the present example, conductive material 277 is illustrated as extending out of trench 2112 so as to provide top-side cathode contact 461 for device 10U.

Figure 27:
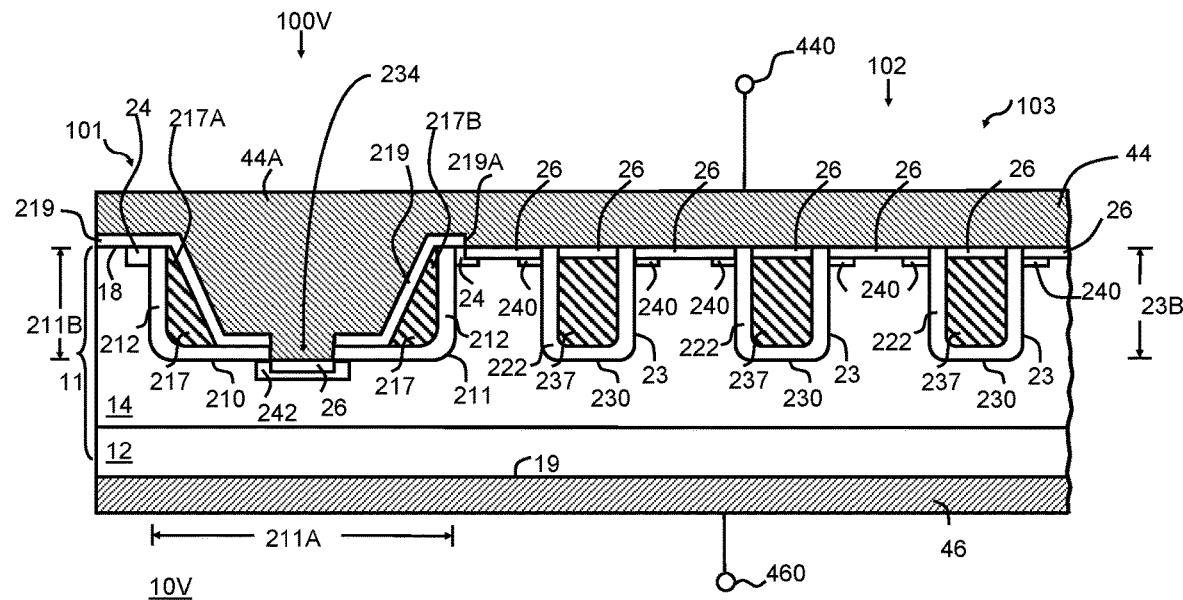
FIGS. 27-52 illustrate partial cross-sectional views of a semiconductor device with a termination structure in accordance with the present description.

FIG. 27 illustrates a partial cross-sectional view of an electronic device 10V, semiconductor device 10V, Schottky diode device 10V, or trench Schottky rectifier 10V having a termination structure 100V or termination trench structures 100V in edge portion 101 of region of semiconductor material 11, and active structure 102 or active trench structures 102 in active portion 103 of region of semiconductor material 11 in accordance with the present description. Device 10V is similar to device 10M and only the differences will be described hereinafter. In the present example, in device 10V an opening 234 is provided within dielectric layer 219 and dielectric structure 212 proximate to a lower surface of trench 211 so that conductive layer 44 is in electrical communication with region of semiconductor 11 (e.g., semiconductor layer 14).

In the present example, spacers 217A and 217B are electrically floating and are electrically isolated from conductive layer 44 by dielectric layer 219. In some examples, a doped region 242, which can be a P-type doped region when semiconductor layer 14 is N-type, is provided proximate to where conductive layer 44 contacts semiconductor layer 14 through opening 234. In some examples, doped region 242 has a dopant concentration in a range from about $1.0 \times 10^{14}$ atoms/cm$^3$ to about $5.0 \times 10^{17}$ atoms/cm$^3$. Doped region 242 can be formed using ion implantation or other doping techniques. In some examples, conductive material 26 can be disposed within doped region 242 as generally illustrated in FIG. 27. In this configuration, doped region 242 functions as a guard ring structure as part of termination structure 100V. Also, in the present example depth 211B of termination trench 211 is similar to depth 23B of active trenches 23. It is understood that these depths can be different. The electrical performance of device 10V can be further optimized similarly to other devices described herein including, for example, device 10M. In addition, the dopant concentration, depth, and width of doped region 242 can be varied.

Figure 28:
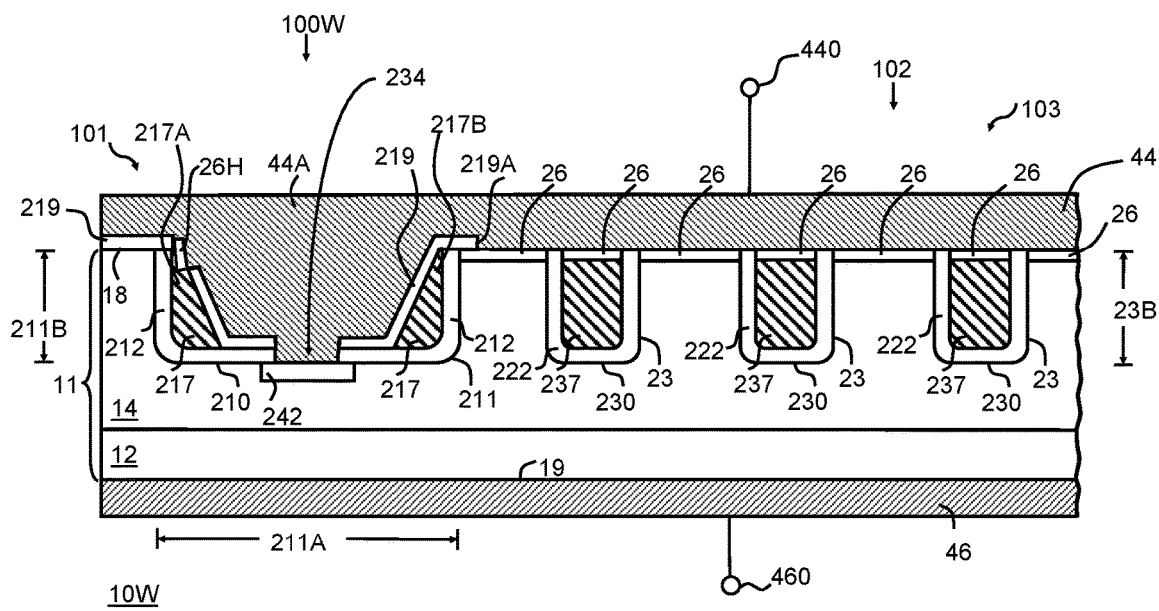

FIG. 28 illustrates a partial cross-sectional view of an electronic device 10W, semiconductor device 10W, Schottky diode device 10W, or trench Schottky rectifier 10W having a termination structure 100W or termination trench structures 100W in edge portion 101 of region of semiconductor material 11, and active structure 102 or active trench structures 102 in active portion 103 of region of semiconductor material 11 in accordance with the present description. Device 10W is similar to device 10V and only the differences will be described hereinafter. In device 10W, an opening is provided within dielectric layer 219 proximate to the outermost conductive spacer structure 217A, and portion 26H of conductive material 26 is disposed within the opening thereby contacting conductive material 217 in the outermost conductive spacer structure 217A. In this configuration, conductive spacer structure 217A is electrically connected to conductive layer 44. In device 10W, the innermost conductive spacer structure 217B is electrically floating. In addition, device 10W is illustrated without doped regions 24 and 240 and conductive material 26 in doped region 242. However, it is understood that one or more of doped regions 24 and 240 and/or conductive material 26 within doped region 242 can be included in device 10W. Also, in the present example depth 211B of termination trench 211 is similar to depth 23B of active trenches 23. It is understood that these depths can be different. The electrical performance of device 10W can be further optimized similarly to other devices described herein including, for example, device 10V. In addition, the dopant concentration and conductivity type of conductive spacer structure 217A can be varied.

Figure 29:
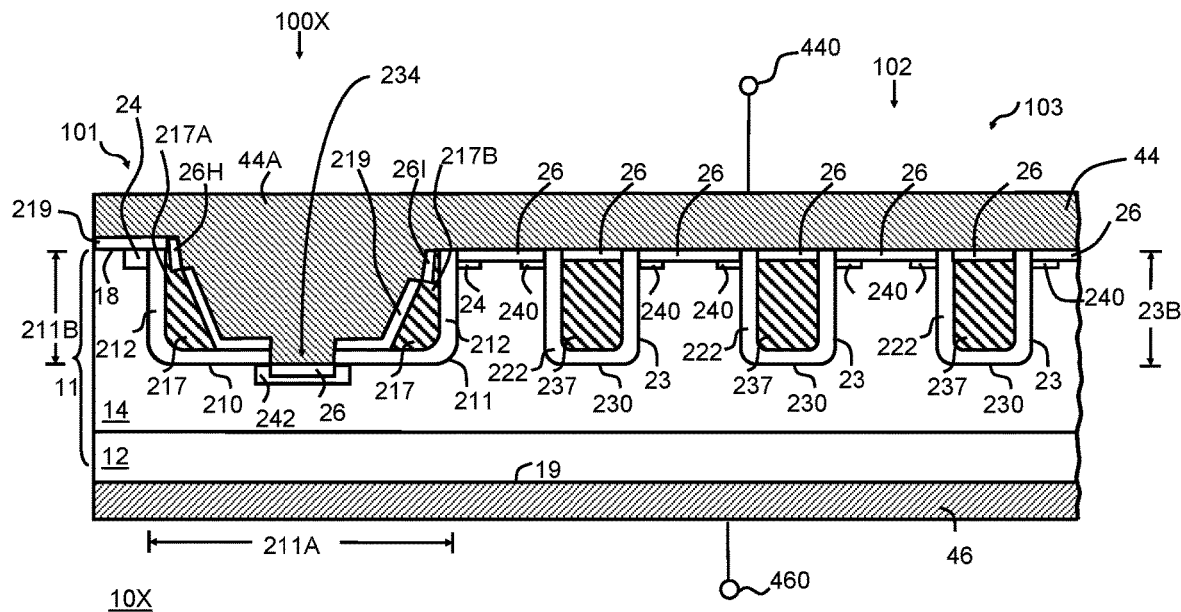

FIG. 29 illustrates a partial cross-sectional view of an electronic device 10X, semiconductor device 10X, Schottky diode device 10X, or trench Schottky rectifier 10X having a termination structure 100X or termination trench structures 100X in edge portion 101 of region of semiconductor material 11, and active structure 102 or active trench structures 102 in active portion 103 of region of semiconductor material 11 in accordance with the present description. Device 10X is similar to devices 10V and 10W and only the differences will be described hereinafter. In device 10X, openings are provided within dielectric layer 219 proximate to the outermost conductive spacer 217A and proximate to the innermost conductive spacer 217B. A portion 26H of conductive material 26 is disposed within one of the openings thereby contacting conductive material 217 in the outermost conductive spacer structure 217A, and a portion 26I of conductive material 26 is disposed within the other opening thereby contacting conductive material 217 in the innermost conductive spacer structure 217B. In this configuration both conductive spacer structures 217A and 217B are electrically connected to conductive layer 44. The electrical performance of device 10X can be further optimized similarly to other devices described herein including, for example, device 10V. In addition, the dopant concentration and conductivity type of conductive spacer structures 217A and 217B can be varied.

Figure 30:
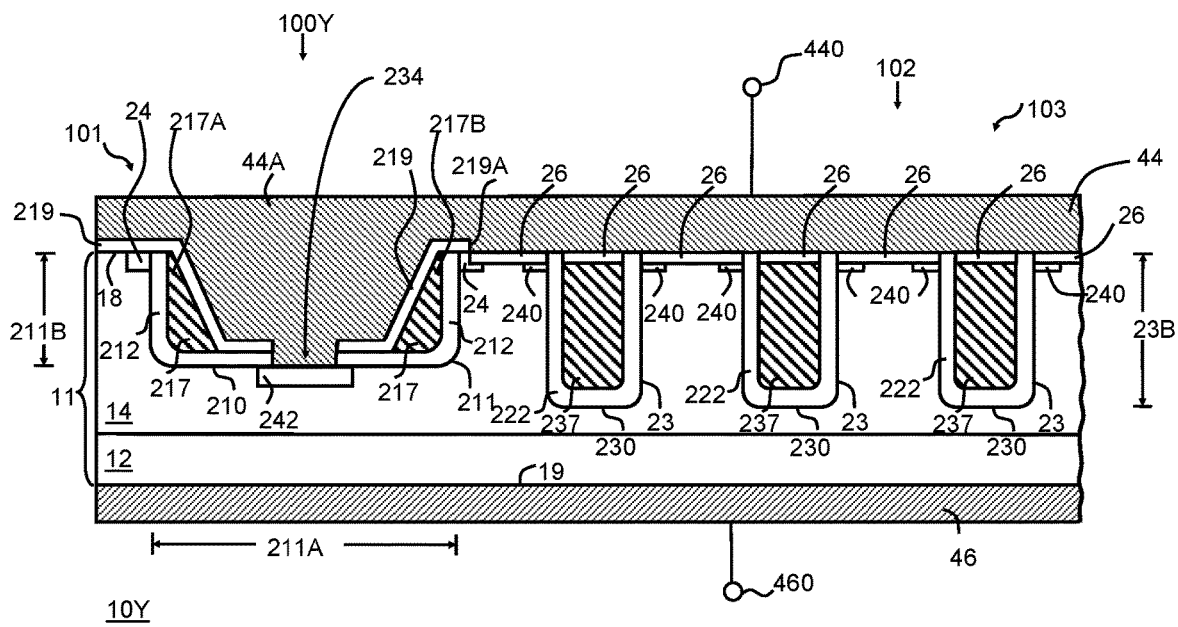

FIG. 30 illustrates a partial cross-sectional view of an electronic device 10Y, semiconductor device 10Y, Schottky diode device 10Y, or trench Schottky rectifier 10Y having a termination structure 100Y or termination trench structures 100Y in edge portion 101 of region of semiconductor material 11, and active structure 102 or active trench structures 102 in active portion 103 of region of semiconductor material 11 in accordance with the present description. Device 10Y is similar to device 10V and only the differences will be described hereinafter. In particular, in device 10Y depth 23B of one or more of active trenches 23 is greater than depth 211B of termination trench 211. In addition, device 10Y is illustrated without conductive material 26 within doped region 242. It is understood that in other examples, conductive material 26 can be included within doped region 242. It is also understood that in other examples, doped regions 24 and/or 240 can be excluded. Further, in device 10Y conductive spacer structures 217A and 217B are electrically floating. It is understood that in other examples, conductive spacer structure 217A alone or in combination with conductive spacer structure 217B can be electrically connected to conductive layer 44. The electrical performance of device 10Y can be further optimized similarly to other devices described herein including, for example, device 10V.

Figure 31:
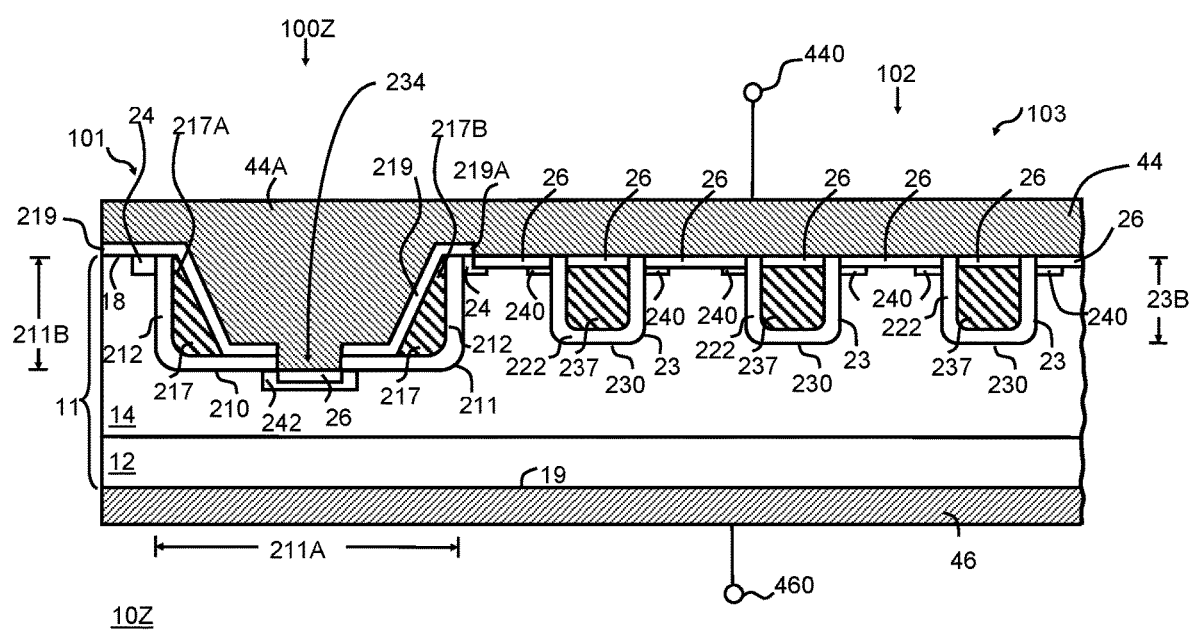

FIG. 31 illustrates a partial cross-sectional view of an electronic device 10Z, semiconductor device 10Z, Schottky diode device 10Z, or trench Schottky rectifier 10Z having a termination structure 100Z or termination trench structures 100Z in edge portion 101 of region of semiconductor material 11, and active structure 102 or active trench structures 102 in active portion 103 of region of semiconductor material 11 in accordance with the present description. Device 10Z is similar to device 10V and only the differences will be described hereinafter. In particular, in device 10Z depth 23B of one or more of active trenches 23 is less than depth 211B of termination trench 211. It is understood that in other examples, conductive spacer structure 217A alone or in combination with conductive spacer structure 217B can be electrically connected to conductive layer 44. The electrical performance of device 10Z can be further optimized similarly to other devices described herein including, for example, device 10V.

Figure 32:
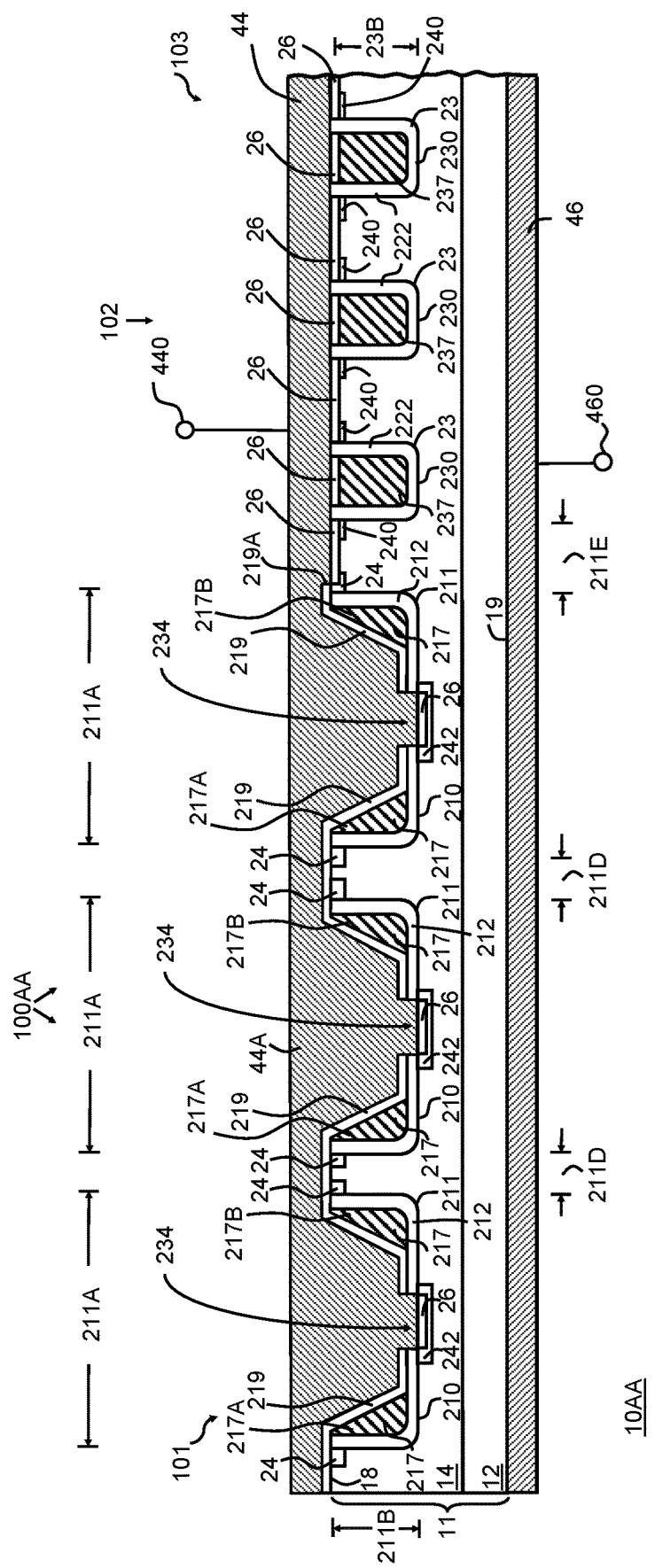

FIG. 32 illustrates a partial cross-sectional view of an electronic device 10AA, semiconductor device 10AA, Schottky diode device 10AA, or trench Schottky rectifier 10AA having a termination structure 100AA or termination trench structures 100AA in edge portion 101 of region of semiconductor material 11, and active structure 102 or active trench structures 102 in active portion 103 of region of semiconductor material 11 in accordance with the present description. Device 10AA is similar to device 10V and only the differences will be described hereinafter. In device 10AA, termination structure 100AA comprises more than one termination trench 211. In this particular example, three termination trenches 211 are included. It is understood that termination structure 100AA can include two termination trenches 211 or more than three termination trenches 211. In the present example, each of the termination trenches 211 can have a width 211A that is substantially equal. In addition, termination trenches 211 can each have a depth 211B that is substantially equal. Further, in the present example, depth 211B can be substantially equal to depth 23B of active trenches 23. As will be illustrated in examples that follow, depth 211B can be different for each termination trench 211 and depth 211B can be different than depth 23B of active trenches 23. Also, width 211A of one or more of termination trenches 211 can be different than that of other termination trenches 211.

In the present example, each of termination trenches 211 is separated by a width 211D, which can be the same or different. For example, widths 211D can increase from the innermost one of termination trenches 211 to the outermost one of termination trenches 211. In other examples, widths 211D can decrease from the innermost one of termination trenches 11 to the outermost one of termination trenches 211. The innermost termination trench 211 can be spaced a width 211E from the outermost one of active trenches 23. Width 211E can be greater than or equal to one or more of widths 211D. In device 10AA, openings 234 are formed in dielectric layer 219 and dielectric structure 212 in each of termination trenches 211 such that conductive layer 44 makes contact to doped regions 242. In other examples, less or no openings 234 can be used. Further, one or more openings can be provided in dielectric layer 219 in one more of termination trenches 211 to provide contact to one or more of conductive spacer structures 217A and/or 217B.

The electrical performance of device 10AA can be further optimized similarly to other devices described herein including, for example, device 10V. In addition, the number of termination trenches 211, the depths of the termination trenches 211, the spacing between adjacent termination trenches 211, the spacing between the innermost termination trench and the outmost active trench 23, and/or the widths and depths of doped regions 242 can be varied.

Figure 33:
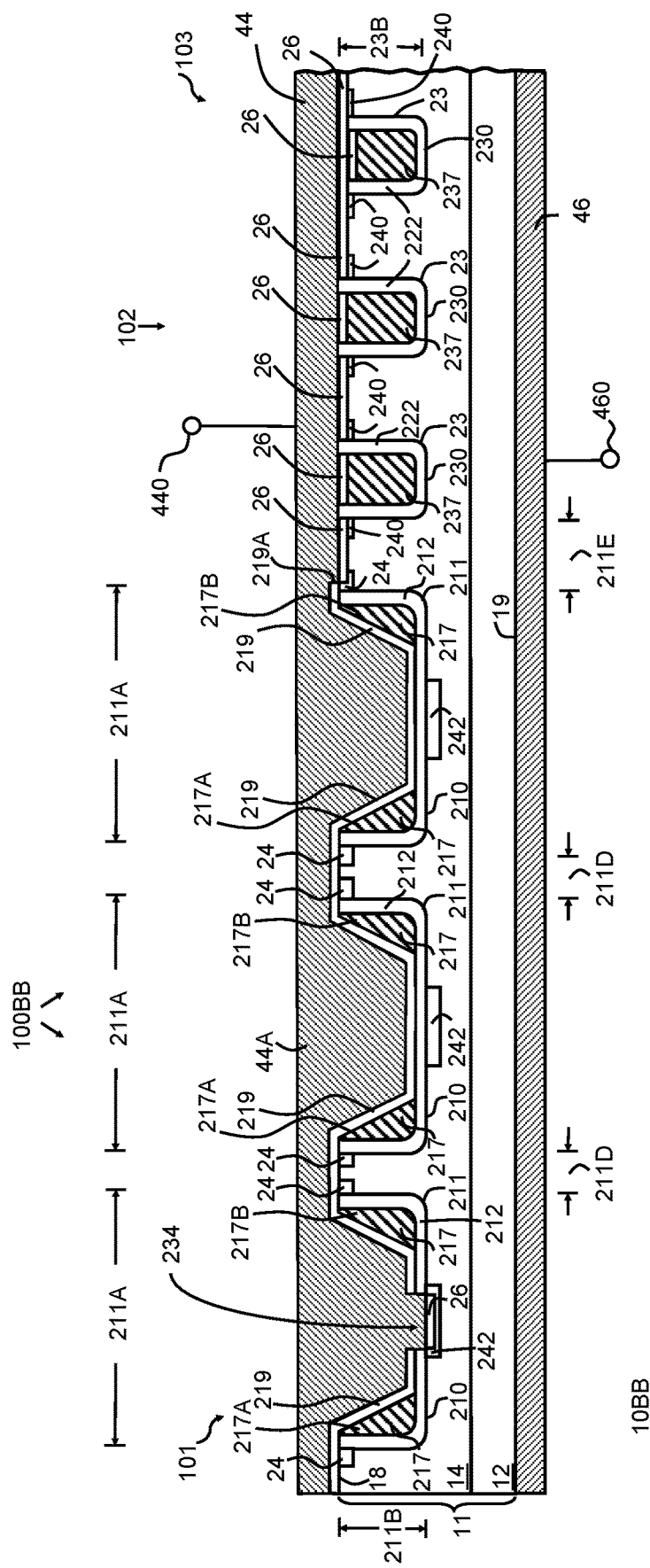

FIG. 33 illustrates a partial cross-sectional view of an electronic device 10BB, semiconductor device 10BB, Schottky diode device 10BB, or trench Schottky rectifier 10BB having a termination structure 100BB or termination trench structures 100BB in edge portion 101 of region of semiconductor material 11, and active structure 102 or active trench structures 102 in active portion 103 of region of semiconductor material 11 in accordance with the present description. Device 10BB is similar to device 10AA and only the differences will be described hereinafter. In device 10BB, at least one of termination trenches 211 is provided without, absent, or devoid of an opening 234. In the present example, the two innermost termination trenches 211 are provided without openings 234. In some examples, doped regions 242 are provided below each of termination trenches 211, but the doped region 242 below the two innermost termination trenches 211 are electrically floating in this example.

The electrical performance of device 10BB can be further optimized similarly to other devices described herein, including, for example, device 10V. In addition, the number of termination trenches 211, the depths of the termination trenches 211, the spacing between adjacent termination trenches 211, the spacing between the innermost termination trench and the outmost active trench 23, and/or the widths and depths of doped regions 242 can be varied.

Figure 34:
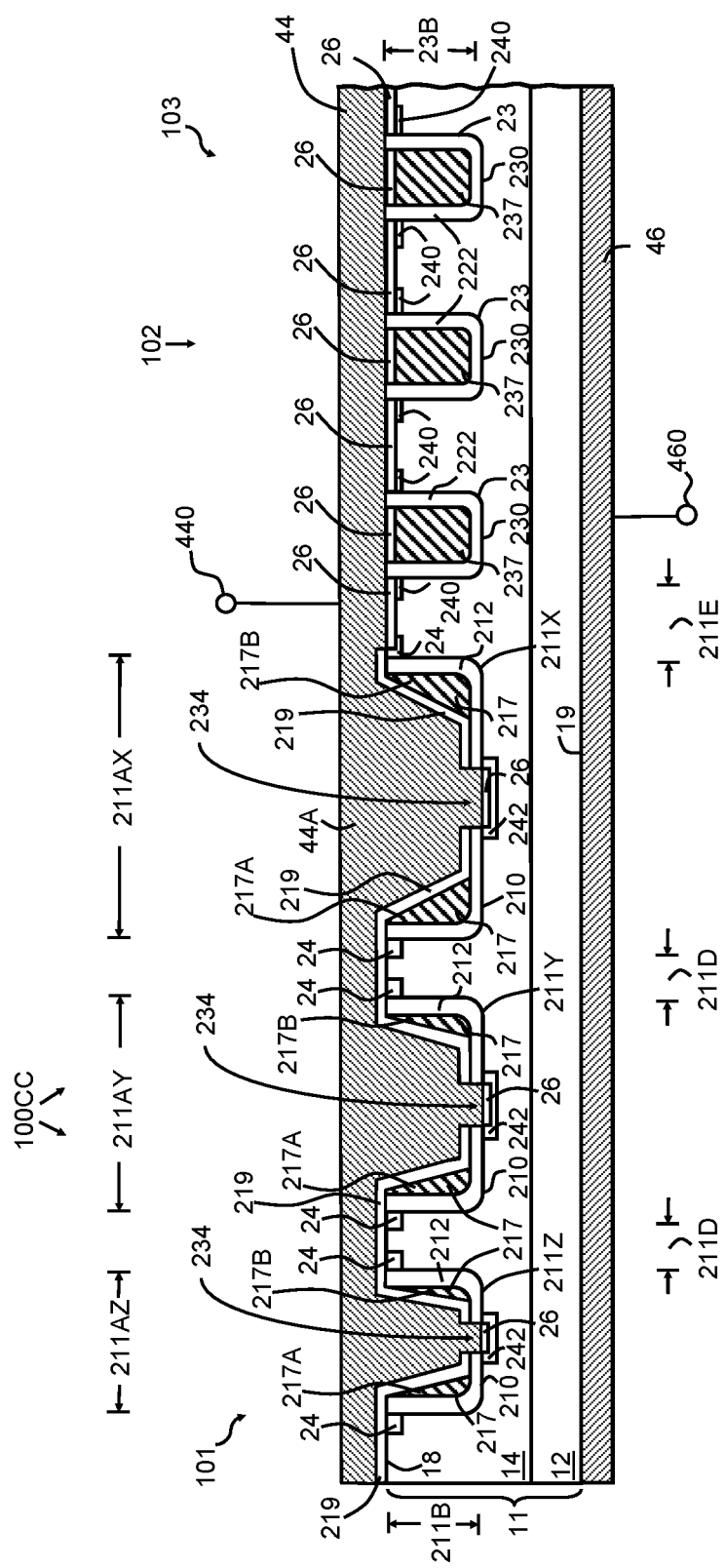

FIG. 34 illustrates a partial cross-sectional view of an electronic device 10CC, semiconductor device 10CC, Schottky diode device 10CC, or trench Schottky rectifier 10CC having a termination structure 100CC or termination trench structures 100CC in edge portion 101 of region of semiconductor material 11, and active structure 102 or active trench structures 102 in active portion 103 of region of semiconductor material 11 in accordance with the present description. Device 10CC is similar to device 10AA and only the differences will be described hereinafter. In device 10CC, termination structure 100CC comprises termination trenches 211X, 211Y, and 211Z. In the present example, termination trench 211X has a width 211AX, termination trench 211Y as a width 211AY, and termination trench 211Z has a width 211AZ. More particularly, width 211AX is greater than width 211AY and width 211AZ, and width 211AY is greater than 211AZ. Stated differently, in termination structure 100CC, the width of termination trenches 211X, 211Y, and 211Z decreases from the innermost of the termination trenches to the outermost of one of the termination trenches. In the present example, termination trenches 211X, 211Y, and 211Z can have a similar depth 211B, which can be similar to depth 23B of active trenches 23. In other examples, the depths can be different. In some examples, one or more openings can be provided in dielectric layer 219 in one more of termination trenches 211X, 211Y, and 211Z to provide contact to one or more of conductive spacer structures 217A and/or 217B. In further examples, less or no openings 234 can be used with doped regions 242 configured to be electrically floating.

The electrical performance of device 10CC can be further optimized similarly to other devices described herein including, for example, device 10V. In addition, the number of termination trenches, the widths and depths of the termination trenches, the spacing between adjacent termination trenches, the spacing between the innermost termination trench and the outmost active trench 23, the dopant concentration of doped regions 242, and/or the widths and depths of doped regions 242 can be varied.

Figure 35:
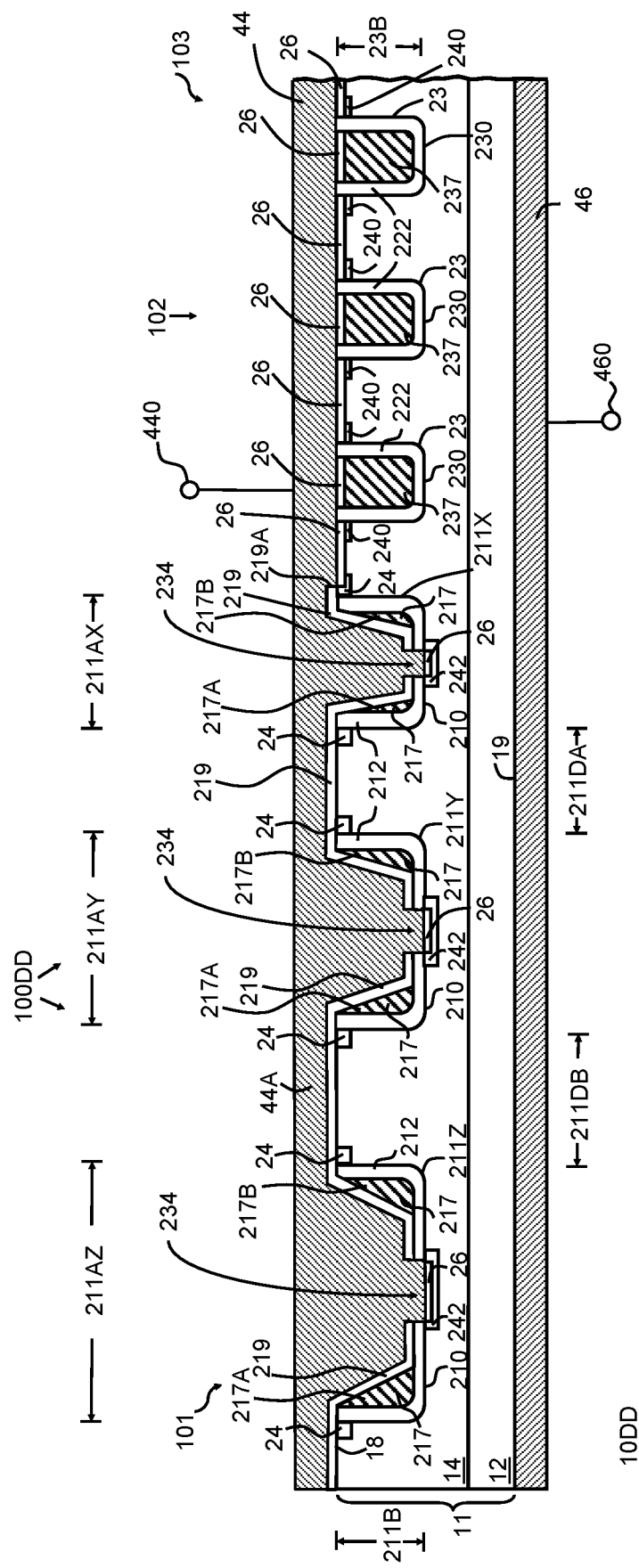

FIG. 35 illustrates a partial cross-sectional view of an electronic device 10DD, semiconductor device 10DD, Schottky diode device 10DD, or trench Schottky rectifier 10DD having a termination structure 100DD or termination trench structures 100DD in edge portion 101 of region of semiconductor material 11, and active structure 102 or active trench structures 102 in active portion 103 of region of semiconductor material 11 in accordance with the present description. Device 10DD is similar to devices 10AA and 10CC and only the differences will be described hereinafter. In device 10DD, termination structure 100DD comprises termination trenches 211X, 211Y, and 211Z. In the present example, termination trench 211X has a width 211AX, termination trench 211Y has a width 211AY, and termination trench 211Z has a width 211AZ. More particularly, width 211AX is less than width 211AY and width 211AZ, and width 211AY is less than 211AZ. Stated differently, in termination structure 100DD, the width of termination trenches 211X, 211Y, and 211Z increases from the innermost of the termination trenches to the outermost of one of the termination trenches.

In the present example, termination trenches 211X, 211Y, and 211Z can have a similar depth 211B, which can be similar to depth 23B of active trenches 23. In other examples, the depths can be different. In termination structure 100DD, termination trench 211X is spaced a distance 211DA from termination trench 211Y and termination trench 211Y is spaced a distance 211DB from termination 211Z. In the present example, distance 211DB is greater than distance 211DA. Stated differently, in the present example, the distance or spacing between termination trenches 211X, 211Y, and 211Z increases from the innermost termination trench to the outermost termination trench. In other examples, the distance or spacing between termination trenches 211X, 211Y, and 211Z can decrease from the innermost termination trench to the outermost termination trench. In other examples, one or more openings can be provided in dielectric layer 219 in one more of termination trenches 211X, 211Y, and 211Z to provide contact to one or more of conductive spacer structures 217A and/or 217B. In further examples, less or no openings 234 can be used with doped regions 242 configured to be electrically floating.

The electrical performance of device 10DD can be further optimized similarly to other devices described herein including, for example, device 10V. In addition, the number of termination trenches, the widths and depths of the termination trenches, the spacing between adjacent termination trenches, the spacing between the innermost termination trench and the outmost active trench 23, the dopant concentration of doped regions 242, and/or the widths and depths of doped regions 242 can be varied.

Figure 36:
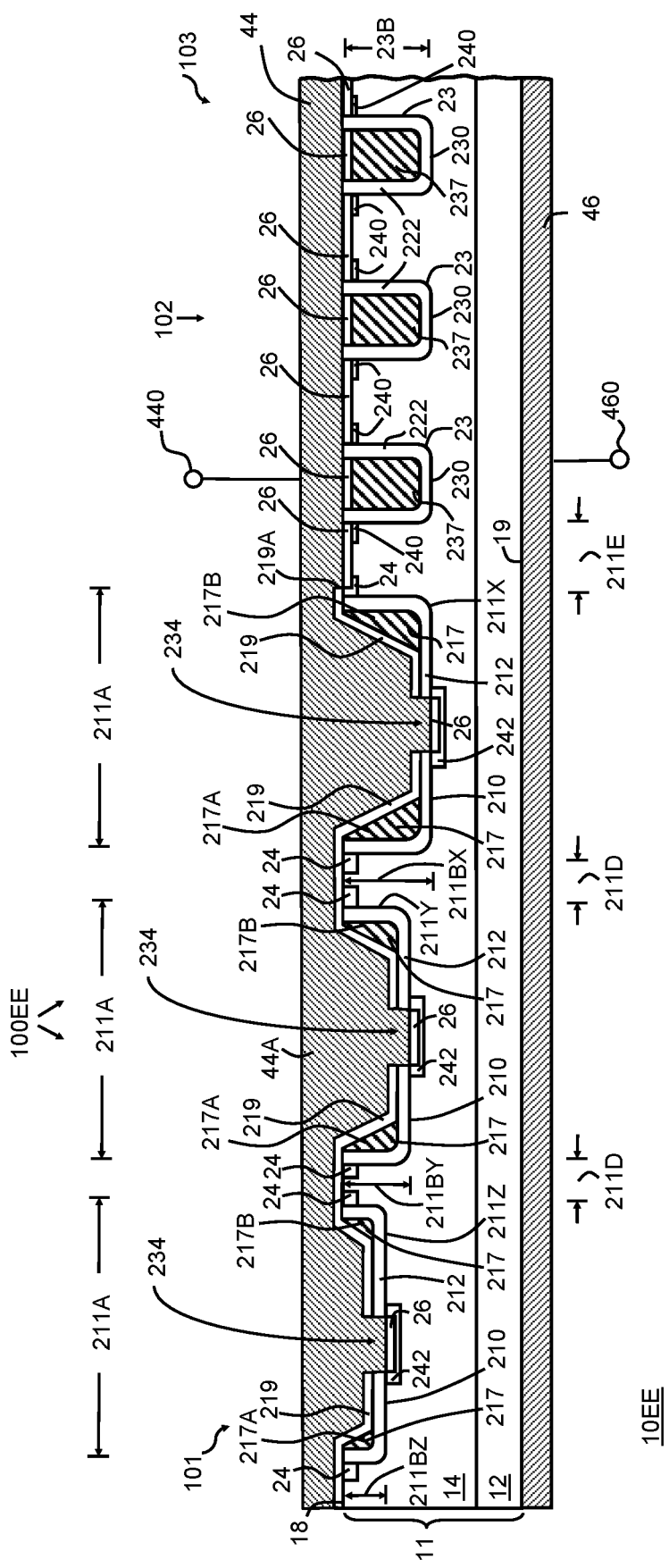

FIG. 36 illustrates a partial cross-sectional view of an electronic device 10EE, semiconductor device 10EE, Schottky diode device 10EE, or trench Schottky rectifier 10EE having a termination structure 100EE or termination trench structures 100EE in edge portion 101 of region of semiconductor material 11, and active structure 102 or active trench structures 102 in active portion 103 of region of semiconductor material 11 in accordance with the present description. Device 10EE is similar to device 10AA and only the differences will be described hereinafter. In device 10EE, termination structure 100EE comprises termination trenches 211X, 211Y, and 211Z. Termination trench 211X extends from major surface 18 into region of semiconductor material 11 (e.g., semiconductor layer 14) to a depth 211BX, termination trench 211Y extends from major surface 18 into region of semiconductor material 11 (e.g., semiconductor layer 14) to a depth 211BY, and termination trench 211Z extends from major surface 18 into region of semiconductor material 11 (e.g., semiconductor layer 14) to a depth 211BZ. In the present example, depth 211BX is greater than depths 211BY and 211BZ, and depth 211BY is greater than depth 211BZ. Stated differently, the depths of the termination trenches decreases from the innermost termination trench to the outermost termination trench. Further, in the present example depth 211BX can be substantially equal to depth 23B of active trenches 23. In other examples, depth 23B can be greater than or less than depth 211BX.

In the present example, each of the termination trenches 211X, 211Y, and 211Z can have a width 211A that is substantially equal. In other examples, trenches 211X, 211Y, and 211Z can have different widths. In the present example, each of termination trenches 211X, 211Y, and 211Z is separated by a width 211D, which can be the same or different. In device 10EE, openings 234 are formed in dielectric layer 219 and dielectric structure 212 in each of termination trenches 211X, 211Y, and 211Z such that conductive layer 44 makes contact to doped regions 242. In other examples, less or no openings 234 can be used with doped regions 242 configured to be electrically floating. Further, one or more openings can be provided in dielectric layer 219 in one more of termination trenches 211X, 211Y, and 211Z to provide contact to one or more of conductive spacer structures 217A and/or 217B.

The electrical performance of device 10EE can be further optimized similarly to other devices described herein, including for example, device 10V. In addition, the number of termination trenches 211, the depths of the termination trenches 211, the spacing between adjacent termination trenches 211, the spacing between the innermost termination trench and the outmost active trench 23, the dopant concentration of doped regions 242, and/or the widths and depths of doped regions 242 can be varied.

Figure 37:
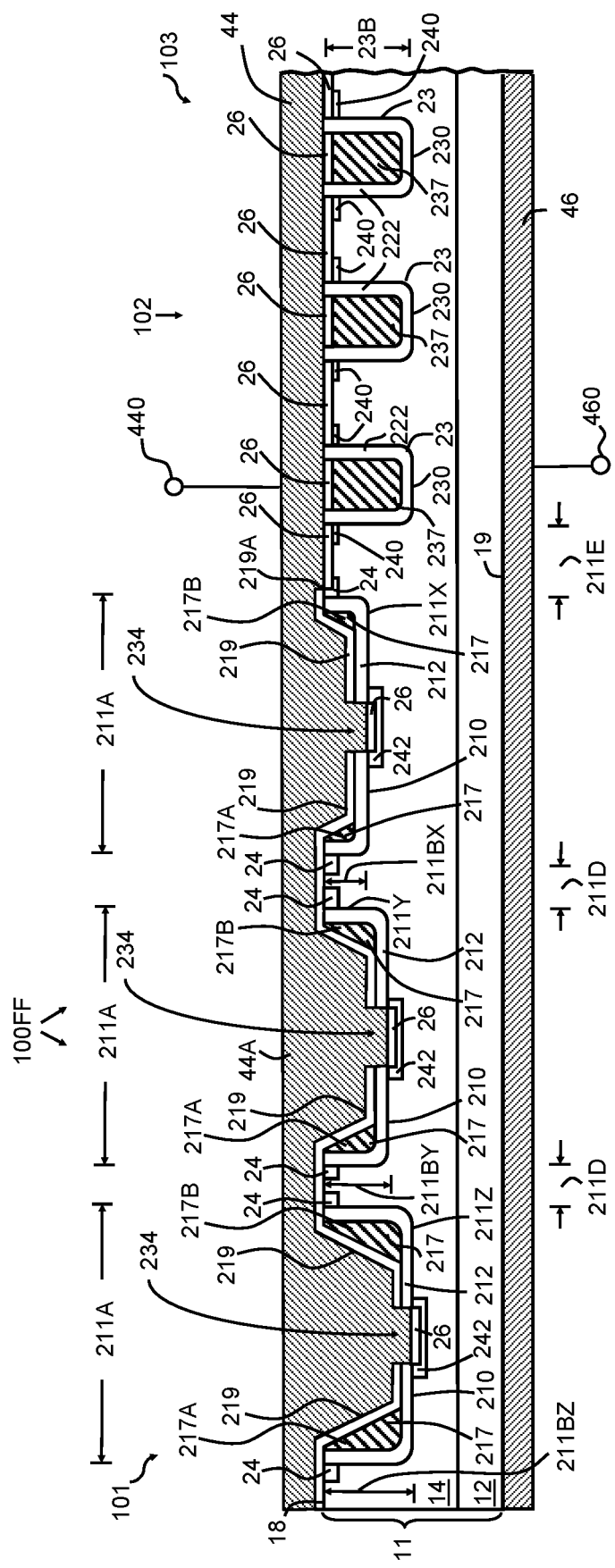

FIG. 37 illustrates a partial cross-sectional view of an electronic device 10FF, semiconductor device 10FF, Schottky diode device 10FF, or trench Schottky rectifier 10FF having a termination structure 100FF or termination trench structures 100FF in edge portion 101 of region of semiconductor material 11, and active structure 102 or active trench structures 102 in active portion 103 of region of semiconductor material 11 in accordance with the present description. Device 10FF is similar to devices 10AA and 10EE and only the differences will be described hereinafter. In device 10FF, termination structure 100FF comprises termination trenches 211X, 211Y, and 211Z. Termination trench 211X extends from major surface 18 into region of semiconductor material 11 (e.g., semiconductor layer 14) to a depth 211BX, termination trench 211Y extends from major surface 18 into region of semiconductor material 11 (e.g., semiconductor layer 14) to a depth 211BY, and termination trench 211Z extends from major surface 18 into region of semiconductor material 11 (e.g., semiconductor layer 14) to a depth 211BZ. In the present example, depth 211BX is less than depths 211BY and 211BZ, and depth 211BY is less than depth 211BZ. Stated differently, the depth of the termination trenches increases from the innermost termination trench to the outermost termination trench. Further, in the present example depth 211BZ can be substantially equal to depth 23B of active trenches 23. In other examples, depth 23B can be greater than or less than depth 211BZ.

In the present example, each of the termination trenches 211X, 211Y, and 211Z can have a width 211A that is substantially equal. In other examples, trenches 211X, 211Y, and 211Z can have different widths. In the present example, each of termination trenches 211X, 211Y, and 211Z is separated by a width 211D, which can be the same or different. In device 10FF, openings 234 are formed in dielectric layer 219 and dielectric structure 212 in each of termination trenches 211X, 211Y, and 211Z such that conductive layer 44 makes contact to doped regions 242. In other examples, less or no openings 234 can be used with doped regions 242 configured to be electrically floating. Further, one or more openings can be provided in dielectric layer 219 in one more of termination trenches 211X, 211Y, and 211Z to provide contact to one or more of conductive spacer structures 217A and/or 217B.

The electrical performance of device 10FF can be further optimized similarly to other devices described herein including, for example, device 10V. In addition, the number of termination trenches 211, the depths of the termination trenches 211, the spacing between adjacent termination trenches 211, the spacing between the innermost termination trench and the outmost active trench 23, the dopant concentration of doped regions 242, and/or the widths and depths of doped regions 242 can be varied.

Figure 38:
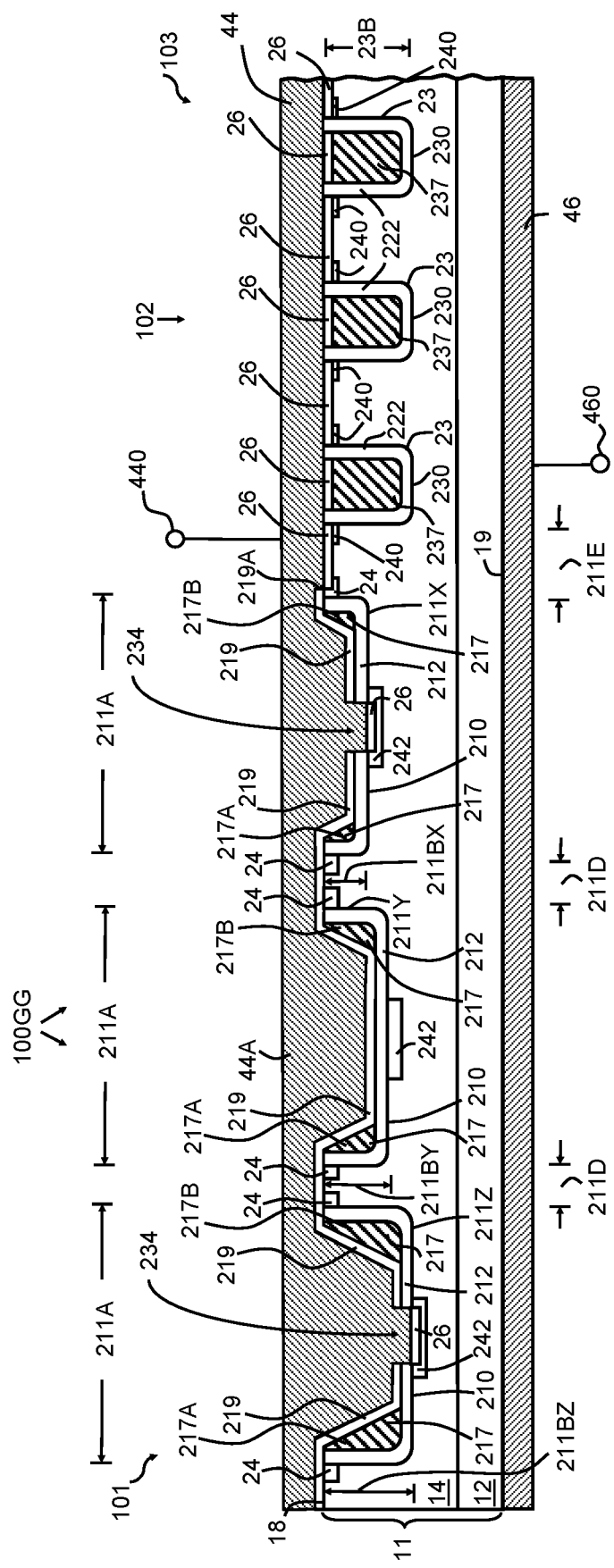

FIG. 38 illustrates a partial cross-sectional view of an electronic device 10GG, semiconductor device 10GG, Schottky diode device 10GG, or trench Schottky rectifier 10GG having a termination structure 100GG or termination trench structures 100GG in edge portion 101 of region of semiconductor material 11, and active structure 102 or active trench structures 102 in active portion 103 of region of semiconductor material 11 in accordance with the present description. Device 10GG is similar to devices 10AA and 10FF and only the differences will be described hereinafter. In device 10GG, dielectric layer 219 and dielectric structure 212 in at least one of the termination trenches 211X, 211Y, and 211Z is provided without an opening such that the doped region 242 in that termination trench is electrically floating. In the present example, dielectric layer 219 and dielectric structure 212 in termination trench 211Y is provided without opening 234. It is understood that this configuration can be used in one more of the termination trenches 211X and 211Z including in combination with the configuration illustrated in termination trench 211. In other examples, one or more openings can be provided in dielectric layer 219 in one more of termination trenches 211X, 211Y, and 211Z to provide contact to one or more of conductive spacer structures 217A and/or 217B.

The electrical performance of device 10GG can be further optimized similarly to other devices describes herein including, for example, device 10V. In addition, the number of termination trenches 211, the depths of the termination trenches 211, the spacing between adjacent termination trenches 211, the spacing between the innermost termination trench and the outmost active trench 23, the dopant concentration of doped regions 242, and/or the widths and depths of doped regions 242 can be varied.

It is understood that any of the examples or portions of thereof illustrated with devices 10AA, 10BB, 10CC, 10DD, 10EE, 10FF, and 10GG can be combined with each other and/or with the other examples described herein to provide different example devices within the teachings of the present description. In some examples, less (including none) openings 234 can be used, and one or more openings can be provided in dielectric layer 219 in one more of termination trenches to provide electrical between conductive layer 44 and one or more of conductive spacer structures 217A and/or 217B. In some examples, more or less (including none) doped region 24, 240, and 242 can be used.

Figure 39:
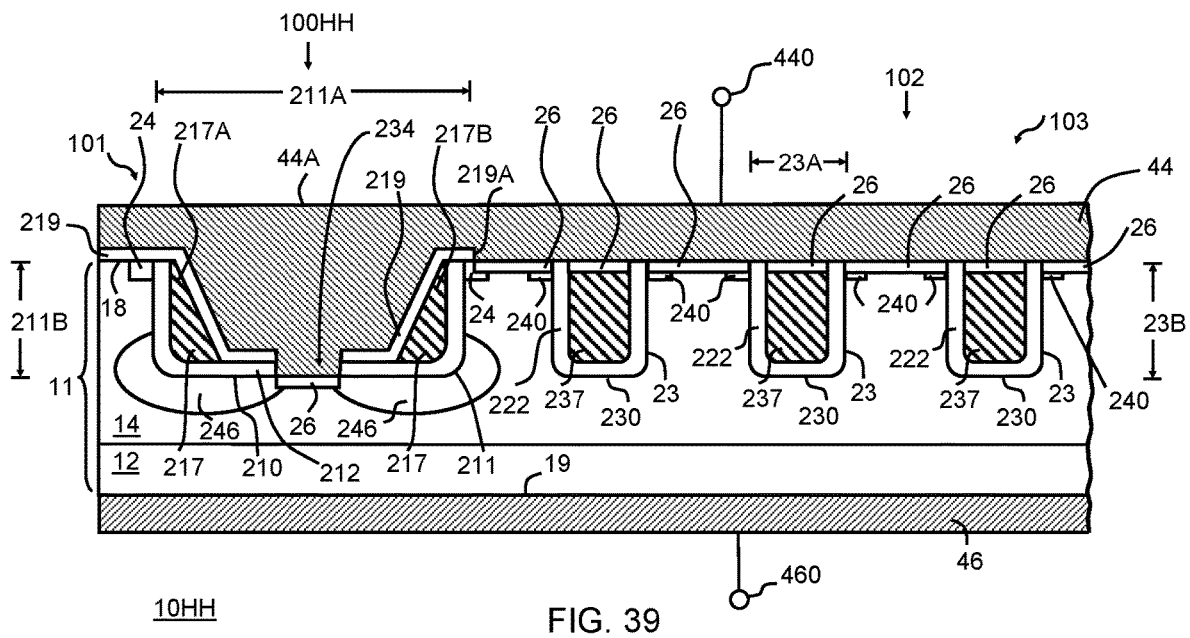

FIG. 39 illustrates a partial cross-sectional view of an electronic device 10HH, semiconductor device 10HH, Schottky diode device 10HH, or trench Schottky rectifier 10HH having a termination structure 100HH or termination trench structures 100HH in edge portion 101 of region of semiconductor material 11, and active structure 102 or active trench structures 102 in active portion 103 of region of semiconductor material 11 in accordance with the present description. Device 10HH is similar to device 10V and only the differences will be described hereinafter. In the present example, in device 10HH opening 234 is provided within dielectric layer 219 and dielectric structure 212 proximate to a lower surface of trench 211 so that conductive layer 44 is in electrical communication with or electrically connected to region of semiconductor 11 (e.g., semiconductor layer 14). In the present example, doped region 242 is not included, but in some examples, conductive material 26 is provided adjacent opening 234 in region of semiconductor material 11 as generally illustrated in FIG. 39. In this configuration, conductive material 26 forms a Schottky barrier with semiconductor layer 14 through opening 234.

In the present example, one or more doped regions 246 are disposed near lower corners of termination trench 111 so as to overlap portions of the lower surface of termination trench 211 and portions of side surfaces of termination trench 211 in cross-sectional view. In the present example, a pair of doped regions 246 is provided. In some examples, doped regions 246 comprise a P-type conductivity when semiconductor layer 14 is N-type conductivity. In some examples, doped regions 246 have a dopant concentration in a range from about $1.0 \times 10^{14}$ atoms/cm$^3$ to about $5.0 \times 10^{16}$ atoms/cm$^3$. Doped region 246 can be formed using angled ion implantation doping techniques. In other examples, masking techniques can be used with ion implantation doping techniques or with other doping techniques as known to those skilled in the art.

In the present example, the width of opening 234, the dopant concentration of doped regions 246, the widths of doped region 246, the depths of doped regions 246, and the spacing between doped regions 246 can be used in addition to the other design parameters described herein to further optimize the electrical performance of device 10HH. In the present example, depth 211B of termination trench 211 is substantially similar to depth 23B of active trenches 23. In other examples, these depths can be different as illustrated hereinafter.

Figure 40:
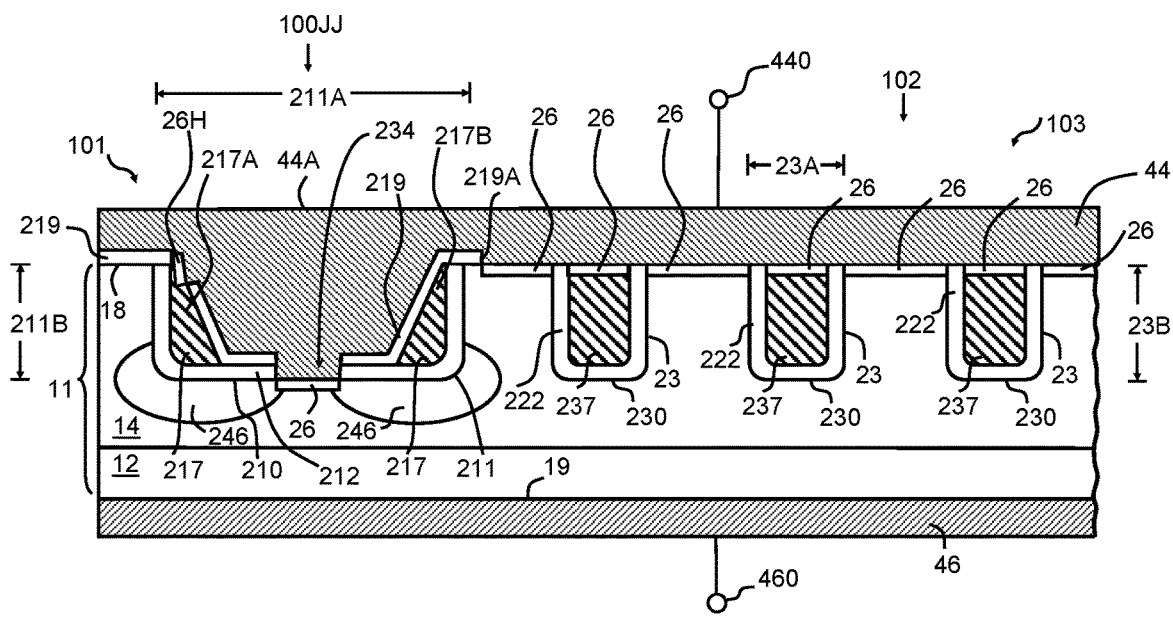

FIG. 40 illustrates a partial cross-sectional view of an electronic device 10JJ, semiconductor device 10JJ, Schottky diode device 10JJ, or trench Schottky rectifier 10JJ having a termination structure 100JJ or termination trench structures 100JJ in edge portion 101 of region of semiconductor material 11, and active structure 102 or active trench structures 102 in active portion 103 of region of semiconductor material 11 in accordance with the present description. Device 10JJ is similar to device 10HH and only the differences will be described hereinafter. In device 10JJ, an opening is provided within dielectric layer 219 proximate to the outermost conductive spacer structure 217A, and portion 26H of conductive material 26 is disposed within the opening thereby contacting conductive material 217 in the outermost conductive spacer structure 217A. In this configuration, conductive spacer structure 217A is electrically connected to conductive layer 44. In device 10JJ, the innermost conductive spacer structure 217B is electrically floating. In addition, device 10JJ is illustrated without doped regions 24 and 240. However, it is understood that one or more of doped regions 24 and 240 can be included in device 10JJ. Also, in the present example depth 211B of termination trench 211 is similar to depth 23B of active trenches 23. It is understood that these depths can be different. The electrical performance of device 10JJ can be further optimized similarly to device other devices described herein including, for example, 10HH. In addition, the dopant concentration and conductivity type of conductive spacer structure 217A can be varied.

Figure 41:
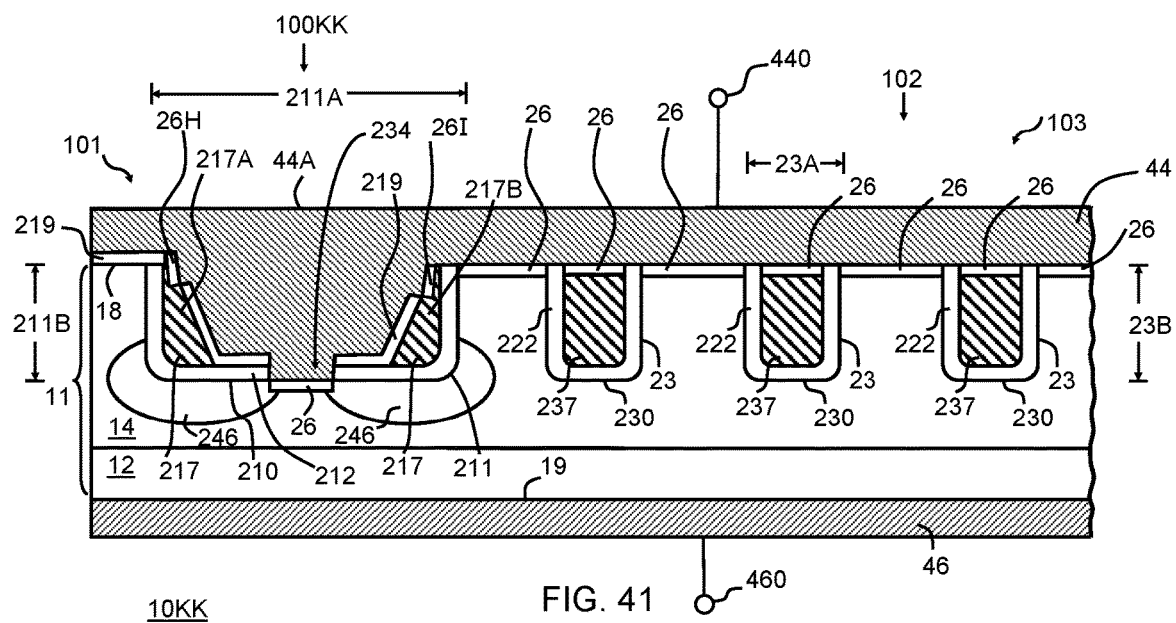

FIG. 41 illustrates a partial cross-sectional view of an electronic device 10KK, semiconductor device 10KK, Schottky diode device 10KK, or trench Schottky rectifier 10KK having a termination structure 100KK or termination trench structures 100KK in edge portion 101 of region of semiconductor material 11, and active structure 102 or active trench structures 102 in active portion 103 of region of semiconductor material 11 in accordance with the present description. Device 10KK is similar to devices 10HH and 10JJ and only the differences will be described hereinafter. In device 10KK, openings are provided within dielectric layer 219 proximate to the outermost conductive spacer 217A and proximate to the innermost conductive spacer 217B. A portion 26H of conductive material 26 is disposed within one of the openings thereby contacting conductive material 217 in the outermost conductive spacer structure 217A, and a portion 26I of conductive material 26 is disposed within the other opening thereby contacting conductive material 217 in the innermost conductive spacer structure 217B. In this configuration both conductive spacer structures 217A and 217B are electrically connected to conductive layer 44. In addition, device 10KK is illustrated without doped regions 24 and 240. However, it is understood that one or more of doped regions 24 and 240 can be included in device 10KK. Also, in the present example depth 211B of termination trench 211 is similar to depth 23B of active trenches 23. It is understood that these depths can be different. The electrical performance of device 10KK can be further optimized similarly to other devices described herein including, for example, device 10HH. In addition, the dopant concentration and conductivity type of conductive spacer structures 217A and 217B can be varied.

Figure 42:
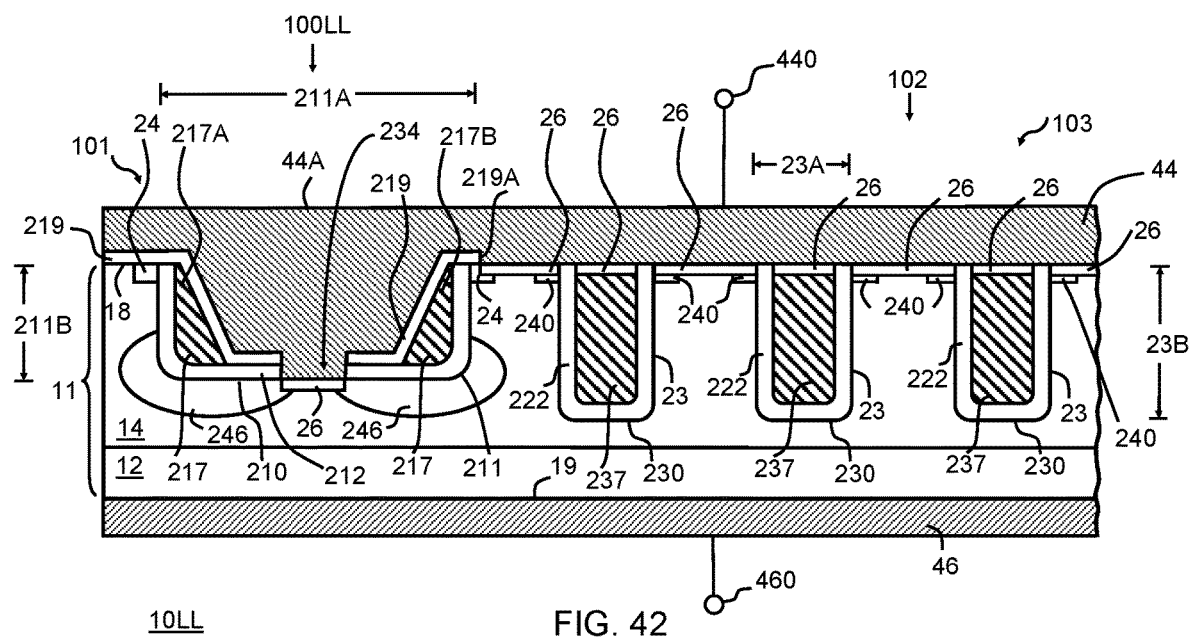

FIG. 42 illustrates a partial cross-sectional view of an electronic device 10LL, semiconductor device 10LL, Schottky diode device 10LL, or trench Schottky rectifier 10LL having a termination structure 100LL or termination trench structures 100LL in edge portion 101 of region of semiconductor material 11, and active structure 102 or active trench structures 102 in active portion 103 of region of semiconductor material 11 in accordance with the present description. Device 10LL is similar to device 10VV and only the differences will be described hereinafter. In particular, in device 10LL depth 23B of one or more of active trenches 23 is greater than depth 211B of termination trench 211. In addition, device 10LL comprises one or more of doped regions 24 and/or 240. It is understood that in other examples, doped regions 24 and/or 240 can be excluded. Further, in device 10LL conductive spacer structures 217A and 217B are electrically floating. It is understood that in other examples, conductive spacer structure 217A alone or in combination with conductive spacer structure 217B can be electrically connected to conductive layer 44. The electrical performance of device 10LL can be further optimized similarly to device other devices described herein including, for example, 10HH.

Figure 43:
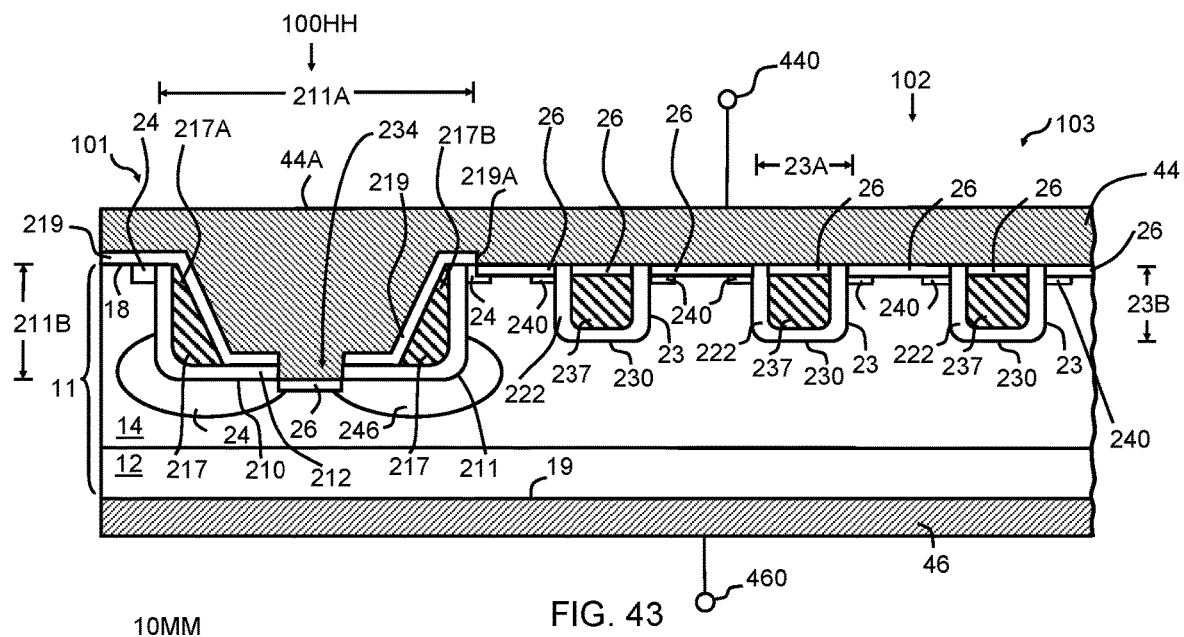

FIG. 43 illustrates a partial cross-sectional view of an electronic device 10MM, semiconductor device 10MM, Schottky diode device 10MM, or trench Schottky rectifier 10MM having a termination structure 100MM or termination trench structures 100MM in edge portion 101 of region of semiconductor material 11, and active structure 102 or active trench structures 102 in active portion 103 of region of semiconductor material 11 in accordance with the present description. Device 10MM is similar to device 10HH and only the differences will be described hereinafter. In particular, in device 10MM depth 23B of one or more of active trenches 23 is less than depth 211B of termination trench 211. In addition, device 10MM comprises one or more of doped regions 24 and/or 240. It is understood that in other examples, doped regions 24 and/or 240 can be excluded. Further, in device 10MM conductive spacer structures 217A and 217B are electrically floating. It is understood that in other examples, conductive spacer structure 217A alone or in combination with conductive spacer structure 217B can be electrically connected to conductive layer 44. The electrical performance of device 10MM can be further optimized similarly to other devices described herein including, for example, device 10HH.

It is understood that any of the examples or portions of thereof illustrated with devices 10HH, 10JJ, 10KK, 10LL, and 10MM can be combined with each other and/or with the other examples described herein to provide different configurations of devices within the teachings of the present description. For example, these devices can be configured with a plurality (i.e., more than one) termination trenches similarly to the examples described with devices 10AA, 10BB, 10CC, 10DD, 10EE, 10FF, 10GG, and 10NN (described next).

Figure 44:
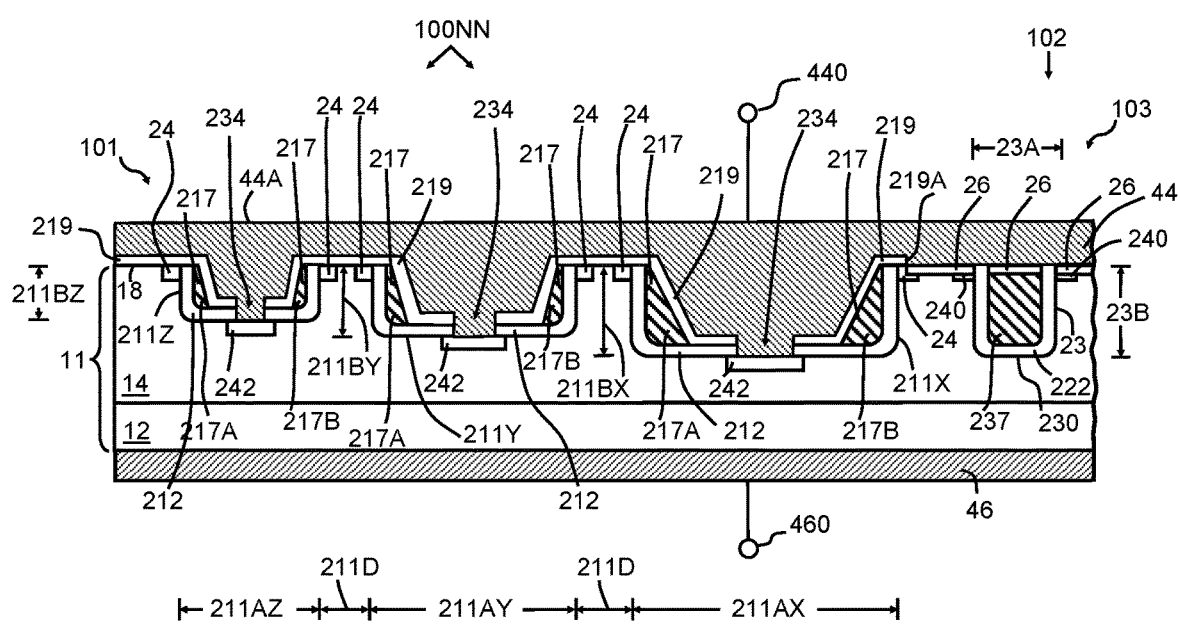

FIG. 44 illustrates a partial cross-sectional view of an electronic device 10NN, semiconductor device 10NN, Schottky diode device 10NN, or trench Schottky rectifier 10NN having a termination structure 100NN or termination trench structures 100NN in edge portion 101 of region of semiconductor material 11, and active structure 102 or active trench structures 102 in active portion 103 of region of semiconductor material 11 in accordance with the present description. Device 10NN is similar to device 10CC and 10EE and only the differences will be described hereinafter. In device 10NN, termination structure 100NN comprises termination trenches 211X, 211Y, and 211Z. In the present example, termination trench 211X has a width 211AX, termination trench 211Y has a width 211AY, and termination trench 211Z has a width 211AZ. More particularly, in the present example width 211AX is greater than width 211AY and width 211AZ, and width 211AY is greater than 211AZ. Stated differently, in termination structure 100NN, the width of termination trenches 211X, 211Y, and 211Z decreases from the innermost one of the termination trenches to the outermost one of the termination trenches. It is understood that in other examples, the width of termination trenches 211X, 211Y, and 211Z can increase from the innermost of the termination trenches to the outermost of one of the termination trenches.

In addition, in the present example termination trench 211X extends from major surface 18 into region of semiconductor material 11 (e.g., semiconductor layer 14) to a depth 211BX, termination trench 211Y extends from major surface 18 into region of semiconductor material 11 (e.g., semiconductor layer 14) to a depth 211BY, and termination trench 211Z extends from major surface 18 into region of semiconductor material 11 (e.g., semiconductor layer 14) to a depth 211BZ. In the present example, depth 211BX is greater than depths 211BY and 211BZ, and depth 211BY is greater than depth 211BZ. Stated differently, the depths of the termination trenches decreases from the innermost termination trench to the outermost termination trench. Further, in the present example depth 211BX can be substantially equal to depth 23B of active trenches 23. In other examples, depth 23B can be greater than or less than depth 211BX. It is understood that in other examples, the depths of the termination trenches can increase from the innermost termination trench to the outermost termination trench.

In the present example, each of termination trenches 211X, 211Y, and 211Z is separated by width 211D, which can be the same or different. In device 10NN, openings 234 are formed in dielectric layer 219 and dielectric structure 212 in each of termination trenches 211X, 211Y, and 211Z such that conductive layer 44 makes contact to doped regions 242. In other examples, less or no openings 234 can be used. Further, one or more openings can be provided in dielectric layer 219 in one or more of termination trenches 211X, 211Y, and 211Z to provide contact to one or more of conductive spacer structures 217A and/or 217B. In other examples of device 10NN, conductive material 26 can be included within doped regions 242 and doped regions 24 and/or 240 can be excluded.

In accordance with the present example, the widths 211AX, 211AY, and 211AZ respectively of the termination trenches 211X, 211Y, and 211Z are different. Specifically, width 211AX is greater than widths 211AY and 211AZ, and width 211AY is greater than 211AZ. Stated differently, the width of the termination trenches in device 10NN decreases from the innermost one of the termination trenches to the outermost one of the termination trenches. In other examples, the width of the termination trenches can increase from the innermost one of the termination trenches to the outermost one of the termination trenches. In accordance with the present example the width difference of the termination trenches can be used to control the depths of the termination trenches. More particularly, a more narrow aspect ratio can result in a shallower depth, and this aspect ratio can be used as a design rule to achieve the desired depth for a given termination trench. In this manner, a single masking step can be used to form the termination trenches at different depths by adjusting the respective widths of the termination trenches. This techniques can be used with any of the examples described herein.

The electrical performance of device 10NN can be further optimized similarly to other devices described herein, including, for example, devices 10V, 10CC, and 10EE.

Figure 45:
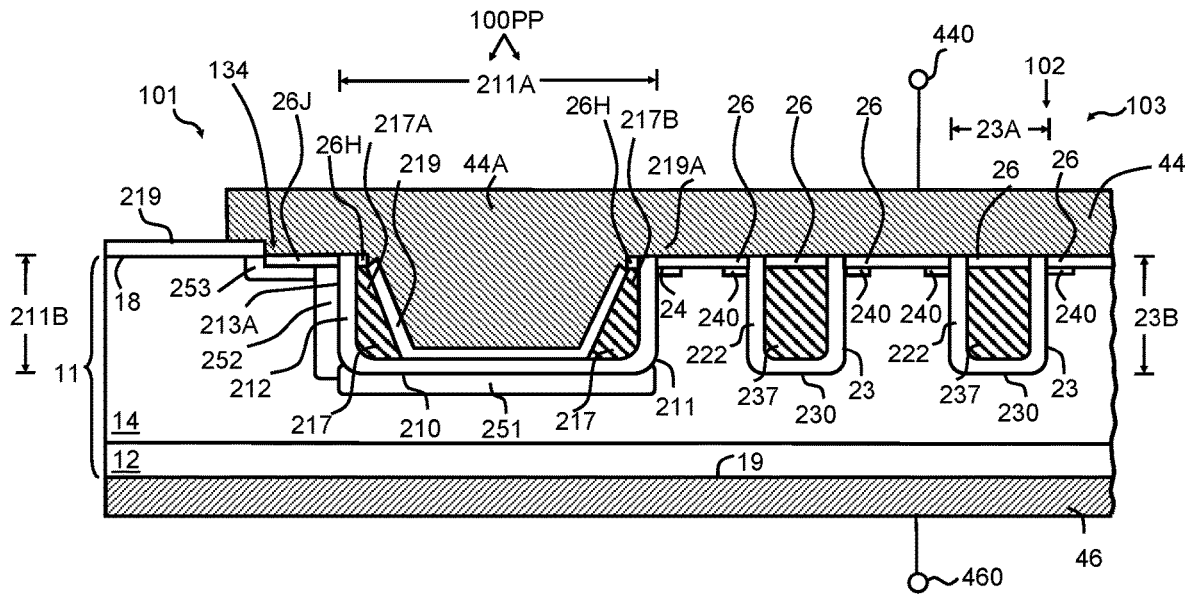

FIG. 45 illustrates a partial cross-sectional view of an electronic device 10PP, semiconductor device 10PP, Schottky diode device 10PP, or trench Schottky rectifier 10PP having a termination structure 100PP or termination trench structures 100PP in edge portion 101 of region of semiconductor material 11, and active structure 102 or active trench structures 102 in active portion 103 of region of semiconductor material 11 in accordance with the present description. Device 10PP is similar to device 10MM and to device 10NN, and only the differences will be described hereinafter. In device 10PP, termination structure 100PP comprises one or more termination trenches 211 having width 211A that can be wider than width 23A of one of active trenches 23. In the present example, termination trench 211 does not extend all the way to the outer periphery or edge of device 10PP so that a portion of region of semiconductor material 11 is interposed between the edge of device 10PP and the outermost side surface 213A or outward facing side surface 213A of termination trench 211 after device 10PP is singulated from, for example, a semiconductor wafer.

In accordance with the present example, device 10PP further comprises a doped region 253 disposed within region of semiconductor material 11 adjacent to major surface 18 and adjacent to outward facing side surface 213A of termination trench 211, a doped region 252 disposed along and adjacent to outward facing side surface 213A of termination trench 211, and a doped region 251 disposed along and adjacent to lower surface 210 of termination trench 211. In some examples, doped region 253 physically contacts doped region 252, and doped region 252 physically contacts doped region 251 so that these regions are in electrical communication with each other. Doped regions 251, 252, and 253 comprise a P-type conductivity type when semiconductor layer 14 comprises N-type conductivity type. Doped regions 251, 252, and 253 can be formed using doping techniques, such ion implantation and anneal techniques. Masking techniques and/or angled ion implantation techniques can be used to form doped region 251, 252, and 253. By way of example, ion implantation with boron can be used with dose ranges from $1.0 \times 10^{13}$ atoms/cm$^2$ through $5.0 \times 10^{14}$ atoms/cm$^2$ and with implant energies from about 10 KeV through about 100 KeV. In addition, doped regions 251, 252, and 253 can have similar dopant concentrations or different dopant concentrations. In accordance with the present example, doped regions 251, 252, and 253 are configured to provide additional field shaping capability and function together with termination trench structure 100PP to improve the electrical performance of device 10PP.

In device 10PP, dielectric layer 219 laterally extends along a portion of major surface 18 at an outer edge of device 10PP. In the present example, an opening 134 is formed adjacent to major surface 18 to expose a portion of doped region 253 so that conductive layer 44 is electrically connected to doped region 253. In some examples, a portion 26J of conductive material 26 is provided in a portion of doped region 253 as generally illustrated in FIG. 45. In some examples, conductive spacer 217A and conductive spacer 271B are electrically connected to conductive layer 44 using portions 26H of conductive material 26. In other examples only conductive spacer 217B is electrically connected to conductive layer 44 using portion 26H of conductive material 26, and conductive spacer 217A can be electrically floating. That is, conductive spacer 217A does not make direct physical contact to conductive layer 44.

In accordance with the present example, doped regions 251, 252, and 253 are configured to provide additional field shaping capability and function together with termination trench structure 100PP to improve the electrical performance of device 10PP. In the present example, the electrical performance of device 10PP can be further optimized using, for example, the depth and width of termination trench 211, the widths and depths of doped regions 251, 252, 253, 24 and 240, the dopant concentration of doped regions 251, 252, 253, 24 and 240, the spacing between termination trench 211 and the outermost one of active trenches 23, the thickness of dielectric structure 212, the thickness of dielectric layer 219, and/or the lateral overlap distance of field plate portion 44A.

Figure 46:
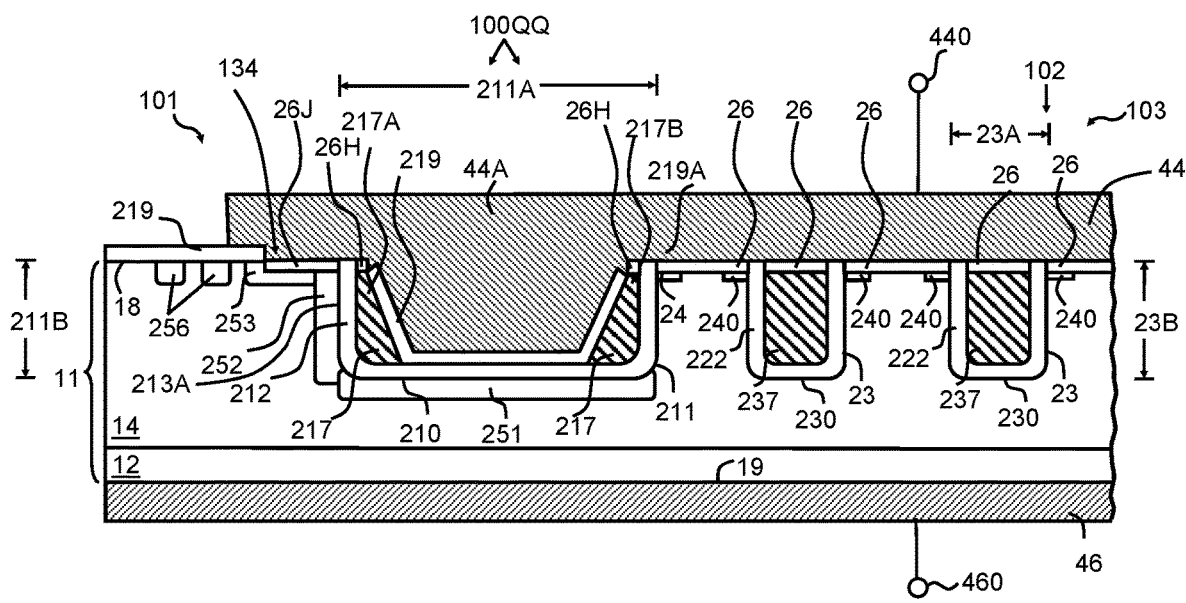

FIG. 46 illustrates a partial cross-sectional view of an electronic device 10QQ, semiconductor device 10QQ, Schottky diode device 10QQ, or trench Schottky rectifier 10QQ having a termination structure 100QQ or termination trench structures 100QQ in edge portion 101 of region of semiconductor material 11, and active structure 102 or active trench structures 102 in active portion 103 of region of semiconductor material 11 in accordance with the present description. Device 10QQ is similar to device 10PP and only the differences will be described hereinafter. In device 10QQ, termination structure 100QQ comprises one or more doped regions 256 disposed in an outer portion of region of semiconductor material 11 between an edge of device 10QQ and outermost side surface 213A of termination trench 211. In some examples, doped regions 256 comprise a P-type conductivity type and can be configured as ring-like structures that surround termination trench 211 and active portion 103 of region of semiconductor material 11. The number of doped regions 256 can be more or less than the two illustrated in FIG. 46 depending the breakdown voltage of device 10QQ. In some examples, more doped regions 256 can be used for higher breakdown voltages. The spacing between doped regions 256 can be similar or varied as can be the spacing between the inner most doped region 256 and doped region 253. Doped regions 256 can have similar or different dopant concentrations. By way of example, ion implantation with boron can be used to form doped regions 256 including dose ranges from $1.0 \times 10^{13}$ atoms/cm$^2$ through $5.0 \times 10^{14}$ atoms/cm$^2$ and with implant energies from about 10 KeV through about 100 KeV.

In the present example, doped regions 256 can be isolated from conductive layer 44 by dielectric layer 219 so as to be electrically floating. In this example, conductive spacer 217A and conductive spacer 217B are electrically connected to conductive layer 44 using portions 26H of conductive material 26. In other examples, only conductive spacer 217B is electrically connected to conductive layer 44 using portion 26H of conductive material 26.

In accordance with the present example, doped regions 256 are configured to provide additional field shaping capability and function together with doped regions 251, 252, and 253 and other features of termination trench structure 100QQ to improve the electrical performance of device 10QQ. In the present example, the electrical performance of device 10QQ can be further optimized using, for example, the depth and width of termination trench 211, the widths and depths of doped regions 251, 252, 253, 256, 24 and 240, the dopant concentration of doped regions 251, 252, 253, 256, 24 and 240, the spacing between termination trench 211 and the outermost one of active trenches 23, the thickness of dielectric structure 212, the thickness of dielectric layer 219, the spacing between doped regions 256 (including the spacing between the innermost doped region 256 and doped region 253), and/or the lateral overlap distance of field plate portion 44A.

Figure 47:
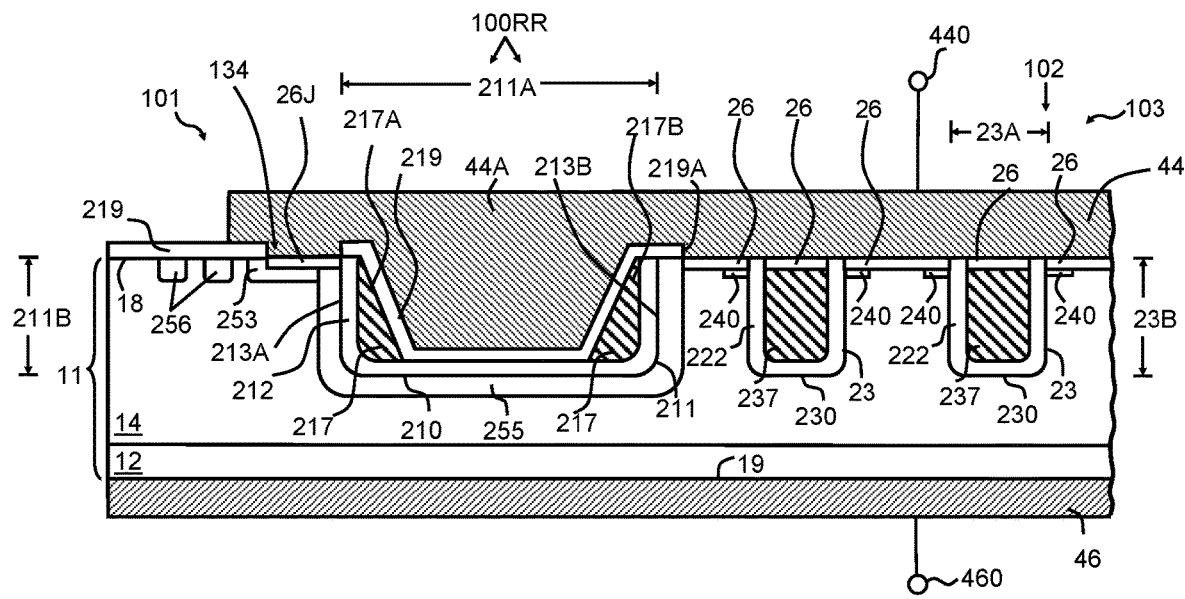

FIG. 47 illustrates a partial cross-sectional view of an electronic device 10RR, semiconductor device 10RR, Schottky diode device 10RR, or trench Schottky rectifier 10RR having a termination structure 100RR or termination trench structures 100RR in edge portion 101 of region of semiconductor material 11, and active structure 102 or active trench structures 102 in active portion 103 of region of semiconductor material 11 in accordance with the present description. Device 10RR is similar to device 10QQ and only the differences will be described hereinafter. In device 10RR, termination structure 100RR comprises a doped region 255 disposed in region of semiconductor material 11 and disposed adjacent to opposing side surfaces 213A and 213B of termination trench 211 and lower surface 210 of termination trench 211. In some examples, doped region 255 is a continuous doped structure that encloses or separates substantially all of termination trench 211 from region of semiconductor material 11.

Device 10RR further includes doped region 253, which electrically connects doped region 255 to conductive layer 44. In other examples, doped region 255 can be further or either electrically connected to conductive layer 44 proximate to side surface 213B of termination trench 211. Doped region 255 can be formed similarly to doped regions 251 and 252. Device 10RR is illustrated with both conductive spacers 271A and 217B are electrically disconnected from or floating with respect to conductive layer 44. In other examples, one or more of conductive spacers 217A and 217B can be electrically connected to conductive layer 44. In other examples, doped regions 256 can be omitted.

In accordance with the present example, doped region 255 is configured to provide additional field shaping capability and functions together with doped regions 253 and 256 and other features of termination trench structure 100RR to improve the electrical performance of device 10RR. In the present example, the electrical performance of device 10RR can be further optimized using, for example, the depth and width of termination trench 211, the widths and depths of doped regions 253, 255, 256, and 240, the dopant concentration of doped regions 253, 255, 256, and 240, the spacing between termination trench 211 and the outermost one of active trenches 23, the thickness of dielectric structure 212, the thickness of dielectric layer 219, the spacing between doped regions 256, (including the spacing between the innermost doped region 256 and doped region 253), and/or the lateral overlap distance of field plate portion 44A.

Figure 48:
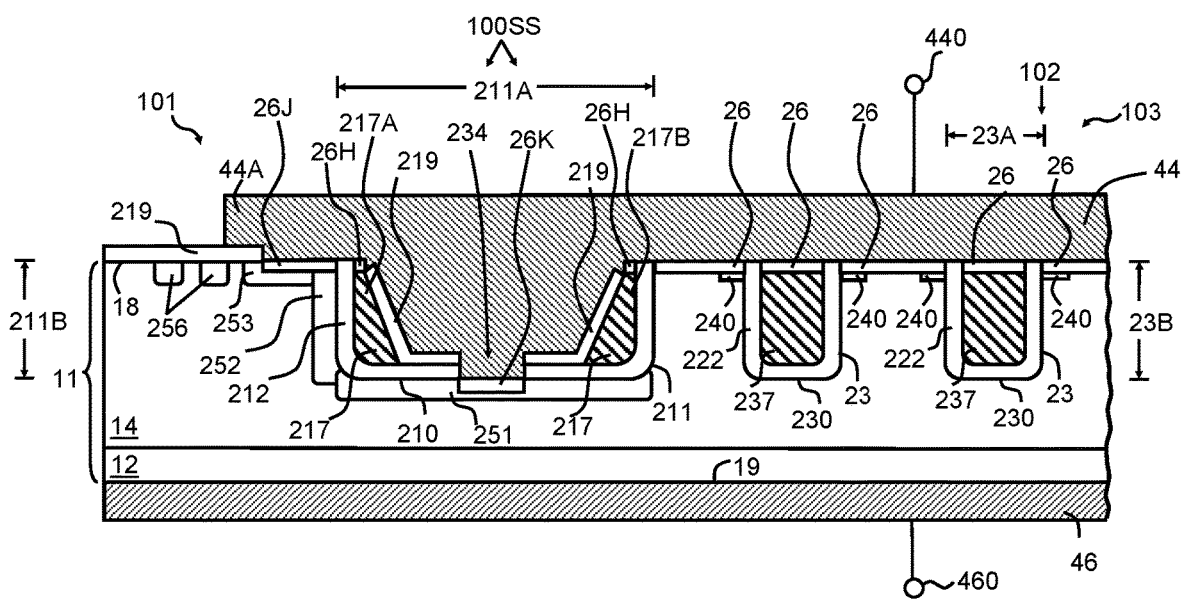

FIG. 48 illustrates a partial cross-sectional view of an electronic device 10SS, semiconductor device 10SS, Schottky diode device 10SS, or trench Schottky rectifier 10SS having a termination structure 100SS or termination trench structures 100SS in edge portion 101 of region of semiconductor material 11, and active structure 102 or active trench structures 102 in active portion 103 of region of semiconductor material 11 in accordance with the present description. Device 10SS is similar to device 10QQ and device 10RR and only the differences will be described hereinafter. In device 1055, termination structure 100SS comprises opening 234 disposed within dielectric layer 219 and dielectric structure 212 to expose a portion of doped region 251. In some examples, conductive layer 44 makes electrical and physical contact to doped region 251 through portion 26K of conductive material 26. Device 1055 is illustrated with both conductive spacers 271A and 217B electrically connected to conductive layer 44. In other examples, conductive spacer 217A can be electrically disconnected from or electrically floating with respect to conductive layer 44. In other examples, doped regions 256 can be omitted. Device 1055 can be further optimized as described with previous devices, such as device 10RR and device 10QQ.

Figure 49:
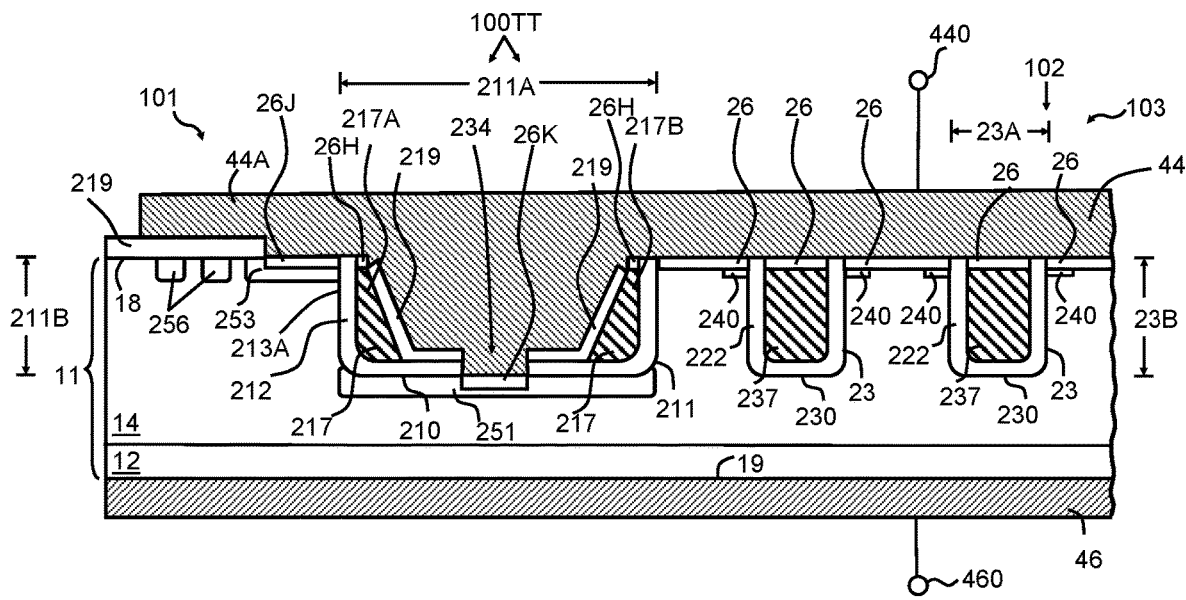

FIG. 49 illustrates a partial cross-sectional view of an electronic device 10TT, semiconductor device 10TT, Schottky diode device 10TT, or trench Schottky rectifier 10TT having a termination structure 100TT or termination trench structures 100TT in edge portion 101 of region of semiconductor material 11, and active structure 102 or active trench structures 102 in active portion 103 of region of semiconductor material 11 in accordance with the present description. Device 10TT is similar to device 10SS and device 10RR and only the differences will be described hereinafter. In device 10TT, field plate portion 44A of conductive layer 44 is disposed so as to laterally extend to overlap one or more of doped regions 256. In addition, in device 10TT doped region 252 can be omitted. In device 10TT, both conductive spacers 271A and 217B are electrically connected to conductive layer 44 using portions 26H of conductive material 26.

Figure 50:
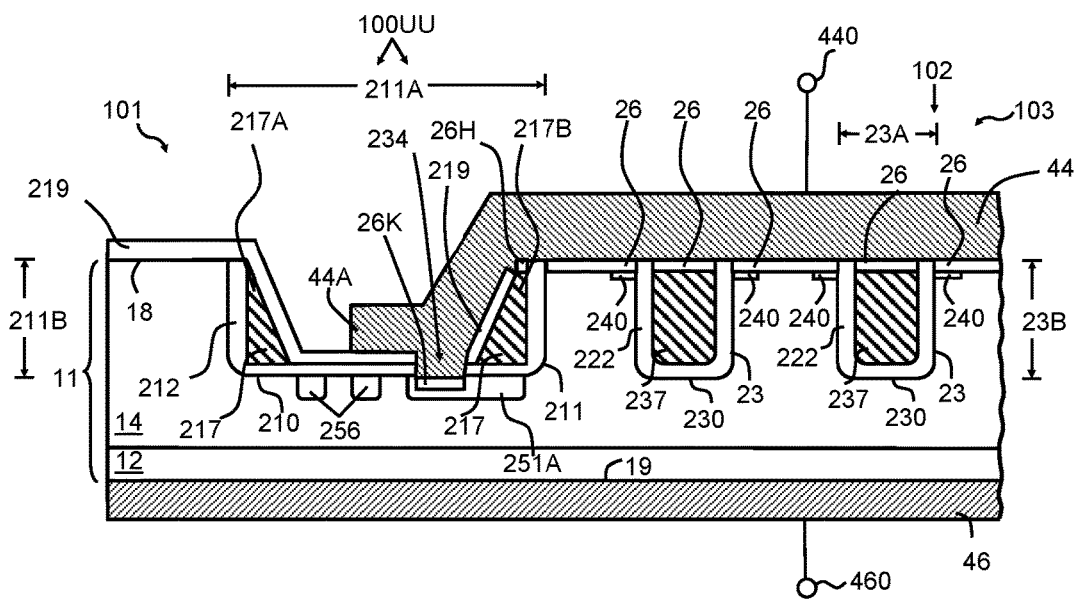

FIG. 50 illustrates a partial cross-sectional view of an electronic device 10UU, semiconductor device 10UU, Schottky diode device 10UU, or trench Schottky rectifier 10UU having a termination structure 100UU or termination trench structures 100UU in edge portion 101 of region of semiconductor material 11, and active structure 102 or active trench structures 102 in active portion 103 of region of semiconductor material 11 in accordance with the present description. In device 10UU, termination structure 100UU further comprises a doped region 251A, which is similar to doped region 251 except that it only laterally extends across a portion of lower surface 210 of termination trench 211. In the present example, opening 234 is provided in dielectric layer 219 and dielectric structure 212 to expose a portion of doped region 251A adjacent to lower surface 210 of termination trench 211. Field plate portion 44A laterally extends into termination trench 211 and contact doped region 251A through opening 234.

Termination structure 100UU further comprises one or more doped regions 256, except that in the present example, doped regions 256 are disposed adjacent to lower surface 210 of termination 211. As described previously, doped regions 256 comprise a P-type conductivity type and can be configured as ring-like structures that surround active portion 103 of region of semiconductor material 11. In some examples, doped regions 256 are electrically floating (i.e., are not in direct electrical contact with conductive layer 44). It is understood that more than two doped regions 256 can used, and the spacing between doped regions 256 and doped region 251A can be varied. Device 10UU is illustrated with conductive spacer 217B electrically connected to conductive layer 44 using, for example, portion 26H of conductive material 26, and conductive spacer 217A is electrically disconnected from or electrically floating with respect to conductive layer 44. In other examples, field plate portion 44A can extend over more of termination trench 211 and can be electrically connected to spacer 217A. In other example, field plate portion 44A can extend further to overlap doped regions 256.

In accordance with the present example, doped regions 251A and 256 are configured to provide additional field shaping capability and function together with other features of termination trench structure 100UU to improve the electrical performance of device 10UU. In the present example, the electrical performance of device 10UU can be further optimized using, for example, the depth and width of termination trench 211, the widths and depths of doped regions 251A, 256, and 240, the dopant concentration of doped regions 251A, 256, and 240, the spacing between termination trench 211 and the outermost one of active trenches 23, the thickness of dielectric structure 212, the thickness of dielectric layer 219, the spacing between doped regions 256 (including the spacing between the innermost doped region 256 and doped region 251A), and/or the lateral overlap distance of field plate portion 44A.

Figure 51:
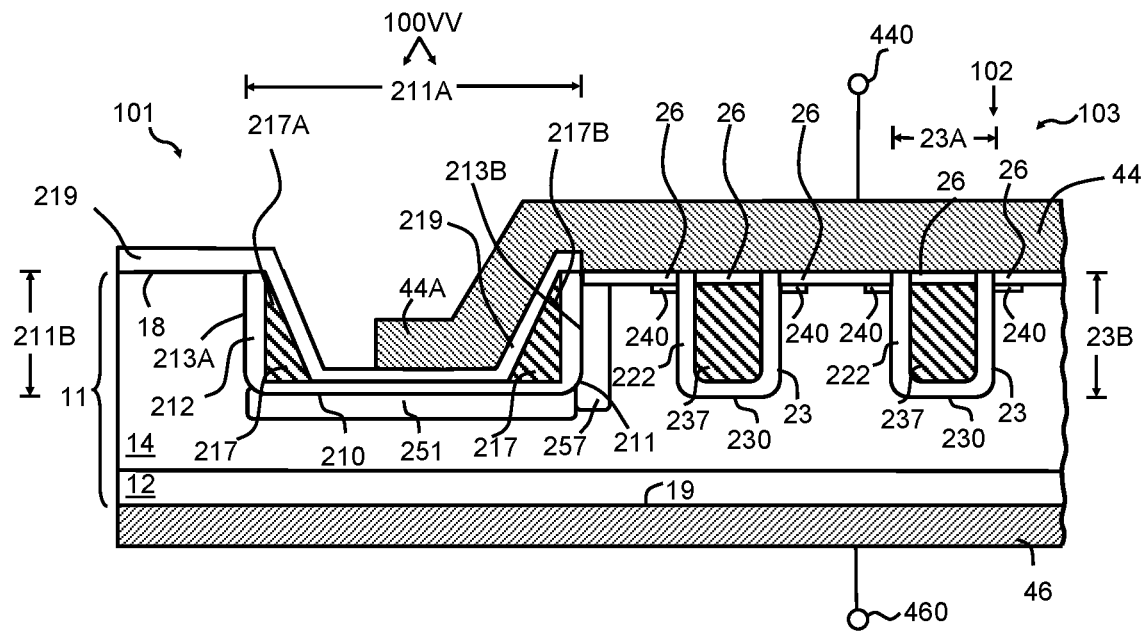

FIG. 51 illustrates a partial cross-sectional view of an electronic device 10VV, semiconductor device 10VV, Schottky diode device 10VV, or trench Schottky rectifier 10VV having a termination structure 100VV or termination trench structures 100VV in edge portion 101 of region of semiconductor material 11, and active structure 102 or active trench structures 102 in active portion 103 of region of semiconductor material 11 in accordance with the present description. In device 10VV, termination structure 100VV comprises doped region 251 disposed within region of semiconductor material 11 and adjacent to lower surface 210 of termination trench 211. A doped region 257 is disposed within region of semiconductor material 11 and adjacent to side surface 213B of termination trench 211. In the present example, doped region 257 has a P-type conductivity type and can have similar characteristics to doped region 252 described previously. In the present example, doped region 257 physically contacts doped region 251 and both doped region 257 and doped region 251 are electrically connected to conductive layer 44 through conductive material 26 as illustrated in FIG. 51.

In the present example, conductive spacer 217B is electrically connected to conductive layer 44 using, for example, portion 26H of conductive material 26, and conductive spacer 217A is electrically disconnected from or electrically floating with respect to conductive layer 44. In other examples, field plate portion 44A can laterally extend over more of termination trench 211 and can be electrically connected to spacer 217A.

In accordance with the present example, doped regions 251 and 257 are configured to provide additional field shaping capability and function together with other features of termination trench structure 100VV to improve the electrical performance of device 10VV. In the present example, the electrical performance of device 10VV can be further optimized using, for example, the depth and width of termination trench 211, the widths and depths of doped regions 251, 257, 24 and 240, the dopant concentration of doped regions 251, 257, 24 and 240, the spacing between termination trench 211 and the outermost one of active trenches 23, the thickness of dielectric structure 212, the thickness of dielectric layer 219, and/or the lateral overlap distance of field plate portion 44A.

Figure 52:
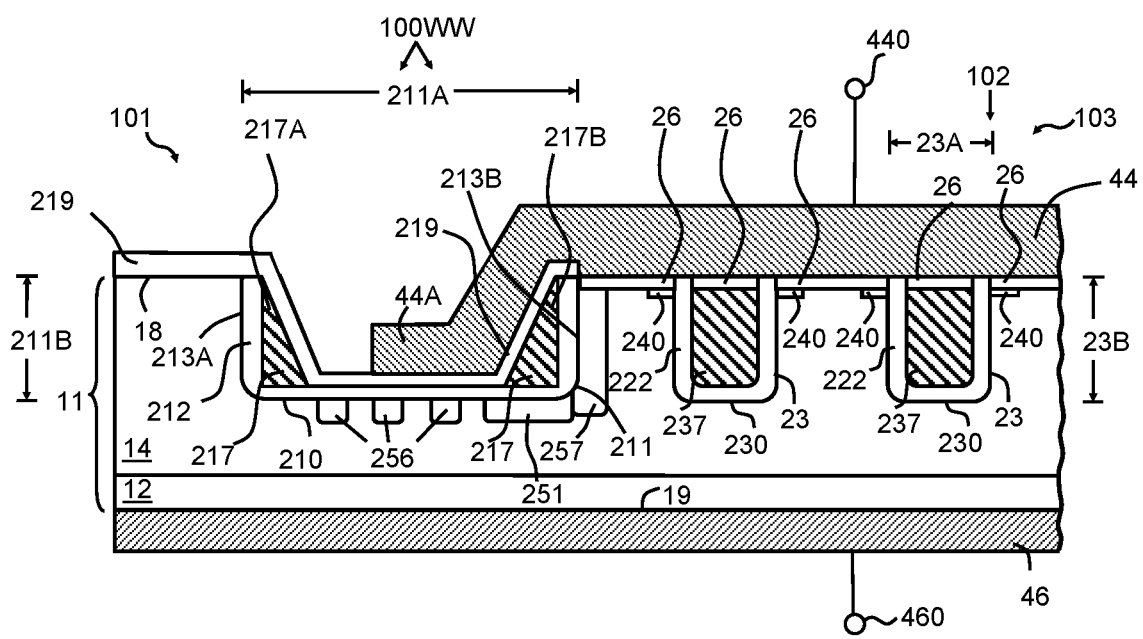

FIG. 52 illustrates a partial cross-sectional view of an electronic device 10WW, semiconductor device 10WW, Schottky diode device 10WW, or trench Schottky rectifier 10WW having a termination structure 100WW or termination trench structures 100WW in edge portion 101 of region of semiconductor material 11, and active structure 102 or active trench structures 102 in active portion 103 of region of semiconductor material 11 in accordance with the present description. Device 10WW is similar to device 10VV and only the differences will be described hereinafter. In device 10WW, doped region 251 is disposed to laterally overlap only a portion of lower surface 210 of termination trench 211. In addition, one or more doped regions 256 are disposed within region of semiconductor material 11 adjacent to other portions of lower surface 210 of termination trench 211. As described previously, doped regions 256 comprise a P-type conductivity type and can be configured as ring-like structures that surround active portion 103 of region of semiconductor material 11. The spacing between doped regions 256 can be varied, and device 10WW can include more or less than three doped region 256. In the present example, doped region 251 is electrically connected to conductive layer 44 through doped region 257, and in some examples doped regions 256 are electrically floating (i.e., are not in direct electrical contact with conductive layer 44).

In the present example, conductive spacer 217B and conductive spacer 217A are electrically disconnected from or electrically floating with respect to conductive layer 44. In some examples, conductive spacer 217B can be electrically connected to conductive layer 44. In other examples, field plate portion 44A can laterally extend over more of termination trench 211 and can be electrically connected to spacer 217A.

In accordance with the present example, doped regions 251, 256 and 257 are configured to provide additional field shaping capability and function together with other features of termination trench structure 100WW to improve the electrical performance of device 10WW. In the present example, the electrical performance of device 10WW can be further optimized using, for example, the depth and width of termination trench 211, the widths and depths of doped regions 251, 257, 24 and 240, the dopant concentration of doped regions 251, 257, 24 and 240, the spacing between termination trench 211 and the outermost one of active trenches 23, the thickness of dielectric structure 212, the thickness of dielectric layer 219, the spacing between doped regions 256 (including the spacing between the innermost doped region 256 and doped region 251), and/or the lateral overlap distance of field plate portion 44A.

It is understood that any of the termination structure features described herein can be included and/or excluded to provide other termination structure configurations. This includes structures with more than termination trench.

In view of all of the above, it is evident that a novel structure is disclosed. Included, among other features, is a semiconductor device having an active device region and a termination region as part of a region of semiconductor material. A termination structure is provided within the termination region and includes a termination trench and a conductive structure disposed within the region of semiconductor material. The conductive structure is electrically isolated from the region of semiconductor material by a dielectric structure. A dielectric layer is disposed to overlie at least a portion of the termination trench, and a conductive layer laterally extends to overlie the dielectric layer to provide a field plate configuration. In some examples, the termination structure is electrically floating. In other examples, the conductive structure includes a pair of conductive spacer structure disposed on opposing side surfaces of the termination trench. In some examples, the outermost one of the conductive spacer structures can be electrically connected to the conductive layer. In some examples, both conductive spacers are electrically floating. In some examples, the termination structure includes a plurality (i.e., more than one) termination trenches each having a conductive structure disposed within them that are electrically isolated from the region of semiconductor material by a dielectric structure. In some examples, the termination trenches have different widths and/or different depths. In other examples, the conductive layer can be electrically connected to the region of semiconductor material through an opening proximate to a lower surface of one or more of the termination trenches. In additional examples, the plurality of termination structure can includes a merged structure where the termination trenches abut each other. In still further examples, doped regions that have a conductivity type opposite to that of the region of semiconductor material can be disposed at various locations proximate to the termination trench(es).

The termination structures are configured, among other things, to improve the electrical performance of semiconductor devices, such as Schottky rectifier devices including trench-gated Schottky rectifier devices. More particularly, the termination structures are configured to manage, control, or reduce the effects of electrical field build-up in semiconductor devices under, for example, reverse bias conditions. The structures described herein were found in practice to provide at least equal electrical performance to related devices; were found not to materially affect the performance of the active devices, are configurable or scalable for lower voltage devices (e.g., 20 volt devices) to higher voltage devices (e.g., 300 volts or higher); are compatible with existing process flows or integration schemes, which saves on manufacturing costs; and provide more robust semiconductor devices.

While the subject matter of the invention is described with specific preferred examples, the foregoing drawings and descriptions thereof depict only typical examples of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some but not other features included in other examples, combinations of features of different examples are meant to be within the scope of the invention and meant to form different examples as would be understood by those skilled in the art.

What is claimed is:

1. A semiconductor device structure, comprising:
   a region of semiconductor material comprising:
      a first conductivity type;
      a first major surface;
      a second major surface opposite to the first major surface;
      an active region; and
      a termination region;
   an active structure disposed in the active region comprising:
      a first active trench extending from the first major surface into the region of semiconductor material to a first depth; and
      a first conductive structure within the first active trench and electrically isolated from the region of semiconductor material by a first dielectric structure, wherein the first active trench has a first width proximate to the first major surface;
   a termination structure disposed in the termination region comprising:
      a first termination trench extending from the first major surface into the region of semiconductor material to a second depth;
      a second conductive structure within the first termination trench and electrically isolated from the region of semiconductor material by a second dielectric structure, wherein:
         the first termination trench comprises:
            a second width proximate to the first major surface;
            a first side surface;
            a second side surface opposite to the first side surface; and a first lower surface extending between the first side surface and the second side surface;
the first side surface is interposed between the second side surface and the first active trench; and
the second conductive structure comprises:
a first conductive spacer disposed proximate to the first side surface of the first termination trench; and
a second conductive spacer disposed proximate to the second side surface of the first termination trench; and
a dielectric layer disposed overlying a portion of the first major surface and overlapping the first conductive spacer and overlapping the second conductive spacer;
a first doped region comprising a second conductivity type opposite the first conductive type in the region of semiconductor material adjacent to the first major surface and adjacent to the second side surface of the first termination trench;
a second doped region comprising the second conductivity type in the region of semiconductor material adjacent to the second side surface of the first termination trench;
a third doped region comprising the second conductivity type in the region of semiconductor material adjacent to the first lower surface of the first termination trench, wherein:
the first doped region and the second doped region overlap; and
the second doped region and the third doped region overlap;
a Schottky contact structure having a first portion disposed adjacent to the first major surface on opposing sides of the first active trench and a second portion disposed within the first doped region; and
a first conductive layer disposed overlying the first major surface and electrically coupled to the first portion and the second portion of Schottky contact structure.

2. The semiconductor device of claim 1, wherein:
the first conductive layer is electrically coupled to the first conductive spacer.

3. The semiconductor device of claim 1, wherein:
an opening is disposed within the dielectric layer proximate to the first lower surface of the first termination trench.

4. The semiconductor device of claim 3, wherein:
the first conductive layer is further electrically coupled to the region of semiconductor material in the opening.

5. The semiconductor device of claim 4, wherein:
a third portion of the Schottky contact structure is disposed within the third doped region adjacent the opening.

6. The semiconductor device of claim 1, further comprising:
a fourth doped region comprising the second conductivity type in the region of semiconductor material adjacent to the first side surface of the first termination trench, wherein the fourth doped region and the third doped region overlap.

7. The semiconductor device of claim 6, wherein:
the first conductive layer is electrically coupled to the fourth doped region proximate to the first side surface of the termination trench.

8. The semiconductor device of claim 6, wherein:
the second doped, the third doped region, and the fourth doped region comprises a continuous doped structure that separates the first termination trench from the region of semiconductor material.

9. The semiconductor device of claim 1, further comprising:
a fourth doped region comprising the second conductivity type in the region of semiconductor material adjacent to the first major surface, wherein:
the first doped region is interposed between the fourth doped region and the second side surface of the first termination trench; and
the fourth doped region is laterally spaced apart from the first doped region.

10. The semiconductor device of claim 9, wherein:
the fourth doped region comprises an electrically floating region.

11. The semiconductor device of claim 10, wherein:
the first conductive layer laterally overlaps the fourth doped region in a cross-sectional view.

12. The semiconductor device of claim 1, wherein;
the region of semiconductor material comprises a substrate and a semiconductor layer disposed overlying the substrate;
the semiconductor layer provides the first major surface; and
the semiconductor device further comprises:
a substrate contact structure extending from the first major surface into the substrate.

13. A semiconductor device structure, comprising:
a region of semiconductor material comprising:
a first conductivity type;
a first major surface;
a second major surface opposite to the first major surface;
an active region; and
a termination region;
an active structure disposed in the active region comprising:
a first active trench extending from the first major surface into the region of semiconductor material; and
a first conductive structure within the first active trench and electrically isolated from the region of semiconductor material by a first dielectric structure;
a termination structure disposed in the termination region comprising:
a first termination trench extending from the first major surface into the region of semiconductor material;
a second conductive structure within the first termination trench and electrically isolated from the region of semiconductor material by a second dielectric structure, wherein:
the first termination trench comprises:
a first side surface;
a second side surface opposite to the first side surface; and
a first lower surface extending between the first side surface and the second side surface;
the first side surface is interposed between the second side surface and the first active trench; and
the second conductive structure comprises a first conductive spacer disposed proximate to the first side surface of the first termination trench; and
a dielectric layer disposed overlying a portion of the first major surface and overlapping the first conductive spacer;
a first doped region comprising a second conductivity type opposite the first conductive type in the region of semiconductor material adjacent to the first lower surface of the first termination trench;
a Schottky contact structure having a first portion disposed adjacent to the first major surface on opposing sides of the first active trench; and
a first conductive layer disposed overlying the first major surface and electrically coupled to the first portion and the second portion of Schottky contact structure and electrically coupled to the first doped region.

14. The semiconductor device of claim 13, further comprising:
a second doped region comprising the second conductivity type in the region of semiconductor material adjacent to the lower surface of the first termination trench and laterally spaced apart from the first doped region.

15. The semiconductor device of claim 13, wherein:
the dielectric layer comprises an opening adjacent to the first doped region; and
the first conductive layer electrically coupled to the first doped region through the opening.

16. The semiconductor device of claim 15, wherein
the first conductive layer is electrically connected to the first conductive spacer.

17. The semiconductor device of claim 13, further comprising:
a second doped region comprising the second conductivity type in the region of semiconductor material adjacent to the first side surface of the first termination trench, wherein:
the second doped region overlaps the first doped region; and
the first conductive layer is electrically coupled to the second doped region proximate to the first side surface of the first termination trench.

18. The semiconductor device of claim 17, wherein:
the first doped region laterally extends the width of the first termination trench.

19. The semiconductor device of claim 13, wherein:
the region of semiconductor material comprises a substrate and a semiconductor layer disposed overlying the substrate;
the semiconductor layer provides the first major surface; and
the semiconductor device further comprises:
a substrate contact structure extending from the first major surface into the substrate.

20. A semiconductor device structure, comprising:
a region of semiconductor material comprising:
a first conductivity type;
a first major surface;
a second major surface opposite to the first major surface;
an active region; and
a termination region;
an active structure disposed in the active region comprising:
a first active trench extending from the first major surface into the region of semiconductor material; and
a first conductive structure within the first active trench and electrically isolated from the region of semiconductor material by a first dielectric structure;
a termination structure disposed in the termination region comprising:
a first termination trench extending from the first major surface into the region of semiconductor material;
a second conductive structure within the first termination trench and electrically isolated from the region of semiconductor material by a second dielectric structure, wherein:
the first termination trench comprises:
a first side surface;
a second side surface opposite to the first side surface; and
a first lower surface extending between the first side surface and the second side surface;
the first side surface is interposed between the second side surface and the first active trench; and
the second conductive structure comprises:
a first conductive spacer disposed proximate to the first side surface of the first termination trench; and
a second conductive spacer disposed proximate to the second side surface of the first termination trench; and
a dielectric layer disposed overlying a portion of the first major surface and overlapping the first conductive spacer and overlapping the second conductive spacer;
a first doped region comprising a second conductivity type opposite the first conductive type in the region of semiconductor material adjacent to a first lower corner of the first termination trench;
a second doped region comprising the second conductivity type in the region of semiconductor material adjacent to a second lower corner of the first termination trench;
a Schottky contact structure having a first portion disposed adjacent to the first major surface on opposing sides of the first active trench and a second portion disposed in a portion of the region of semiconductor material proximate to the lower surface of the first termination trench; and
a first conductive layer disposed overlying the first major surface and electrically coupled to the first portion and the second portion of Schottky contact structure.

* * * * *